(12) United States Patent
Nakanishi et al.

(10) Patent No.: US 9,349,743 B2
(45) Date of Patent: May 24, 2016

(54) METHOD OF MANUFACTURING SEMICONDUCTOR DEVICE

(71) Applicant: Renesas Electronics Corporation, Kawasaki-shi, Kanagawa (JP)

(72) Inventors: Nobuto Nakanishi, Ibaraki (JP); Yoshiyuki Kawashima, Kanagawa (JP); Akio Nishida, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/804,305

(22) Filed: Jul. 20, 2015

(65) Prior Publication Data

US 2016/0043098 A1 Feb. 11, 2016

(30) Foreign Application Priority Data

Aug. 8, 2014 (JP) .................. 2014-163227

(51) Int. Cl.
| | |
|---|---|
| *H01L 21/28* | (2006.01) |
| *H01L 27/115* | (2006.01) |
| *H01L 21/265* | (2006.01) |
| *H01L 21/3105* | (2006.01) |
| *H01L 29/66* | (2006.01) |
| *H01L 29/51* | (2006.01) |
| *H01L 21/3213* | (2006.01) |
| *H01L 29/45* | (2006.01) |
| *H01L 29/423* | (2006.01) |

(52) U.S. Cl.
CPC .... *H01L 27/11568* (2013.01); *H01L 21/26513* (2013.01); *H01L 21/28282* (2013.01); *H01L 21/31053* (2013.01); *H01L 21/32133* (2013.01); *H01L 27/11563* (2013.01); *H01L 29/42344* (2013.01); *H01L 29/456* (2013.01); *H01L 29/513* (2013.01); *H01L 29/66545* (2013.01)

(58) Field of Classification Search
CPC .................. H01L 21/28282; H01L 21/28008; H01L 29/42344; H01L 29/66833; H01L 29/792; H01L 27/105; H01L 27/11563; H01L 29/66545
USPC ........................................................ 438/267
See application file for complete search history.

(56) References Cited

U.S. PATENT DOCUMENTS

| | | | | |
|---|---|---|---|---|
| 9,029,931 | B2 * | 5/2015 | Kawashima | ...... H01L 27/11573 257/315 |
| 9,171,727 | B2 * | 10/2015 | Nishikizawa | ..... H01L 21/28008 |
| 2014/0227839 | A1 * | 8/2014 | Shinohara | ......... H01L 29/42344 438/261 |

FOREIGN PATENT DOCUMENTS

| | | |
|---|---|---|
| JP | 2007-258497 A | 10/2007 |
| JP | 2008-211016 A | 9/2008 |

*Primary Examiner* — Savitr Mulpuri

(74) *Attorney, Agent, or Firm* — Shapiro, Gabor and Rosenberger, PLLC

(57) ABSTRACT

To provide a semiconductor device having improved reliability. A semiconductor device is provided forming a control gate electrode for memory cell on a semiconductor substrate via a first insulating film; forming a memory gate electrode for memory cell, which is adjacent to the control gate electrode, on the semiconductor substrate via a second insulating film having a charge storage portion; forming n⁻ type semiconductor regions for source or drain in the semiconductor substrate by ion implantation; forming sidewall spacers on the side wall of the control gate electrode and the memory gate electrode; forming n⁺ type semiconductor regions for source or drain in the semiconductor substrate by ion implantation; and removing an upper portion of the second insulating film present between the control gate electrode and the memory gate electrode. A removal length of the second insulating film is larger than the depth of the n⁺ type semiconductor regions.

4 Claims, 33 Drawing Sheets

FIG. 31

| | OPERATION METHOD WRITE/ERASE | WRITE OPERATION VOLTAGE(V) Vmg/Vs/Vcg/Vd/Vb | ERASE OPERATION VOLTAGE(V) Vmg/Vs/Vcg/Vd/Vb | READ OPERATION VOLTAGE(V) Vmg/Vs/Vcg/Vd/Vb |
|---|---|---|---|---|
| A | SSI(WRITE)/BTBT(ERASE) | 10/5/1/0.5/0 | −6/6/0/open/0 | 0/0/1.5/1.5/0 |
| B | SSI(WRITE)/FN(ERASE) | 10/5/1/0.5/0 | 12/0/0/0/0 | 0/0/1.5/1.5/0 |
| C | FN(WRITE)/BTBT(ERASE) | −12/0/0/0/0 | −6/6/0/open/0 | 0/0/1.5/1.5/0 |
| D | FN(WRITE)/FN(ERASE) | −12/0/0/0/0 | 12/0/0/0/0 | 0/0/1.5/1.5/0 |

METHOD OF MANUFACTURING SEMICONDUCTOR DEVICE

CROSS-REFERENCE TO RELATED APPLICATIONS

The disclosure of Japanese Patent Application No. 2014-163227 filed on Aug. 8, 2014 including the specification, drawings, and abstract is incorporated herein by reference in its entirety.

BACKGROUND

The present invention relates to a method of manufacturing a semiconductor device and it is suited for use, for example, in a method of manufacturing a semiconductor device having a nonvolatile memory.

As an electrically writable/erasable nonvolatile semiconductor memory device, an EEPROM (electrically erasable and programmable read only memory) has been used widely. Such widely used memory devices typified by a flash memory have, below a gate electrode of a MISFET thereof, a conductive floating gate electrode or a trapping insulating film surrounded by an oxide film. Charges are stored in the floating gate electrode or trapping insulating film as memory information and are read as the threshold value of the transistor. The trapping insulating film is a film capable of storing therein charges and a silicon nitride film is one example of it. The threshold value of the MISFET is shifted by injection/emission of charges to/from a charge storage region and thus, it is operated as a memory element. As an example of this flash memory, a split-gate type cell using a MONOS (metal-oxide-nitride-oxide-oxide-semiconductor) film can be given. Such a memory using a silicon nitride film as a charge storage region is superior in reliability of data retention to a conductive floating gate film because it can store charges discretely. Another advantage is that due to superiority in reliability of data retention, an oxide film above or below the silicon nitride film can be thinned and write/erase operation can be performed at a reduced voltage.

Japanese Unexamined Patent Application Publication No. 2007-258497 (Patent Document 1) and Japanese Unexamined Patent Application Publication No. 2008-211016 (Patent Document 2) describe a technology about a nonvolatile semiconductor memory device.

[Patent Document 1] Japanese Unexamined Patent Application Publication No. 2007-258497
[Patent Document 2] Japanese Unexamined Patent Application Publication No. 2008-211016

SUMMARY

Even a semiconductor device having a nonvolatile memory is required to have reliability as improved as possible.

Another problem and novel features will be apparent from the description herein and accompanying drawings.

In one embodiment, there is provided a method of manufacturing a semiconductor device including the steps of: (a) providing a semiconductor substrate, (b) forming a first gate electrode for a memory cell on the semiconductor substrate via a first insulating film, and (c) forming a second gate electrode for the memory cell on the semiconductor substrate via a second insulating film so as to be adjacent to the first gate electrode via the second insulating film. The second insulating film has therein a charge storage portion. The method of manufacturing a semiconductor device further includes the steps of: (d) after the step (c), forming a first semiconductor region for source or drain of the memory cell in the semiconductor substrate by ion implantation, and (e) after the step (d), forming a sidewall insulating film on respective side walls of the first gate electrode and the second gate electrode which are on the sides opposite to the side walls adjacent to each other. The method of manufacturing a semiconductor device still further includes the steps of: (f) after the step (e), forming a second semiconductor region for source or drain of the memory cell in the semiconductor substrate by ion implantation, and (g) after the step (f), forming a first interlayer insulating film so as to cover the first electrode and the second electrode. The method of manufacturing a semiconductor device still further includes the step of: (h) polishing the first interlayer insulating film to expose the first gate electrode and the second gate electrode. The removal length of the second insulating film in the step (h) is larger than the depth of the second semiconductor region formed in the step (f).

In another embodiment, there is provided a method of manufacturing a semiconductor device, including the steps of: (a) providing a semiconductor substrate, (b) forming a first gate electrode for a memory cell on the semiconductor substrate via a first insulating film, and (c) forming a second gate electrode for the memory cell on the semiconductor substrate via a second insulating film so as to be adjacent to the first gate electrode via the second insulating film. The second insulating film has therein a charge storage portion. The method of manufacturing a semiconductor device further includes the steps of: (d) after the step (c), forming a first semiconductor region for source or drain of the memory cell in the semiconductor substrate by ion implantation, and (e) after the step (d), forming a sidewall insulating film on respective side walls of the first gate electrode and the second gate electrode which are on the sides opposite to the sidewalls adjacent to each other. The method of manufacturing a semiconductor device still further includes the steps of: (f) after the step (e), forming a second semiconductor region for source or drain of the memory cell in the semiconductor substrate by ion implantation, and (g) after the step (f), removing an upper portion of the second insulating film present between the first gate electrode and the second gate electrode. The removal length of the second insulating film in the step (g) is larger than the depth of the second semiconductor region formed in the step (f).

In a further embodiment, there is provided a method of manufacturing a semiconductor device, including the steps of: (a) providing a semiconductor substrate, (b) forming a first gate electrode for the memory cell on the semiconductor substrate via a first insulating film, and (c) forming a second gate electrode for the memory cell on the semiconductor substrate via a second insulating film so as to be adjacent to the first gate electrode via the second insulating film. The second insulating film has therein a charge storage portion. The method of manufacturing a semiconductor device further includes the step of: (d) after the step (c), forming a first semiconductor region for source or drain of the memory cell in the semiconductor substrate by ion implantation. The method of manufacturing a semiconductor device still further includes the step of: (e) after the step (d), etching back the first gate electrode and the second gate electrode to decrease the height of the first gate electrode and the second gate electrode and thereby protrude a portion of the second insulating film from between the first gate electrode and the second gate electrode. The method of manufacturing a semiconductor device still further includes the step of: (f) after the step (e), forming a sidewall insulating film on the respective side walls of the first gate electrode and the second gate electrode which are on the sides opposite to the sidewalls adjacent to each other and on the side walls of the portion of the second insulating film protruding from between the first gate electrode and the second gate electrode. The method of manufacturing a semiconductor device still further includes the step of: (g) after the step (f), forming a second semiconductor region for source or drain of the memory cell in the semiconductor substrate by ion implantation.

According to the embodiment, a semiconductor device having improved performance can be provided; a semiconductor device having improved reliability can be provided; or a semiconductor device having both can be provided.

BRIEF DESCRIPTION OF THE DRAWINGS

FIG. 31 is a table showing one example of voltage applying conditions to each site of a selected memory cell during "write", "erase", and "read";

DETAILED DESCRIPTION

Figure 1:
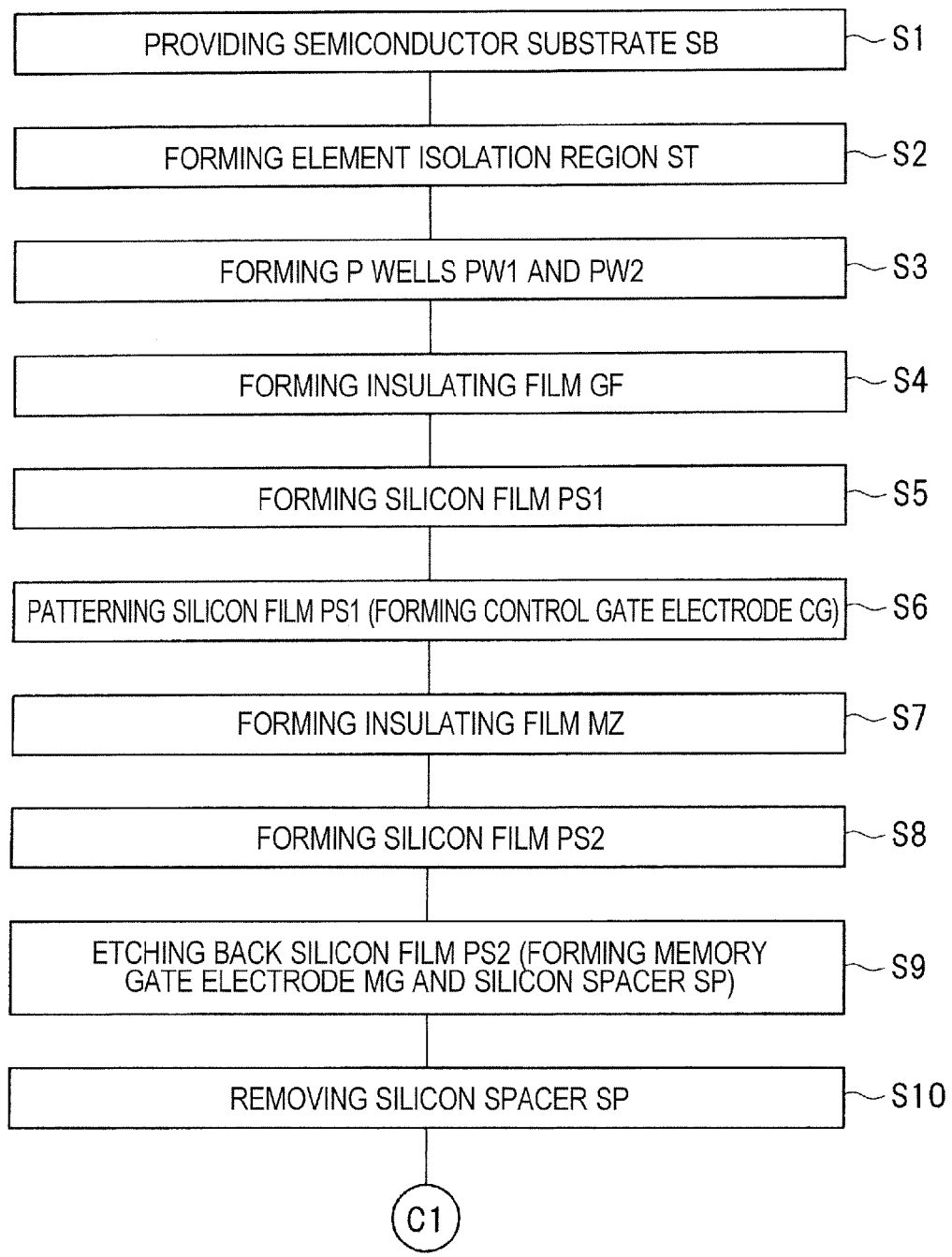
FIG. 1 is a process flow chart showing some of manufacturing steps of a semiconductor device of one embodiment.

In the following embodiments, a description may be made after divided in a plurality of sections or embodiments if necessary for the sake of convenience. These sections or embodiments are not independent from each other unless otherwise particularly specified, but one of them may be a modification example, detailed description, complementary description, or the like of a part or whole of the other one. In the following embodiments, when a reference is made to the number of elements (including the number, value, amount, range, or the like), the number is not limited to a specific number but may be more or less than the specific number, unless otherwise particularly specified or principally apparent that the number is limited to the specific number. Further, it is needless to say that in the following embodiments, the constituent component (including component step or the like) is not always essential unless otherwise particularly specified or principally apparent that it is essential. Similarly, in the following embodiments, when a reference is made to the shape, positional relationship, or the like of the constituent component, that substantially approximate or analogous to it is also embraced unless otherwise particularly specified or principally apparent that it is not. This also applies to the above-mentioned number or range.

Embodiments will hereinafter be described in detail based on drawings. In all the drawings for describing the embodiments, members having the same function will be identified by the same reference numerals and overlapping descriptions will be omitted. In the following embodiments, a description on the same or similar portion is not repeated in principle unless otherwise particularly necessary.

In the drawings to be used in the following embodiments, even a cross-sectional view is sometimes not hatched to facilitate understanding of it or even a plan view may be hatched to facilitate understanding of it.

(First Embodiment) <Manufacturing Steps of Semiconductor Device>

The semiconductor device of the present embodiment and also following embodiments are each a semiconductor device equipped with a nonvolatile memory (nonvolatile memory element, flash memory, or nonvolatile semiconductor memory device). In the present embodiment and following embodiments, a description on a nonvolatile memory will be made using a memory cell having an n channel MISFET (MISFET: metal insulator semiconductor field effect transistor) as a basic one. The polarity (polarity of a voltage applied during write/erase/read operation or polarity of a carrier) in the present embodiment and following embodiments is for describing the operation of a memory cell having an n channel MISFET as a basic one. When a memory cell has a p channel MISFET as a basic one, the same operation can be achieved in principle by reversing all the polarities of an applied potential, conductivity type of a carrier, and the like.

The method of manufacturing the semiconductor device of the present embodiment will next be described referring to drawings.

Figure 2:
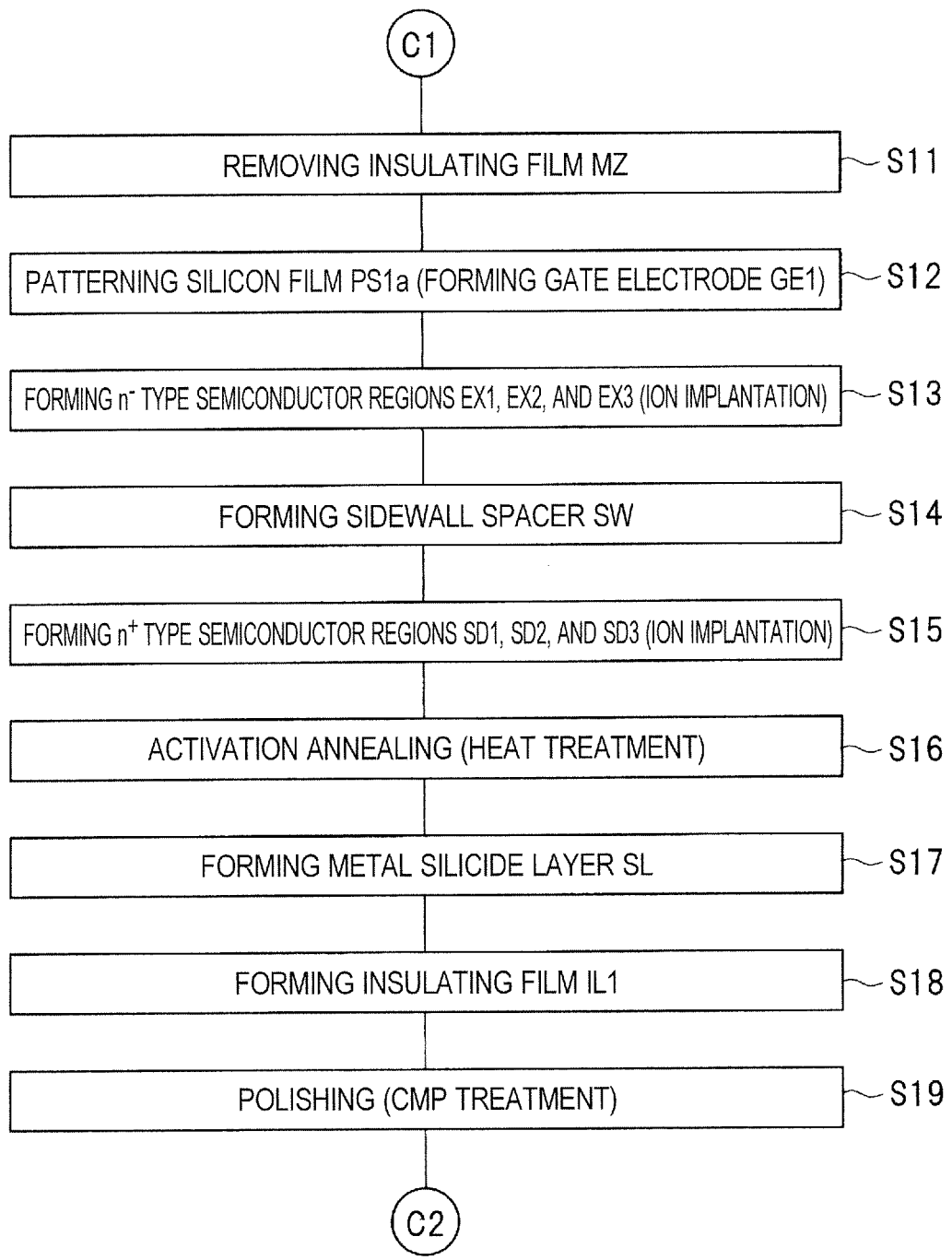
FIG. 2 is a process flow chart showing some of manufacturing steps of the semiconductor device of the one embodiment.
Figure 3:
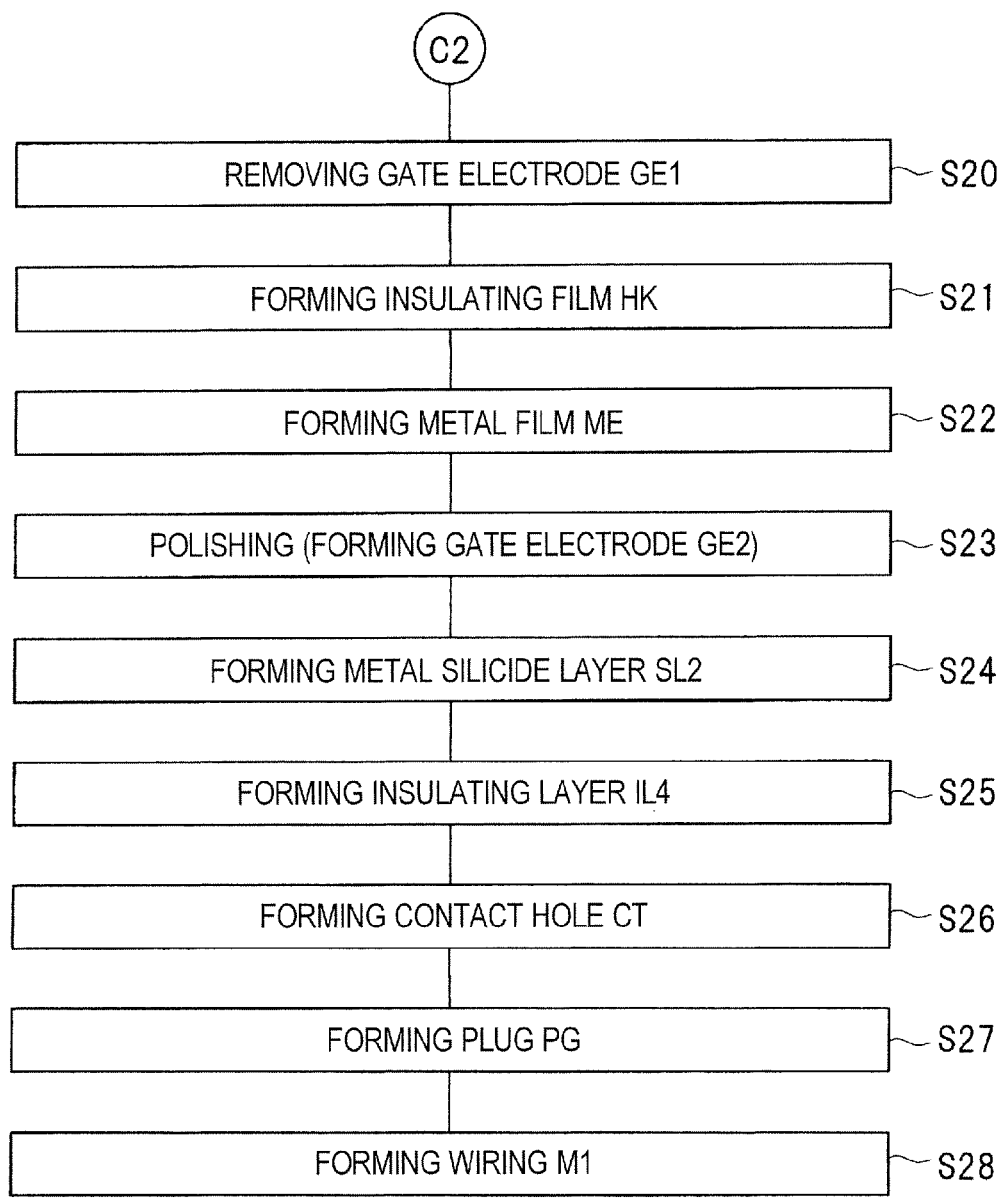
FIG. 3 is a process flow chart showing some of manufacturing steps of the semiconductor device of the one embodiment.

FIGS. 1 to 3 are process flow charts showing some of manufacturing steps of the semiconductor device of the present embodiment. FIGS. 4 to 28 are fragmentary cross-sectional views of the semiconductor device of the present embodiment during manufacturing steps. Of these, FIGS. 4 to 20 and FIGS. 22 to 28 each show a fragmentary cross-sectional view of a memory cell region 1A and a peripheral circuit region 1B. They show formation of a memory cell of a nonvolatile memory in the memory cell region 1A and formation of a MISFET in the peripheral circuit region 1B. FIG. 21 is an explanatory view of a polishing step of Step S19 and shows an enlarged cross-sectional view of a portion of the memory cell region 1A. From FIG. 21, an insulating film IL1 is omitted to facilitate understanding of the drawing.

The memory cell region 1A is a region of the (main surface of) a semiconductor substrate SB where a memory cell of a nonvolatile memory is to be formed. The peripheral circuit region 1B is a region of the (main surface) of the semiconductor substrate SB where a peripheral circuit is to be formed. One semiconductor substrate SB has both the memory cell region 1A and the peripheral circuit region 1B. This means that the memory cell region 1A and the peripheral circuit region 1B correspond to respectively different planar regions of the main surface of the same semiconductor substrate SB. The memory cell region 1A is not required to be neighboring to the peripheral circuit region 1B, but to simplify the understanding, the cross-sectional views of FIGS. 4 to 20 and FIGS. 22 to 28 show the memory cell region 1A and the peripheral circuit region 1B adjacent to each other.

The term "peripheral circuit" as used herein means a circuit other than a nonvolatile memory, for example, a processor such as CPU, a control circuit, a sense amplifier, a column decoder, a raw decoder, or an input/output circuit. The MISFET formed in the peripheral circuit region 1B is an MISFET for peripheral circuit.

In the present embodiment, formation of an n channel MISFET (control transistor and memory transistor) in the memory cell region 1A will be described, but by reversing the conductivity type, a p channel MISFET (control transistor and memory transistor) can be formed in the memory cell region 1A. Similarly, in the present embodiment, formation of an n channel MISFET in the peripheral circuit region 1B will be described, but by reversing the conductivity type, a p channel MISFET can be formed in the peripheral circuit region 1B. Alternatively, both the n channel MISFET and the p channel MISFET, that is, CMISFET (complementary MISFET) can be formed in the peripheral circuit region 1B.

Figure 4:
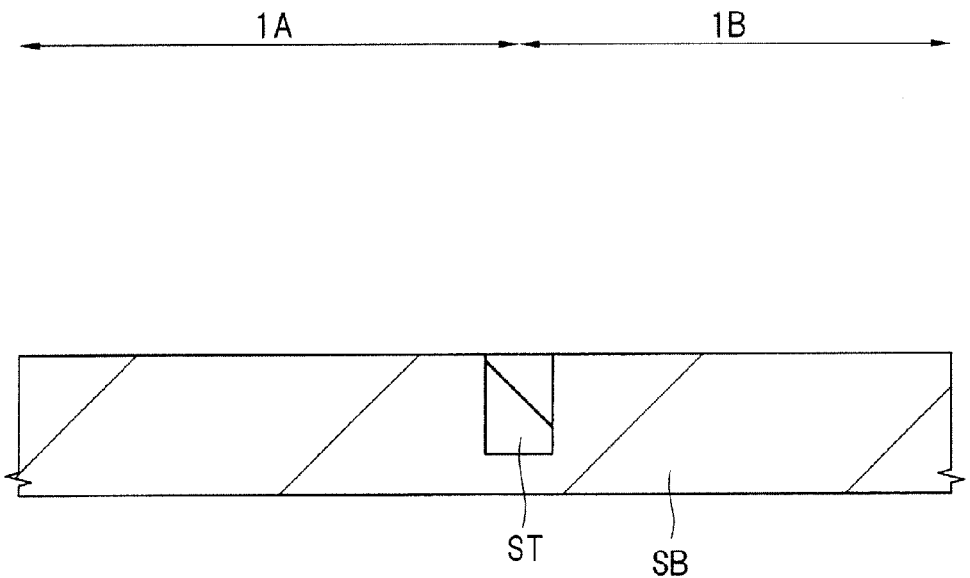
FIG. 4 is a fragmentary cross-sectional view of the semiconductor device of the one embodiment during a manufacturing step.

Manufacture of a semiconductor device starts with preparing (providing) a semiconductor substrate (semiconductor wafer) SB, for example, having a specific resistance of from about 1 to 10 Ωcm and made of p type single crystal silicon or the like as shown in FIG. 4 (Step S1 of FIG. 1). Then, an element isolation region (inter-element isolation insulating region) ST for defining (partitioning) an active region is formed in the main surface of the semiconductor substrate SB (Step S2 of FIG. 1).

The element isolation region ST is made of an insulator such as silicon oxide and can be formed, for example, by STI (shallow trench isolation) or LOCOS (local oxidization of silicon). The element isolation region ST can be formed, for example, by forming an element isolation trench in the main surface of the semiconductor substrate SB and then filling the resulting element isolation trench with an insulating film made of, for example, silicon oxide. More specifically, after formation of an element isolation trench in the main surface of the semiconductor substrate SB, an insulating film (for example, a silicon oxide film) for forming an element isolation region is formed on the semiconductor substrate SB so as to fill the element isolation trench with it. Then, the insulating film (insulating film for forming an element isolation region) outside the element isolation trench is removed to form the element isolation region ST made of the insulating film embedded in the element isolation trench.

Figure 5:
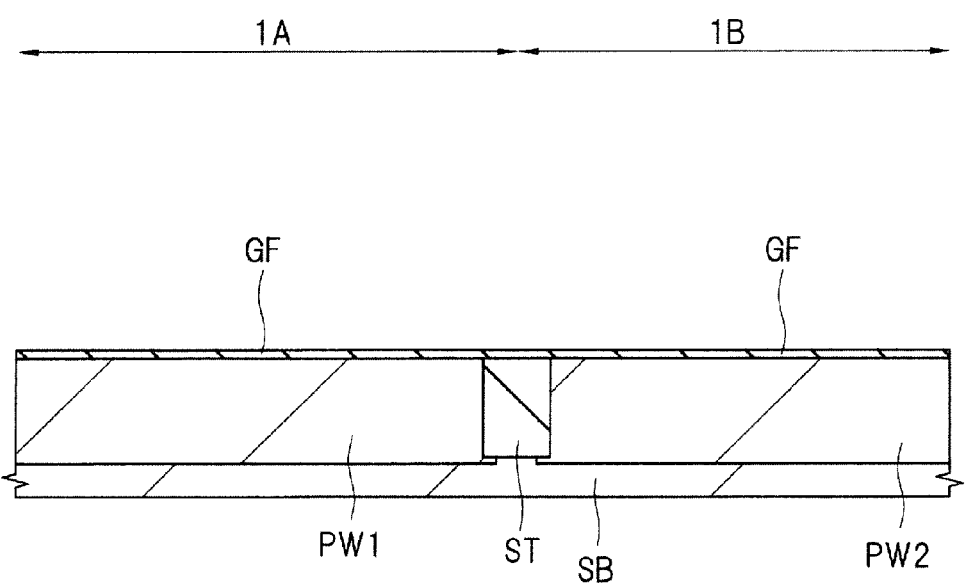
FIG. 5 is a fragmentary cross-sectional view of the semiconductor device during a manufacturing step following that of FIG. 4.

Next, as shown in FIG. 5, a p well PW1 and a p well PW2 are formed in the memory cell region 1A and the peripheral circuit region 1B of the semiconductor substrate SB, respectively (Step S3 of FIG. 1).

The p wells PW1 and PW2 can be formed, for example, by ion implantation of a p type impurity such as boron (B) into the semiconductor substrate SB. The p wells PW1 and PW2 are formed to have a predetermined depth from the main surface of the semiconductor substrate SB. Since the p well PW1 and the p well PW2 have the same conductivity type, they may be formed by the same ion implantation step or respectively different ion implantation steps.

Next, in order to adjust the threshold voltage of a control transistor to be formed later in the memory cell region 1A, a surface portion (surface layer portion) of the p well PW1 in the memory cell region 1A is subjected to channel dope ion implantation, if necessary. Further, in order to adjust the threshold voltage of an MISFET to be formed later in the peripheral circuit region 1B, a surface portion (surface layer portion) of the p well PW2 in the peripheral circuit region 1B is subjected to channel dope ion implantation, if necessary.

Next, after cleaning the surface of the semiconductor substrate SB (p wells PW1 and PW2) by washing with diluted hydrofluoric acid or the like, an insulating film GF for a gate insulating film is formed on the main surface of the semiconductor substrate SB (on the surface of the p wells PW1 and PW2) (Step S4 of FIG. 1).

The insulating film GF is formed on the surface of the semiconductor substrate SB (meaning, the upper surface of the p well PW1) in the memory cell region 1A and the surface of the semiconductor substrate SB (meaning, the upper surface of the p well PW2) in the peripheral circuit region 1B. As the insulating film GF, for example, a silicon oxide film can be used, but a silicon oxynitride film can also be used. The insulating film GF in the memory cell region 1A and the insulating film GF in the peripheral circuit region 1B can be formed by the same step or respectively different steps.

When the insulating film GF is a silicon oxide film, the insulating film GF can be formed, for example, by thermal oxidation. When a silicon oxynitride film is used as the insulating film GF, it can be formed, for example, by high-temperature short-time oxidation using $N_2O$, $O_2$, and $H_2$, or by nitriding (plasma nitriding) of a silicon oxide film, which has been formed by thermal oxidation, in plasma. The insulating film GF thus formed can have a thickness of, for example, from about 2 to 3 nm. In FIG. 5, the element isolation region ST has thereon the insulating film GF for convenience, but when the insulating film GF is formed by thermal oxidation, the insulating film GF is actually not formed on the element isolation region ST.

As another mode, the insulating film GF in the peripheral circuit region 1B and the insulating film GF in the memory cell region 1A can be formed respectively different steps in Step S4.

Figure 6:
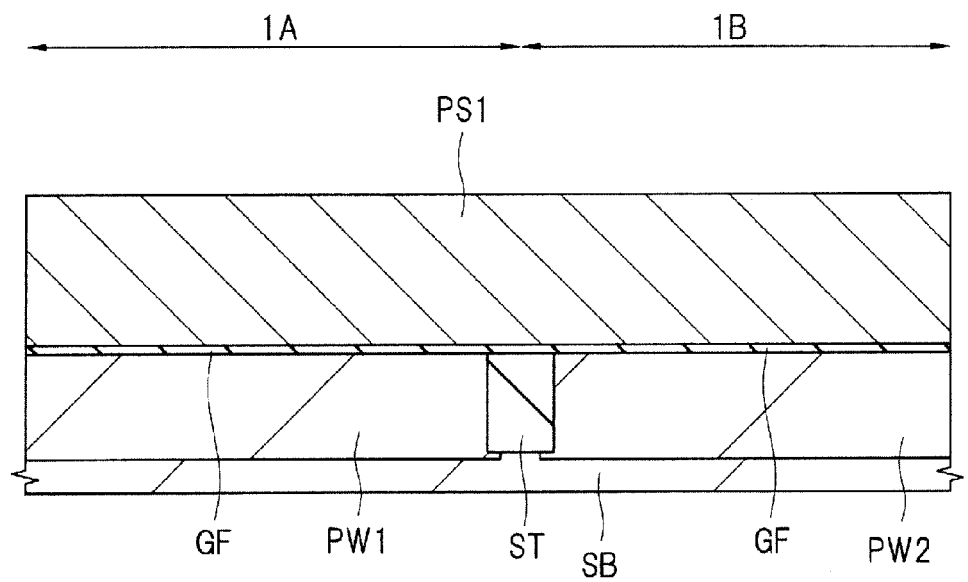
FIG. 6 is a fragmentary cross-sectional view of the semiconductor device during a manufacturing step following that of FIG. 5.

Next, as shown in FIG. 6, a silicon film PS1 is formed (deposited), as a conductive film for the formation of a control gate electrode CG, on the main surface (entire main surface) of the semiconductor substrate SB, that is, on the insulating films GF in the memory cell region 1A and the peripheral circuit region 1B (Step S5 of FIG. 1).

The silicon film PS1 is a conductive film for the gate electrode of a control transistor, that is, a conductive film for the formation of a control gate electrode CG, which will be described later. The silicon film PS1 also serves as a conductive film for the formation of a gate electrode GE1 which will be described later. This means that the control gate electrode CG1 and the gate electrode GE, each described later, are formed by the silicon film PS1.

The silicon film PS1 is made of a polycrystalline silicon film (polysilicon film) and can be formed by CVD (chemical vapor deposition) or the like. The thickness (deposited thickness) of the silicon film PS1 can be set at, for example, from about 50 to 250 nm. The silicon film PS1 is formed as an amorphous silicon film at the time of film formation and then, the silicon film PS1 made of an amorphous silicon film can be converted into the silicon film PS1 made of a polycrystalline silicon film by subsequent heat treatment. Alternatively, the silicon film PS1 can be converted into a low-resistance semiconductor film (doped polysilicon film) by doping with an impurity at the time of film formation or by the ion implantation of an impurity after film formation. The silicon film PS1 in the memory cell region 1A is preferably an n type silicon film having an n type impurity such as phosphorus (P) or arsenic (As) doped therein.

Figure 7:
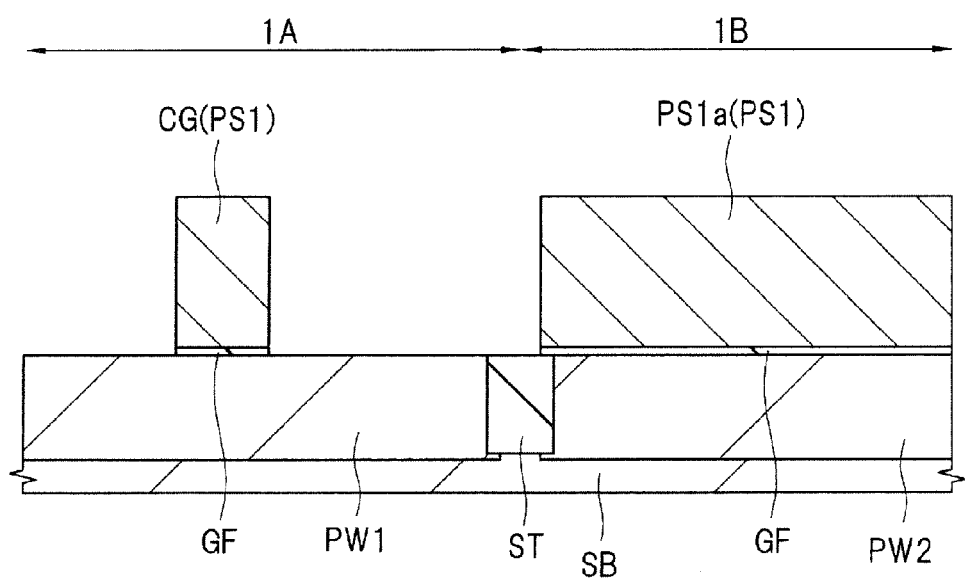
FIG. 7 is a fragmentary cross-sectional view of the semiconductor device during a manufacturing step following that of FIG. 6.

Next, as shown in FIG. 7, the silicon film PS1 is patterned using photolithography and etching to form a control gate electrode CG in the memory cell region 1A (Step S6 of FIG. 1). More specifically, the patterning step of Step S6 can be performed, for example, in the following manner.

Described specifically, after formation of a photoresist pattern (not illustrated) on the silicon film PS1 by using photolithography, the silicon film PS1 in the memory cell region 1A is etched (preferably, dry etched) and patterned with the photoresist pattern as an etching mask. This photoresist pattern is not shown but is formed in both a control gate electrode CG formation region and the entirety of the peripheral circuit region 1B. After patterning of the silicon film PS1, the photoresist pattern is removed.

The silicon film PS1 is patterned in Step S6 in such a manner and as shown in FIG. 7, the control gate electrode CG made of the patterned silicon film PS1 is formed in the memory cell region 1A. At this time, since the peripheral circuit region 1B has therein the photoresist pattern as described above so that patterning of the silicon film PS1 is not performed and the silicon film PS1 remains as is. The silicon film PS1 remaining in the peripheral circuit region 1B will hereinafter be followed by a reference sign PS1a and called "silicon film PS1a". In the memory cell region 1A, the insulating film GF which has remained below the control gate electrode CG will serve as a gate insulating film of a control transistor. The control gate electrode CG made of the silicon film PS1 is therefore formed on the semiconductor substrate SB (the p well PW1) via the insulating film GF as a gate insulating film.

The insulating film GF other than that covered with the control gate electrode CG (the insulating film GF other than that serving as a gate insulating film) in the memory cell region 1A can be removed by dry etching in the patterning step of Step S6 or wet etching after the dry etching.

The silicon film PS1a has a side surface (end portion) preferably on the element isolation region ST. The silicon film PS1a having such a side surface covers an active region of the peripheral circuit region 1B (an active region defined by the element isolation region ST). This makes it possible to prevent unnecessary etching of a substrate region (Si substrate region) of the semiconductor substrate SB in the peripheral circuit region 1B.

Next, the surface portion (surface layer portion) of the p well PW1 in the memory cell region 1A is subjected to channel dope ion implantation if necessary in order to regulate the threshold voltage of a memory transistor to be formed later in the memory cell region 1A.

Figure 8:
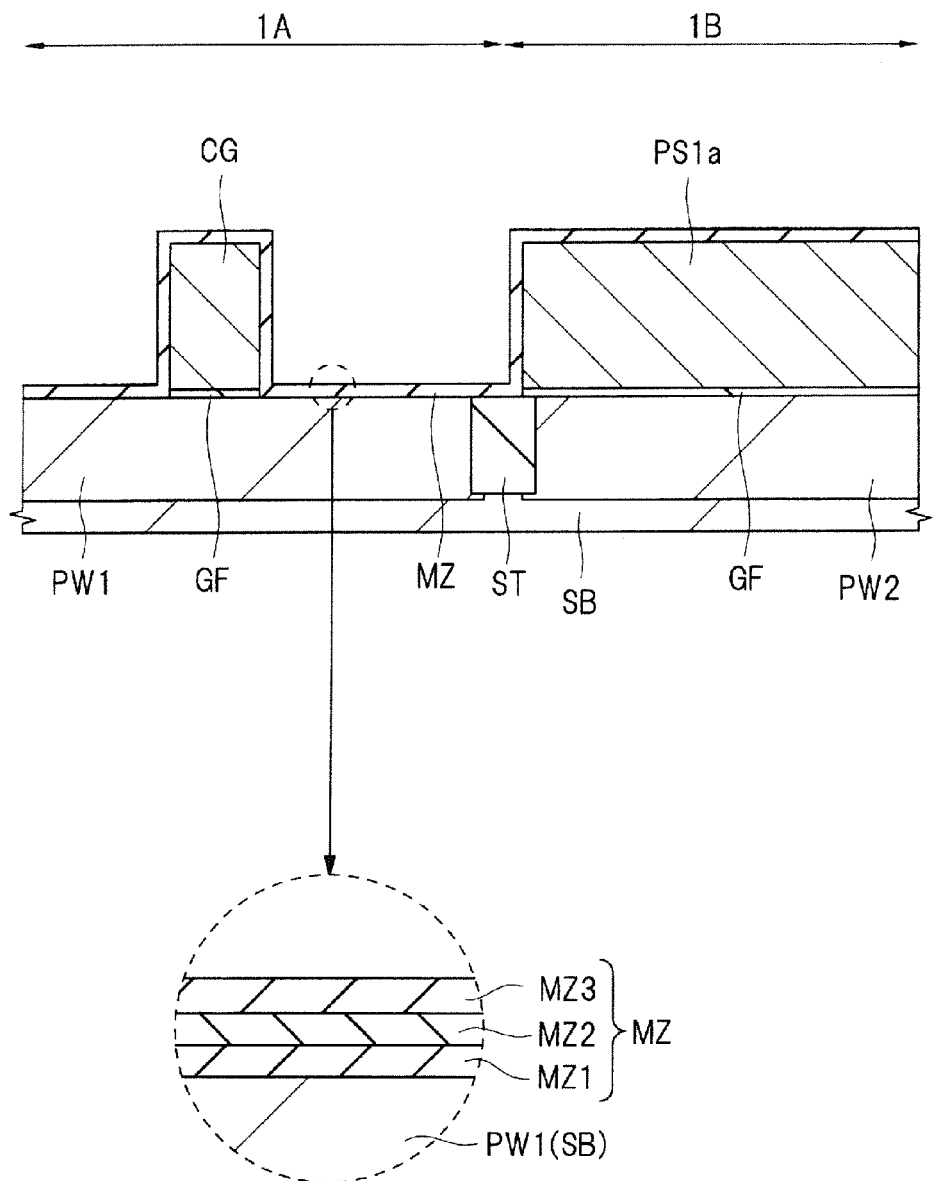
FIG. 8 is a fragmentary cross-sectional view of the semiconductor device during a manufacturing step following that of FIG. 7.

Next, washing treatment is performed to clean the main surface of the semiconductor substrate SB. Then, as shown in FIG. 8, an insulating film Mz for gate insulating film of a memory transistor is formed on the entire main surface of the semiconductor substrate SB, that is, on the main surface (surface) of the semiconductor substrate SB and the surfaces (upper surface and side surface) of the control gate electrode CG (Step S7 of FIG. 1). At this time, the silicon film PS1a still remains in the peripheral circuit region 1B so that the insulating film MZ is also formed on the surfaces (upper surface and side surface) of this silicon film PS1a. In Step S7, the insulating film MZ is formed on the semiconductor substrate SB so as to cover the silicon film PS1a of the control gate electrode CG and the peripheral circuit region 1B.

The insulating film MZ is an insulating film for the gate insulating film of a memory transistor and it has therein a charge storage portion (charge storage layer). This insulating film MZ is a stacked film of a silicon oxide film (oxide film) MZ1, a silicon nitride film (nitride film) MZ2 formed on the silicon oxide film MZ1, and a silicon oxide film (oxide film) MZ3 formed on the silicon nitride film MZ2. The stacked film of the silicon oxide film MZ1, the silicon nitride film MZ2, and the silicon oxide film MZ3 can also be regarded as an ONO (oxide-nitride-oxide) film.

In FIG. 8, to facilitate understanding of the drawing, the insulating film MZ made of the silicon oxide film MZ1, the silicon nitride film MZ2, and the silicon oxide film MZ3 is shown simply as the insulating film MZ, but as shown in an enlarged view of a region surrounded by a circle with dotted line in FIG. 8, the insulating film MZ is made of a stacked film of the silicon oxide film MZ1, the silicon nitride film MZ2, and the silicon oxide film MZ3.

The silicon oxide films MZ1 and MZ3 configuring the insulating film MZ can be formed by oxidation treatment (thermal oxidation treatment) or CVD, or a combination of them. For the above-mentioned oxidation treatment, ISSG (in situ steam generation) oxidation may be used. The silicon nitride film MZ2 configuring the insulating film MZ can be formed, for example, by CVD.

In the present embodiment, as an insulating film having a trap level (charge storage layer), the silicon nitride film MZ2 is formed. It is preferably a silicon nitride film from the standpoint of reliability and the like, but is not limited to a silicon nitride film. For example, a high dielectric constant film having a dielectric constant higher than that of a silicon nitride film, for example, an aluminum oxide (alumina) film, a hafnium oxide film, or a tantalum oxide film can also be used as a charge storage layer or charge storage portion. Silicon nanodots may also be used for the formation of the charge storage layer or charge storage portion.

The insulating film MZ is formed, for example, in the following manner. First, a silicon oxide film MZ1 is formed by thermal oxidation (preferably, ISSG oxidation). Then, a silicon nitride film MZ2 is deposited on the silicon oxide film MZ1 by CVD, followed by the formation of a silicon oxide film MZ3 on the silicon nitride film MZ2 by CVD or thermal oxidation, or both of them. As a result, the insulating film MZ made of a stacked film of the silicon oxide film MZ1, the silicon nitride film MZ2, and the silicon oxide film MZ3 can be formed.

The thickness of the silicon oxide film MZ1 can be set at, for example, from about 2 to 10 nm, that of the silicon nitride film MZ2 can be set at, for example, from about 5 to 15 nm, and that of the silicon oxide film MZ3 can be set at, for example, from about 2 to 10 nm.

The insulating film MZ functions as the gate insulating film of a memory gate electrode MG, which will be formed later and has a charge retaining (charge storage) function. The insulating film MZ therefore has a stacked structure of at least three layers so that it can function as a gate insulating film of a memory transistor having a charge retaining function. Compared with the potential barrier height of an outer layer (here, the silicon oxide films MZ1 and MZ3) functioning as a charge block layer, the potential barrier height of the inner layer (here, the silicon nitride film MZ2) functioning as a charge storage portion is low. This can be achieved by forming, as in the present embodiment, the insulating film MZ as a stacked film of the silicon oxide film MZ1, the silicon nitride film MZ2 on the silicon oxide film MZ1, and the silicon oxide film MZ3 on the silicon nitride film MZ2.

The band gap of each of the top insulating film (here, the silicon oxide film MZ3) and the bottom insulating film (here, the silicon oxide film MZ1) of the insulating film MZ is required to be larger than that of the charge storage layer (here, the silicon nitride film MZ2) between the top insulating film and the bottom insulating film. By setting the band gap as described above, the silicon oxide film MZ3 and the silicon oxide film MZ1 sandwiching therebetween the silicon nitride film MZ2 as a charge storage layer can function as a charge block layer (or charge confining layer) for confining charges in the charge storage layer. A silicon oxide film has a band gap larger than that of a silicon nitride film so that the silicon nitride film can be used as the charge storage layer and the silicon oxide film can be used as each of the top insulating film and the bottom insulating film.

Figure 9:
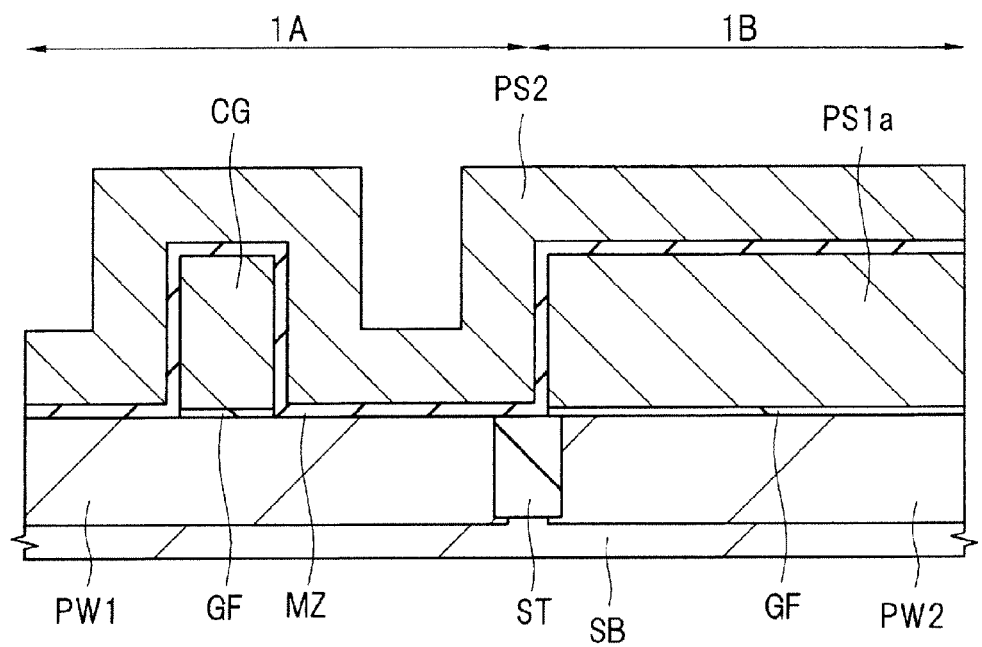
FIG. 9 is a fragmentary cross-sectional view of the semiconductor device during a manufacturing step following that of FIG. 8.

Next, as shown in FIG. 9, on the main surface (entire main surface) of the semiconductor substrate SB, that is, on the insulating film MZ, a silicon film PS2 is formed (deposited) as a conductive film for the formation of a memory gate electrode MG so as to cover the control gate electrode CG in the memory cell region 1A and to cover the silicon film PS1a in the peripheral circuit region 1B (Step S8 of FIG. 1).

The silicon film PS2 is a film (conductive film) for the formation of a memory gate electrode MG which will be described later. The silicon film PS2 is made of a polycrystalline silicon film and can be formed by CVD or the like. The deposited thickness of the silicon film PS2 can be set at, for example, about from 30 to 150 nm. After formation of the silicon film PS2 as an amorphous silicon film, heat treatment may be performed to convert the silicon film PS2 made of an amorphous silicon film into the silicon film PS2 made of a polycrystalline silicon film.

The silicon film PS2 is provided as an impurity-doped low-resistance semiconductor film (doped polysilicon film) and it is formed by doping an impurity during film formation or by doping an impurity by ion implantation after film formation. The silicon film PS2 is preferably an n type silicon film obtained by doping an n type impurity such as phosphorus (P) or arsenic (As). When an n type impurity is doped during film formation of the silicon film PS2, an n type impurity-doped silicon film PS2 can be formed by incorporating a doping gas (an n type impurity adding gas) in a silicon film PS2 forming gas.

Next, by anisotropic etching, the silicon film PS2 is etched back (etched, dry etched, or anisotropically etched) (Step 9 of FIG. 1).

Figure 10:
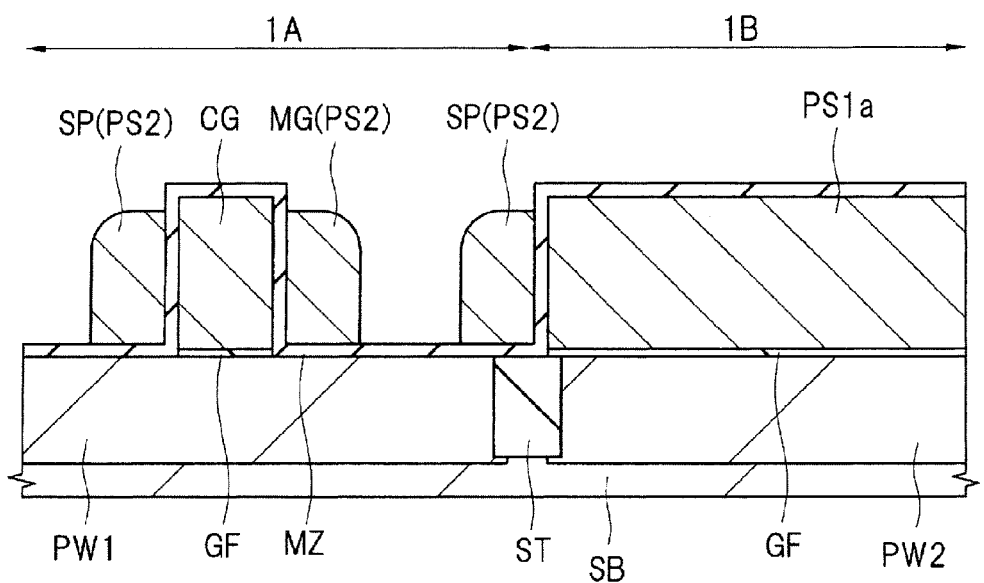
FIG. 10 is a fragmentary cross-sectional view of the semiconductor device during a manufacturing step following that of FIG. 9.

In the etch back step of Step S9, the silicon film PS2 is anisotropically etched (etched back) by a thickness corresponding to a deposited film thickness of the silicon film PS2 to leave the silicon film PS2 in sidewall spacer form on both side walls of the control gate electrode CG via the insulating film MZ and remove the silicon film PS2 from the other region. As a result, as shown in FIG. 10, in the memory cell region 1A, a memory gate electrode MG is formed from the silicon film PS2 that has remained in sidewall spacer form on one of the two side walls of the control gate electrode CG via the insulating film MZ. Further, in the memory cell region 1A, a silicon spacer SP is formed from the silicon film PS2 that has remained in sidewall spacer form on the other one of the two side walls of the control gate electrode CG via the insulating film MZ. The memory gate electrode MG is formed on the insulating film MZ so as to be adjacent to the control gate electrode CG via the insulating film MZ.

The memory gate electrode MG is a gate electrode for the memory cell, more specifically, a gate electrode for a memory transistor of the memory cell.

The silicon spacer SP can also be regarded as a sidewall spacer made of silicon. The memory gate electrode MG and the silicon spacer SP are formed, respectively, on the side walls of the control gate electrode CG which are opposite to each other and they have almost a symmetric structure with the control gate electrode CG therebetween. The silicon spacer SP can also be formed on the side wall of the silicon film PS1a that has been left in the peripheral circuit region 1B via the insulating film MZ.

By performing the etch back step of Step S9, the insulating film MZ is exposed from a region not covered with the memory gate electrode MG and the silicon spacer SP. The memory gate electrode MG formed in Step S9 and the semiconductor substrate SB (p well PW1), and the memory gate electrode MG and the control gate electrode CG have therebetween the insulating film MZ. The insulating film MZ below the memory gate electrode MG in the memory cell region 1A becomes a gate insulating film of a memory transistor. The gate length of the memory gate electrode MG can be adjusted by adjusting the deposited film thickness of the silicon film PS2 obtained in Step S8.

Figure 11:
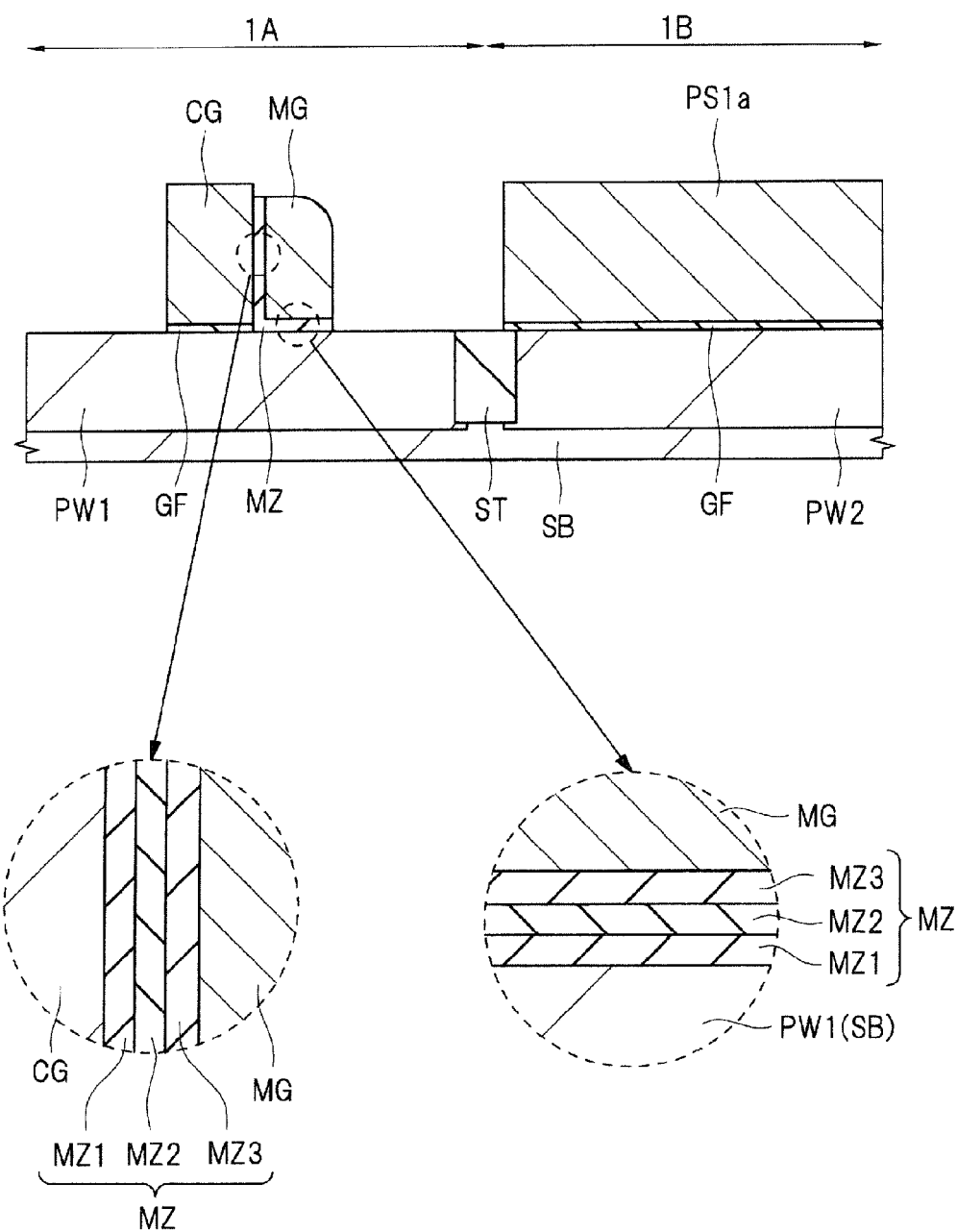
FIG. 11 is a fragmentary cross-sectional view of the semiconductor device during a manufacturing step following that of FIG. 10.

Next, photolithography is used to form, on the semiconductor substrate SB, a photoresist pattern (not illustrated) that covers the memory gate electrode MG and at the same time, exposes the silicon spacer SP. With the photoresist pattern as an etching mask, dry etching is performed to remove the silicon spacer SP (Step S10 of FIG. 1). The photoresist pattern is thereafter removed. By the etching step of Step S10, the silicon spacer SP is removed as shown in FIG. 11, but the memory gate electrode MG covered with the photoresist pattern remains without being etched.

Next, a portion of the insulating film MZ exposed without being covered with the memory gate electrode MG is removed by etching (for example, wet etching) (Step S11 of FIG. 2). FIG. 11 shows this stage. At this time, in the memory cell region 1A, the insulating film MZ present below the memory gate electrode MG and between the memory gate electrode MG and the control gate electrode CG remains without being removed and the insulating film MZ in the other region is removed. As is apparent from FIG. 11, in the memory cell region 1A, the insulating film MZ continuously extends in a region between the memory gate electrode MG and the semiconductor substrate SB (the p well PW1) and a region between the memory gate electrode MG and the control gate electrode CG. As already described above, as shown in an enlarged view surrounded by a circle with a dotted line in FIG. 11, the insulating film MZ is a stacked film made of the silicon oxide film MZ1, the silicon nitride film MZ2 on the silicon oxide film MZ1, and the silicon oxide film MZ3 on the silicon nitride film MZ2.

As described above, in Steps S7 to S11, the memory gate electrode MG for the memory cell is formed on the semiconductor substrate SB (the p well PW1) via the insulating film MZ having therein the charge storage portion so as to be neighboring to the control gate electrode CG. More specifically, the memory gate electrode MG for the memory cell is formed on the semiconductor substrate SB (the p well PW1) via the insulating film MZ having therein the charge storage portion so as to be neighboring to the control gate electrode CG via the insulating film MZ.

Figure 12:
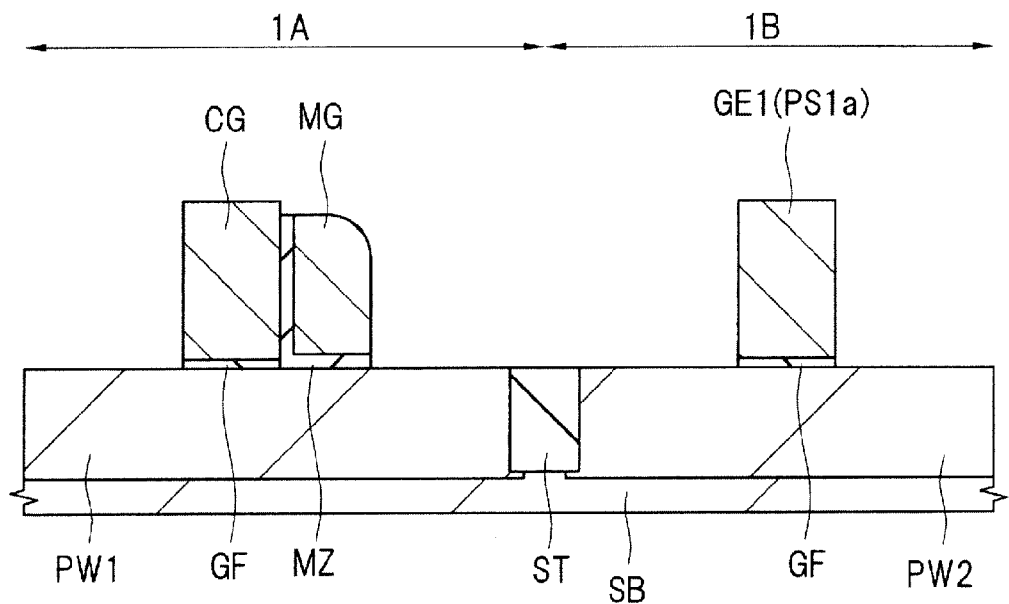
FIG. 12 is a fragmentary cross-sectional view of the semiconductor device during a manufacturing step following that of FIG. 11.

Next, the silicon film PS1a of the peripheral circuit region 1B is patterned by photolithography and etching to form a gate electrode GE1 in the peripheral circuit region 1B as shown in FIG. 12 (Step S12 of FIG. 2).

The patterning step of Step S12 can be performed, for example, in the following manner. Described specifically, a photoresist pattern (not illustrated) is formed by photolithography on the silicon film PS1a formed in the peripheral circuit region 1B. This photoresist pattern is formed in the entirety of the memory cell region 1A and a gate electrode GE1 forming region in the peripheral circuit region 1B. With the resulting photoresist pattern as an etching mask, the silicon film PS1a in the peripheral circuit region 1B is patterned by etching (preferably, dry etching). At this time, since the memory gate electrode MG and the control gate electrode CG in the memory cell region 1A are covered with the photoresist pattern, they are not etched. Then, the photoresist pattern is removed. As shown in FIG. 12, the gate electrode GE1 made of the patterned silicon film PS1a is formed in the peripheral circuit region 1B.

The gate electrode GE1 is a dummy gate electrode (pseudo gate electrode) and it will be removed later. The gate electrode GE1 will be removed and then, replaced by a gate electrode GE2 which will be described later so that it can also be regarded as a replacement gate electrode or a gate electrode for substitution.

In the peripheral circuit region 1B, a portion of the insulating film GF not covered with the gate electrode GE1 can be removed by dry etching performed in the patterning step of Step S12 or by the dry etching followed by wet etching.

In such a manner, in the peripheral circuit region 1B, the gate electrode GE1 is formed on the semiconductor substrate SB (p well PW2) via the insulating film GF.

Figure 13:
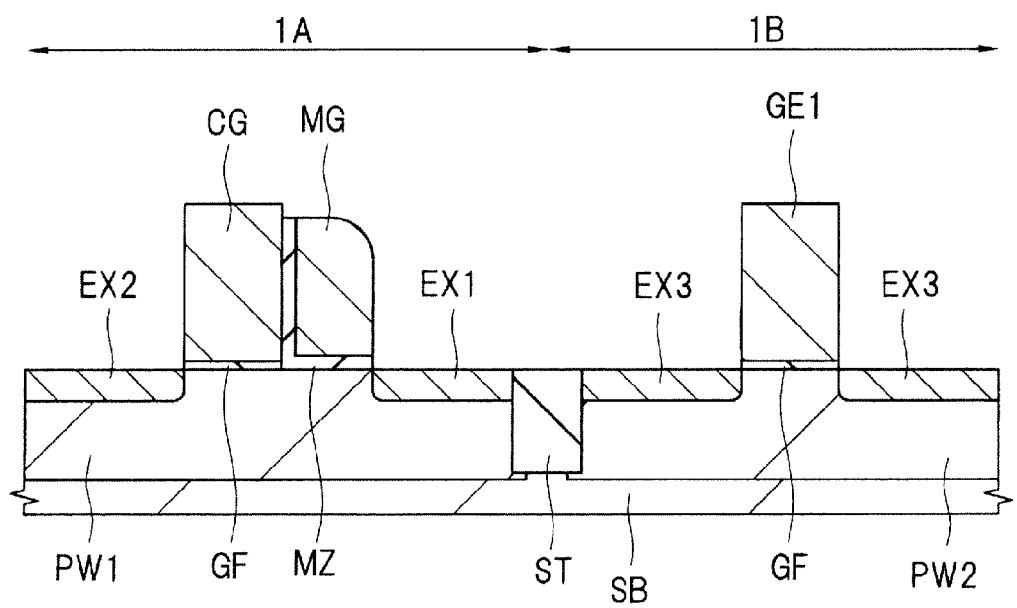
FIG. 13 is a fragmentary cross-sectional view of the semiconductor device during a manufacturing step following that of FIG. 12.

Next, as shown in FIG. 13, n⁻ type semiconductor regions (n type impurity diffusion layers, extension regions, or LDD regions) EX1, EX2, and EX3 are formed by ion implantation (Step S13 of FIG. 2).

In Step S13, the n⁻ type semiconductor regions EX1, EX2, and EX3 can be formed, for example, by doping an n type impurity such as arsenic (As) or phosphorus (P) into the semiconductor substrate SB (p wells PW1 and PW2) with the control gate electrode CG, the memory gate electrode MG, and the gate electrode GE1 as a mask (ion implantation preventing mask). At this time, in the memory cell region 1A, with the memory gate electrode MG, as a mask (ion implantation preventing mask), the n⁻ type semiconductor region EX1 is formed in self alignment with the side wall of the memory gate electrode MG (side wall on the side opposite to the side wall adjacent to the control gate electrode CG via the insulating film MZ). In the memory cell region 1A, with the control gate electrode CG as a mask (ion implantation preventing mask), the n⁻ type semiconductor region EX2 is formed in self alignment with the side wall of the control gate electrode CG (side wall on the side opposite to the side wall adjacent to the memory gate electrode MG via the insulating film MZ). In the peripheral circuit region 1B, with the gate electrode GE1 as a mask (ion implantation preventing mask), the n⁻ type semiconductor region EX3 is formed in self alignment with the both side walls of the gate electrode GE1.

The n⁻ type semiconductor region EX1 and the n⁻ type semiconductor region EX2 can function as a portion of the source/drain region (source or drain region) of a memory cell to be formed in the memory cell region 1A. The n⁻ type semiconductor region EX3 can function as a portion of the source/drain region (source or drain region) of a MISFET to be formed in the peripheral circuit region 1B. The n⁻ type semiconductor region EX1, the n⁻ type semiconductor region EX2, and the n⁻ type semiconductor region EX3 can be formed by the same ion implantation step but can also be formed by respectively different ion implantation steps.

Next, a sidewall spacer (sidewall or sidewall insulating film) SW made of an insulating film is formed on the respective side walls of the control gate electrode CG and the memory gate electrode MG (sidewalls on the side opposite to the sidewalls adjacent to each other via the insulating film MZ) and on the sidewalls of the gate electrode GE1 (Step S14 of FIG. 2). The sidewall spacer SW can be regarded as a sidewall insulating film.

Figure 14:
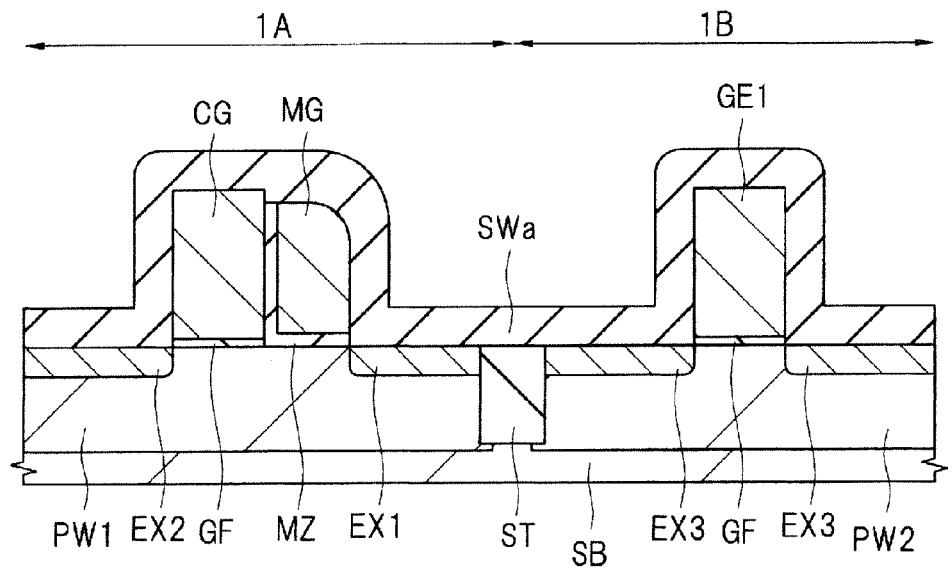
FIG. 14 is a fragmentary cross-sectional view of the semiconductor device during a manufacturing step following that of FIG. 13.
Figure 15:
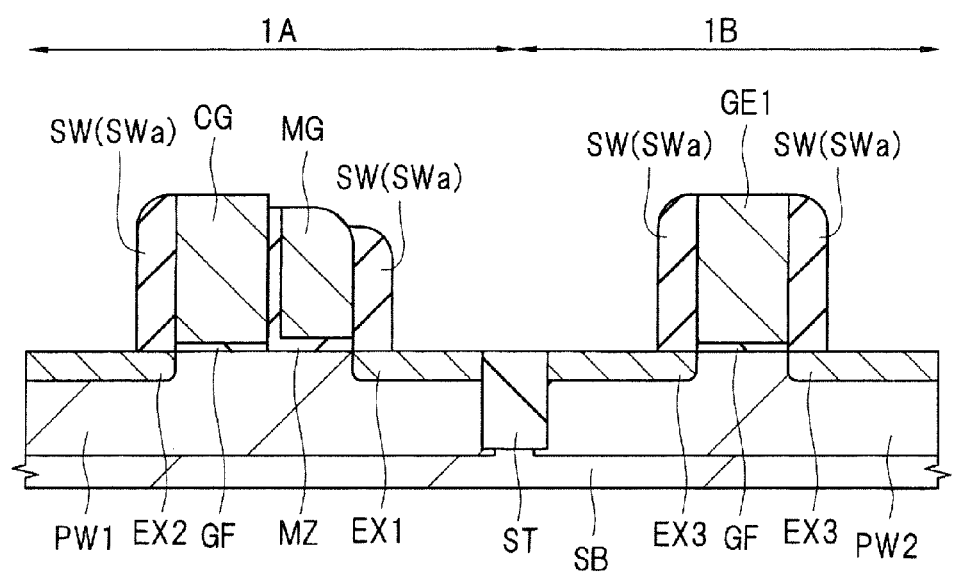
FIG. 15 is a fragmentary cross-sectional view of the semiconductor device during a manufacturing step following that of FIG. 14.

The sidewall spacer SW formation step of Step S14 can be performed specifically as follows. Described specifically, first, as shown in FIG. 14, an insulating film SWa for the formation of the sidewall spacer SW is deposited on the entire main surface of the semiconductor substrate SB by CVD or the like. The insulating film SWa for the formation of the sidewall spacer SW is made of, for example, a silicon oxide film, a silicon nitride film, or a stacked film of them. The insulating film SWa for the formation of the sidewall spacer SW is then anisotropically etched (etched back) to form, as shown in FIG. 15, a sidewall spacer SW while leaving this insulating film SWa selectively on the sidewalls of the control gate electrode CG and the memory gate electrode MG (the sidewalls on the side opposite to the side walls adjacent to each other via the insulating film MZ) and the sidewall of the gate electrode GE1. The sidewall spacer SW is formed on both side walls of the gate electrode GE1, on the side wall of the control gate electrode CG on the side opposite to the side wall adjacent to the memory gate electrode MG via the insulating film MZ, and on the side wall of the memory gate electrode MG on the side opposite to the side wall adjacent to the control gate electrode CG via the insulating film MZ.

Figure 16:
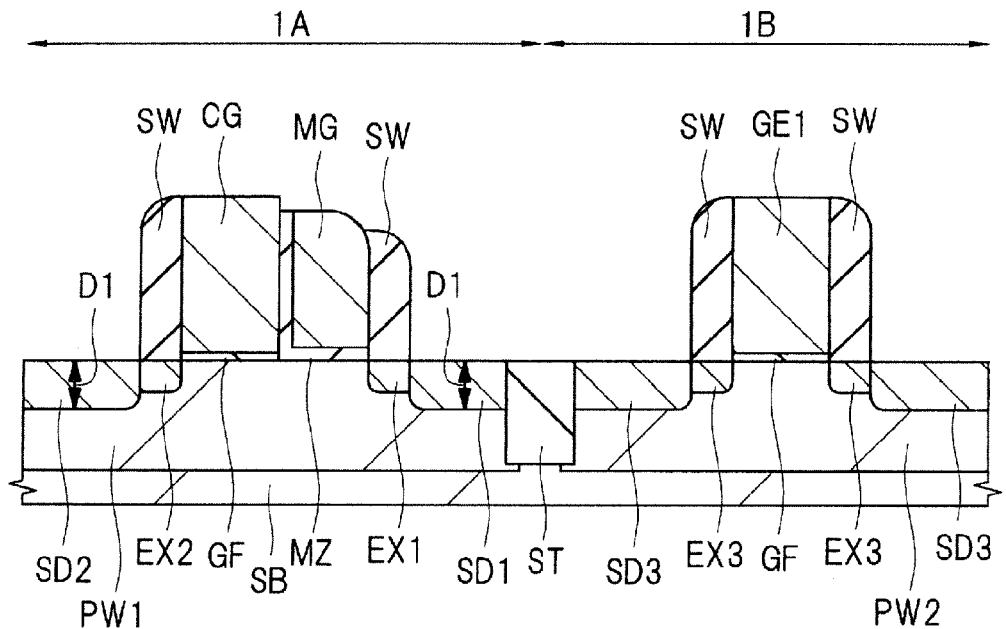
FIG. 16 is a fragmentary cross-sectional view of the semiconductor device during a manufacturing step following that of FIG. 15.

Next as shown in FIG. 16, n⁺ type semiconductor regions (n type impurity diffusion layers or source/drain regions) SD1, SD2, and SD3 are formed by ion implantation (Step S15 of FIG. 2).

In Step S15, the n⁺ type semiconductor regions SD1, SD2, and SD3 can be formed, for example, by ion implantation of an n type impurity such as arsenic (As) or phosphorus (P) into the semiconductor substrate SB (p wells PW1 and PW2), with the control gate electrode CG, the memory gate electrode MG, the gate electrode GE1, and sidewall spacers SW on the sidewalls of them as a mask (ion implantation preventing mask). At this time, in the memory cell region 1A, the memory gate electrode MG and the sidewall spacer SW on the side wall of the memory gate electrode MG function as a mask (ion implantation preventing mask) and thereby, the n⁺ type semiconductor region SD1 is formed in self alignment with the sidewall spacer SW on the sidewall of the memory gate electrode MG. In the memory cell region 1A, the control gate electrode CG and the sidewall spacer SW on the side wall of the control gate electrode CG function as a mask (ion implantation preventing mask) and thereby the n⁺ type semiconductor region SD2 is formed in self alignment with the sidewall spacer SW on the sidewall of the control gate electrode CG. In the peripheral circuit region 1B, the gate electrode GE1 and the sidewall spacer SW on the gate electrode GE1 function as a mask (ion implantation preventing mask) and thereby, the n⁺ type semiconductor region SD3 is formed in self alignment with the sidewall spacer SW on both side walls of the gate electrode GE1. As a result, an LDD (lightly doped drain) structure is formed. The n⁺ type semiconductor region SD1, the n⁺ type semiconductor region SD2, and the n⁺ type semiconductor region SD3 can be formed by the same ion implantation step, but can also be formed by respectively different ion implantation steps. Alternatively, the n⁺ type semiconductor region SD1 and the n⁺ type semiconductor region SD2 can be formed by the same ion implantation, while the n⁺ type semiconductor region SD3 can be formed by another ion implantation.

As described above, an n type semiconductor region (corresponding to a semiconductor region MS of FIG. 29 described later) functioning as a source region of a memory transistor is formed from the n⁻ type semiconductor region EX1 and the n⁺ type semiconductor region SD1 having an impurity concentration higher than it. Further, an n type semiconductor region (corresponding to a semiconductor region MD of FIG. 29) functioning as a drain region of a control transistor is formed from the n⁻ type semiconductor region EX2 and the n⁺ type semiconductor region SD2 having an impurity concentration higher than it. Further, an n type semiconductor region functioning as a source/drain region (semiconductor region for source or drain) of the MISFET in the peripheral circuit region 1B is formed from the n⁻ type semiconductor region EX3 and the n⁺ type semiconductor region SD3 having an impurity concentration higher than it. The n⁺ type semiconductor region SD1 has a higher impurity concentration and a deeper junction depth than the n⁻ type semiconductor region EX1 and the n⁺ type semiconductor region SD2 has a higher impurity concentration and a deeper junction depth than the n⁻ type semiconductor region EX2. The n⁺ type semiconductor region SD3 has a higher impurity concentration and a deeper junction depth than the n⁻ type semiconductor region EX3.

Next, activation annealing is performed as heat treatment for activating an impurity doped into the semiconductor regions (n⁻ type semiconductor regions EX1, EX2, and EX3 and n⁺ type semiconductor regions SD1, SD2, and SD3) for source and drain (Step S16 of FIG. 2).

In such a manner, the memory gate electrode MG, the control gate electrode CG, and the source/drain region of the memory cell of a nonvolatile memory are formed in the memory cell region 1A, while a source/drain region for the MISFET is formed in the peripheral circuit region 1B. In the peripheral circuit region 1B, however, a gate electrode (gate electrode GE2 described later) to be used finally has not yet been formed.

Next, a metal silicide layer SL is formed (Step S17 of FIG. 2).

The metal silicide layer SL can be formed by carrying out a so-called salicide (self aligned silicide) process. More specifically, the metal silicide layer SL can be formed as described below.

Figure 17:
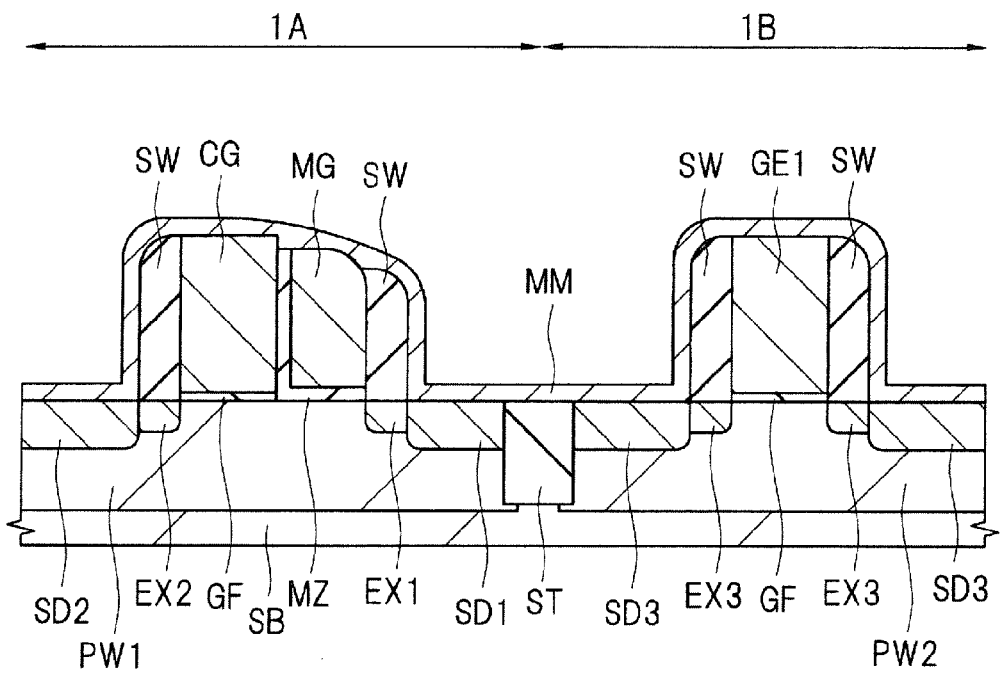
FIG. 17 is a fragmentary cross-sectional view of the semiconductor device during a manufacturing step following that of FIG. 16.
Figure 18:
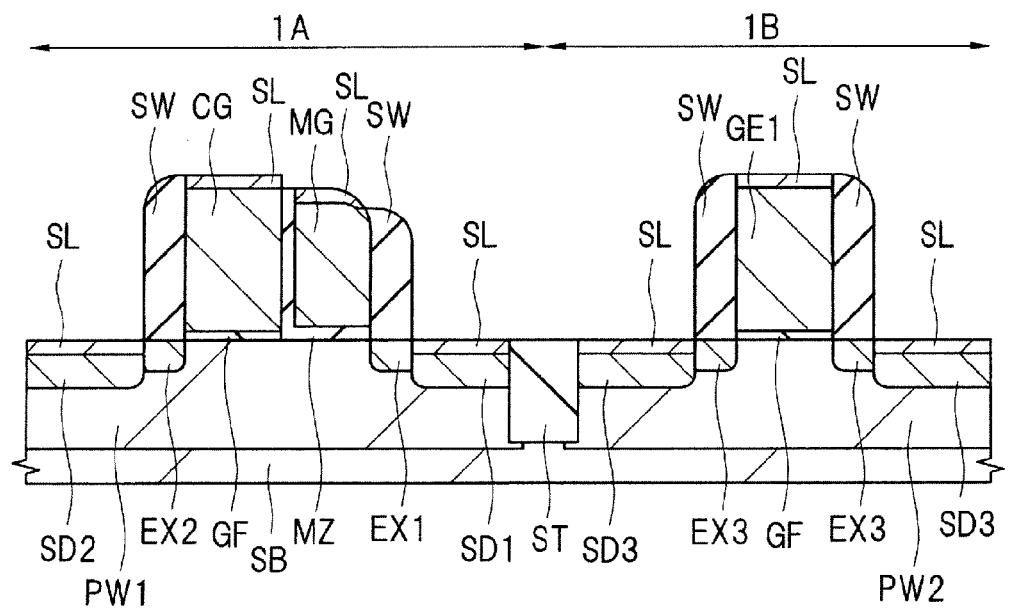
FIG. 18 is a fragmentary cross-sectional view of the semiconductor device during a manufacturing step following that of FIG. 17.

First, as shown in FIG. 17, a metal film MM for the formation of the metal silicide layer SL is formed (deposited) on the entire main surface of the semiconductor substrate SB including the upper surface (surface) of the n⁺ type semiconductor regions SD1, SD2, and SD3 so as to cover the control gate electrode CG, the memory gate electrode MG, the gate electrode GE1, and the sidewall spacer SW. As this metal film MM, a single metal film (pure metal film) or alloy film can be used and the metal film is made of, for example, a cobalt (Co) film, a nickel (Ni) film, or a nickel platinum alloy film. It can be formed by sputtering or the like. The resulting semiconductor substrate SB is subjected to heat treatment (heat treatment for the formation of the metal silicide layer SL) to react the upper layer portion (surface layer portion) of each of the n⁺ type semiconductor regions SD1, SD2, and SD3, the control gate electrode CG, the memory gate electrode MG, and the gate electrode GE1 with the metal film MM for the formation of the metal silicide layer SL. As a result, as shown in FIG. 18, a metal silicide layer SL is formed on the upper portion (upper surface, surface, or upper layer portion) of each of the n⁺ type semiconductor regions SD1, SD2, and SD3, the control gate electrode CG, the memory gate electrode MG, and the gate electrode GE1. Then, an unreacted portion of the metal film MM is removed by wet etching or the like. FIG. 18 shows a cross-sectional view after removal. After removal of the unreacted portion of the metal film MM, heat treatment may be performed again. When the metal film MM is a cobalt film, the metal silicide layer SL is composed of a cobalt silicide layer; when the metal film MM is a nickel film, the metal silicide layer SL is composed of a nickel silicide layer; and when the metal film MM is a nickel platinum alloy film, the metal silicide layer SL is composed of a platinum-added nickel silicide layer.

Thus, a so-called silicide process is performed to form the metal silicide layer SL on the upper portion of the n⁺ type semiconductor regions SD1, SD2, and SD3. By this metal silicide layer, the resistance of the source or drain can be reduced. Using the salicide process makes it possible to form the metal silicide layer SL on each of the n⁺ type semiconductor regions SD1, SD2, and SD3 in self alignment.

FIG. 18 shows the metal silicide layer SL formed, in Step S17, not only on the upper portion of each of the n⁺ type semiconductor regions SD1, SD2, and SD3 but also on the upper portion (upper surface, surface, or upper layer portion) of each of the control gate electrode CG, the memory gate electrode MG, and the gate electrode GE1. Since not only the upper surface (surface) of the n⁺ type semiconductor regions SD1, SD2, and SD3 but also the upper surface (surface) of each of the gate electrodes CG, MG, and GE1 is exposed, the metal film MM thus formed reacts with the upper layer portion (surface layer portion) of each of the gate electrodes CG, MG, and GE1 by the above heat treatment to form a metal silicide layer SL on the upper portion of each of the gate electrodes CG, MG, and GE1. The metal silicide layer SL on the control gate electrode CG can be regarded as a portion of the control gate electrode CG. The metal silicide layer SL on the memory gate electrode MG can be regarded as a portion of the memory gate electrode MG. The metal silicide layer SL on the gate electrode GE1 can be regarded as a portion of the gate electrode GE1.

In the present embodiment, however, even if the metal silicide layer SL is formed on the upper portion of each of the gate electrodes CG, MG, and GE1 in Step S17, the metal silicide layer SL on the upper portion of each of the gate electrodes CG, MG, and GE1 is inevitably removed in the polishing step of Step S19 described later. In the present embodiment, therefore, the formation of the metal silicide layer SL on the upper portion of each of the gate electrodes CG, MG, and GE1 is not always necessary.

Figure 19:
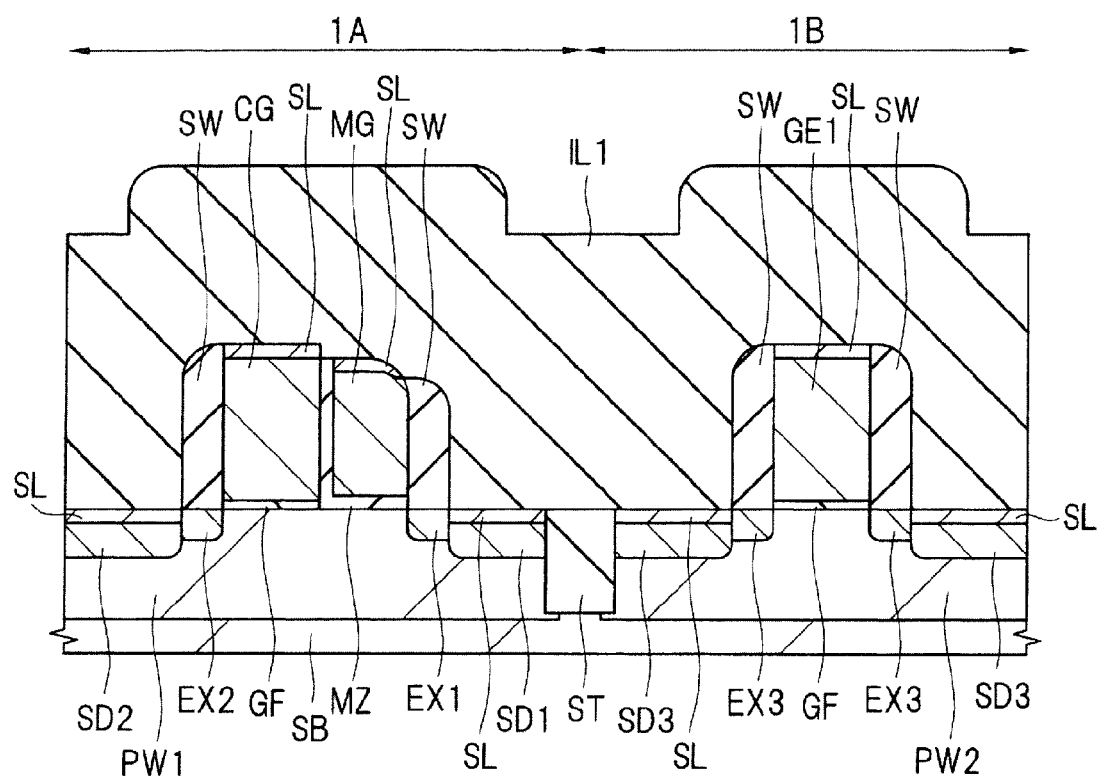
FIG. 19 is a fragmentary cross-sectional view of the semiconductor device during a manufacturing step following that of FIG. 18.

Next, as shown in FIG. 19, an insulating film (interlayer insulating film) IL1 is formed (deposited) as an interlayer insulating film on the entire main surface of the semiconductor substrate SB so as to cover the control gate electrode CG, the memory gate electrode MG, the gate electrode GE1, and the sidewall spacer SW (Step S18 of FIG. 2).

The insulating film IL1 is made of a single silicon oxide film or a stacked film of a silicon nitride film and a silicon oxide film formed on the silicon nitride film and thicker than the silicon nitride film. It can be formed, for example, by CVD.

Next, the upper surface of the insulating film IL1 is polished using CMP (chemical mechanical polishing) or the like (Step S19 of FIG. 2).

Figure 20:
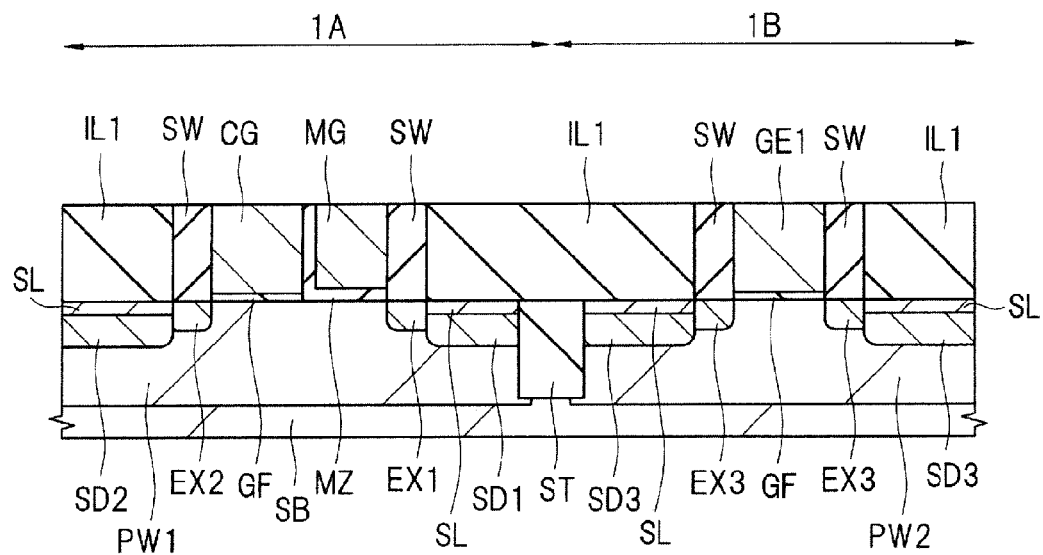
FIG. 20 is a fragmentary cross-sectional view of the semiconductor device during a manufacturing step following that of FIG. 19.
Figure 21:
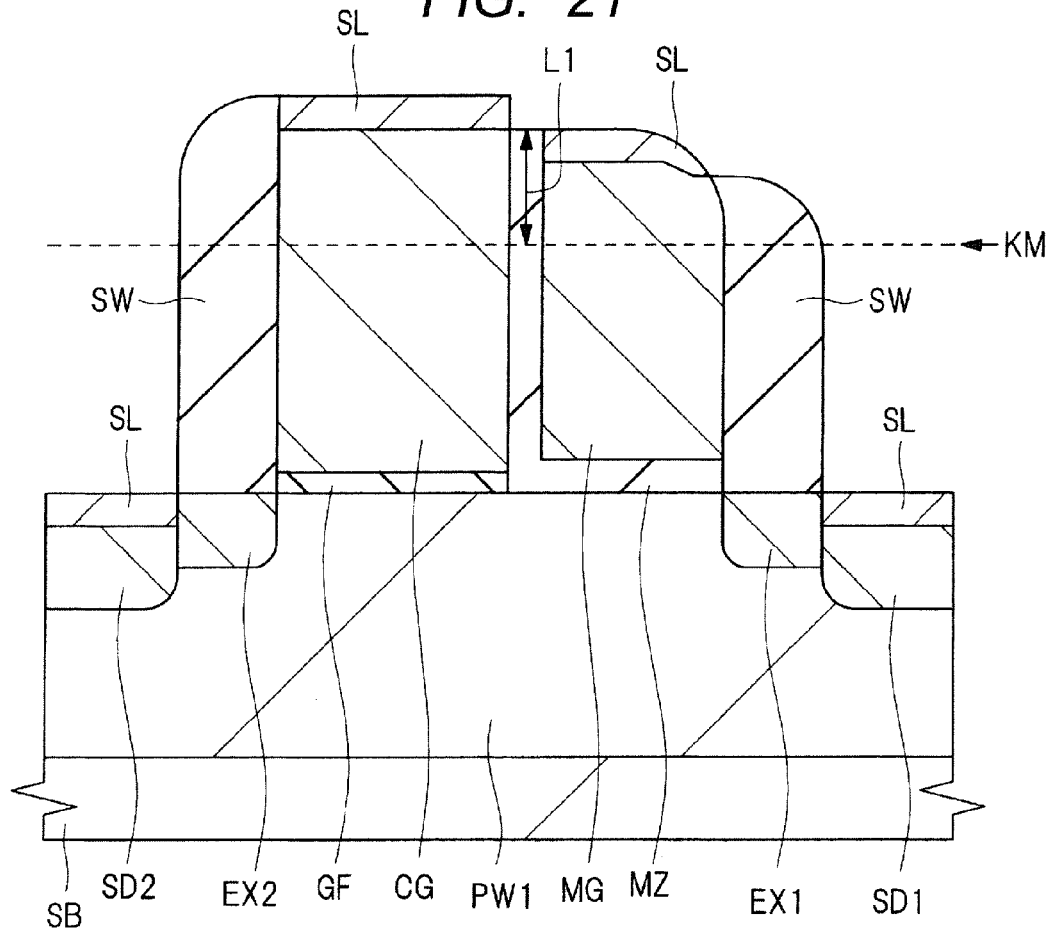
FIG. 21 is an explanatory view of the polishing step of Step S19.

By the polishing step of Step S19, the upper surface of each of the control gate electrode CG, the memory gate electrode MG, and the gate electrode GE1 is exposed as shown in FIG. 20.

What is important in the polishing step of Step S19 is removal of the upper portion of the insulating film MZ formed between the control gate electrode CG and the memory gate electrode MG and a removal length (polishing length) L1 of the insulating film MZ is made larger than the depth D1 of the n⁺ type semiconductor regions SD1 and SD2 formed in Step S15 (L1>D1). FIG. 21 is an explanatory view of the polishing step of Step S19 and it is an enlarged cross-sectional view of a portion of the memory cell region 1A immediately before the polishing step of Step S19. To facilitate understanding of the drawing, the insulating film IL1 is not illustrated in FIG. 21.

In the polishing step of Step S19, polishing is performed up to a position shown by a dotted line in FIG. 21. In FIG. 21, the position of a polished face (polished surface, polished position) KM after completion of the polishing step of Step S19 is shown by a dotted line.

Described specifically, in the polishing step of Step S19, when the insulating film IL1 is polished, the polished surface reaches the insulating film MZ present between the control gate electrode CG and the memory gate electrode MG and the insulating film MZ is exposed from the polished face. Polishing is continued further to remove a predetermined length of an upper portion of the insulating film MZ present between the control gate electrode CG and the memory gate electrode MG. At this time, the upper portion of each of the control gate electrode CG and the memory gate electrode MG sandwiching therebetween the insulating film MZ is polished and removed together with the insulating film MZ. This means that in FIG. 21, portions of the control gate electrode CG, the memory gate electrode MG, the insulating film MZ, the sidewall spacer SW, and the insulating film IL1 located above the polished surface KM are polished and removed in Step S19 (the insulating film IL1 is however not illustrated in FIG. 21).

In the present embodiment, in the polishing step of Step S19, the removal length (polishing length) L1 of the insulating film MZ formed between the control gate electrode CG and the memory gate electrode MG is set at larger than the depth D1 of the n+ type semiconductor regions SD1 and SD2 formed in Step S15 (L1>D1). The depth D1 of the n+ type semiconductor regions SD1 and SD2 formed in Step S15 is shown above in FIG. 16 and it corresponds to the depth (dimension in a direction substantially perpendicular to the main surface of the semiconductor substrate SB) from the surface (upper surface) of the semiconductor substrate SB to the bottom surface of the n+ type semiconductor regions SD1 and SD2 when the n+ type semiconductor regions SD1 and SD2 are formed using ion implantation in Step S15. Further, the removal length (polishing length) L1 of the insulating film MZ in the polishing step of Step S19 is shown in FIG. 21, and it corresponds to the dimension (dimension in a direction substantially perpendicular to the main surface of the semiconductor substrate SB) of a part removed in the polishing step of Step S19, of the insulating film MZ.

As one example, when the depth D1 of the n+ type semiconductor regions SD1 and SD2 formed in Step S15 is 50 nm, the removal length (polishing length) L1 of the insulating film MZ formed between the control gate electrode CG and the memory gate electrode MG in Step S19 is made larger than 50 nm.

Since the polishing length in the polishing step of Step S19 is set so as to satisfy L1>D1, the upper surface of each of the control gate electrode CG, the memory gate electrode MG, and the gate electrode GE1 is exposed as shown in FIG. 20 after completion of the polishing step of Step S19. When the metal silicide layer SL is formed on the upper portion of each of the control gate electrode CG, the memory gate electrode MG, and the gate electrode GE1 in Step S17, the metal silicide layer SL on the upper portion of each of the control gate electrode CG, the memory gate electrode MG, and the gate electrode GE1 can also be removed in the polishing step of Step S19.

Just after the insulating film IL1 is formed in Step S18, the upper surface of the insulating film IL1 may have unevenness or a level difference due to the control gate electrode CG, the memory gate electrode MG, the gate electrode GE1, and the sidewall spacer SW, but after the polishing step of Step S19, the insulating film IL1 has a planarized upper surface as shown in FIG. 20.

As another mode, the polishing step of Step S19 can be carried out by using polishing treatment such as CMP in combination with dry etching or wet etching.

Next, the gate electrode GE1 is removed by etching (Step S20 of FIG. 3).

Figure 22:
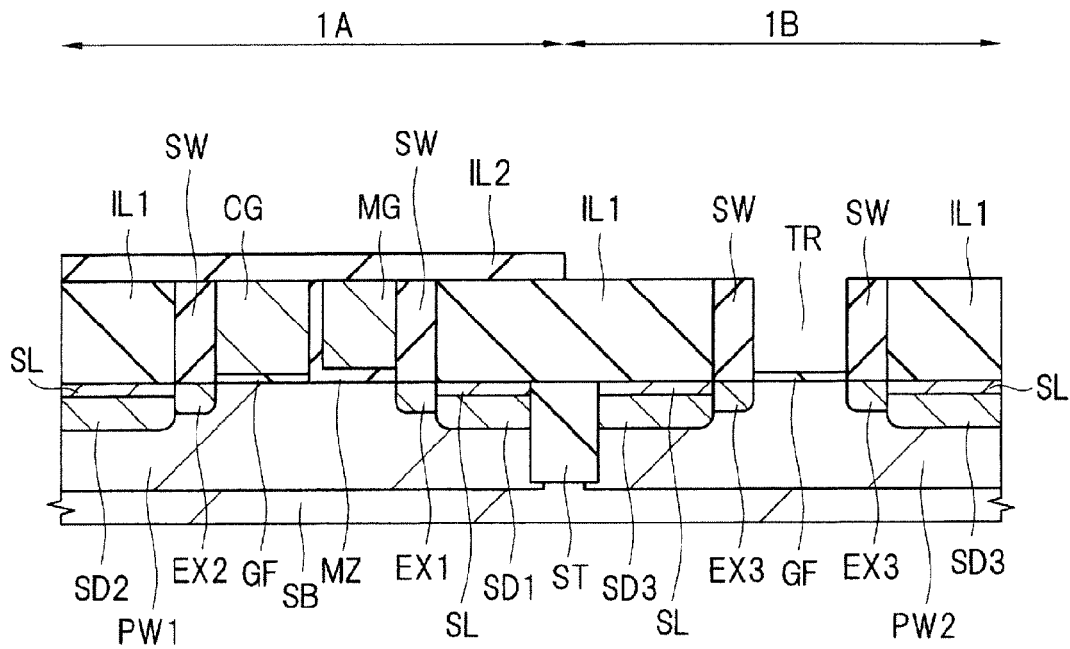
FIG. 22 is a fragmentary cross-sectional view of the semiconductor device during a manufacturing step following that of FIG. 20.

Step S20 is performed, for example, in the following manner. First, as shown in FIG. 22, an insulating film (mask layer) IL2 that covers the control gate electrode CG and the memory gate electrode MG and does not cover but exposes the gate electrode GE1 is formed on the insulating film IL1. The insulating film IL2 can be formed, for example, by forming an insulating film (insulating film for the formation of the insulating film IL2) on the semiconductor substrate SB, that is, on the insulating film IL1 so as to cover the control gate electrode CG, the memory gate electrode MG, and the gate electrode GE1 and then patterning this insulating film by photolithography and etching. The control electrode CG, the memory gate electrode MG, and the gate electrode GE1 are exposed by the polishing step of Step S19. After the formation of the insulating film IL2, however, the upper surface of the gate electrode GE1 is exposed without being covered by the insulating film IL2 and the control gate electrode CG and the memory gate electrode MG are covered by the insulating film IL2 so that they are not exposed. Also the insulating film MZ present between the control gate electrode CG and the memory gate electrode MG is covered by the insulating film IL2 and is therefore not exposed. The insulating film IL2 is therefore regarded as a mask layer covering the control gate electrode CG, the memory gate electrode MG, and the insulating film MZ present between the control gate electrode CG and the memory gate electrode MG and at the same time exposing the gate electrode GE1. Then, the gate electrode GE1 is removed by etching. FIG. 22 shows the stage after removal of this gate electrode. As the etching of Step S20, dry etching or wet etching, or a combination of them can be used.

The etching or etching step in Step S20 does not mean etching for the formation (patterning) of the insulating film IL2 but etching for selective removal of the gate electrode GE1 after formation of the insulating film IL2 as a mask layer.

By removing the gate electrode GE1 in Step S20, a trench (recess, dent) TR is formed. The trench TR is a region from which the gate electrode GE1 has been removed and it corresponds to a region where the gate electrode GE1 is present until removal of the gate electrode GE1. The bottom surface of the trench TR is formed from the upper surface of the insulating film GF and the side wall (side surface) of the trench TR is formed from the side surface of the sidewall spacer SW (side wall contiguous to the gate electrode GE1 until removal of the gate electrode GE1).

The etching step of the gate electrode GE1 in Step S20 is performed preferably under conditions under which the insulating film IL1, the insulating film IL2, the insulating film GF, and the sidewall spacer SW are more resistant to etching than the gate electrode GE1. This means that the gate electrode GE1 is etched under conditions under which the etching rate of the insulating film IL1, the insulating film IL2, the insulating film GF, and the sidewall spacer SW becomes smaller than that of the gate electrode GE1. This enables selective etching of the gate electrode GE1 in the etching step of the gate electrode GE1 in Step S20. Since the gate electrode GE1 is made of silicon (polysilicon), a high etch selectivity of the gate electrode GE1 can be secured easily in Step S20. As a result, in Step S20, selective removal of the gate electrode GE1 can be achieved easily and appropriately.

In the etching step of the gate electrode GE1 in Step S20, the control gate electrode CG, the memory gate electrode MG, and the insulating film MZ present between the control gate electrode CG and the memory gate electrode MG have been covered with the insulating film IL2 and have not been exposed so that they remain without being etched. In Step S20, therefore, the gate electrode GE1 is removed by etching, while the control gate electrode CG, the memory gate electrode MG, and the insulating film MZ between them remain as are without being etched.

The insulating film IL2 is preferably made of an insulating material different from that of the insulating film IL1 and such an insulating film IL2 is likely to have a desired planar shape. For example, when the insulating film IL1 is made of a silicon oxide film, the insulating film IL2 can be made of a silicon nitride film.

Figure 23:
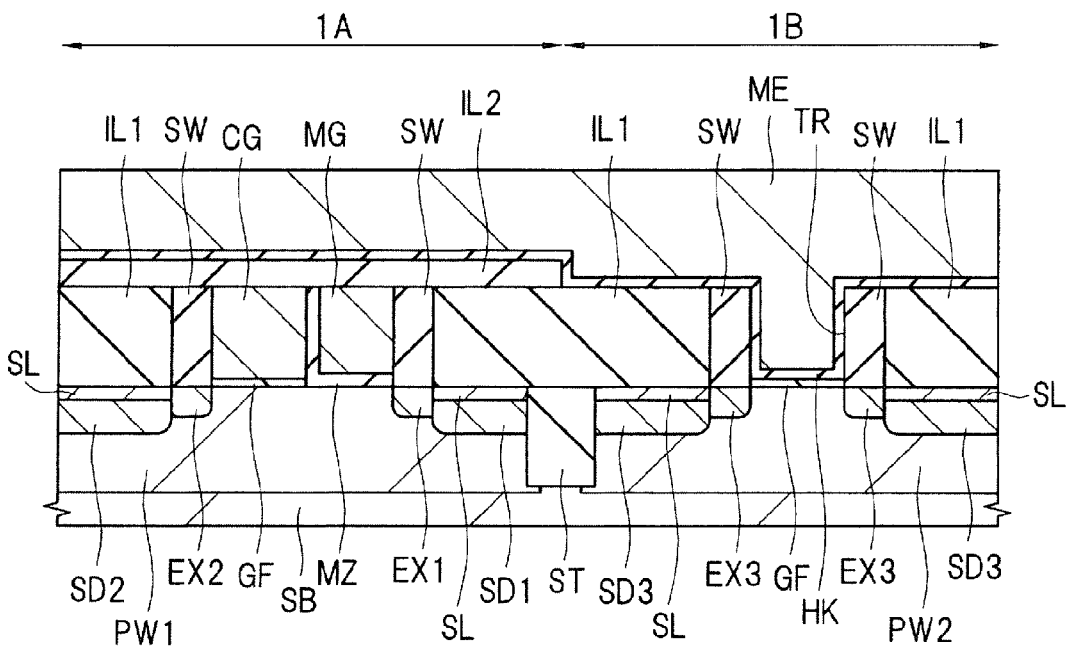
FIG. 23 is a fragmentary cross-sectional view of the semiconductor device during a manufacturing step following that of FIG. 22.

Next, as shown in FIG. 23, an insulating film HK is formed on the semiconductor substrate SB, that is, on the insulating films IL1 and IL2 and also on the inner surfaces (bottom surface and side wall) of the trench TR (Step S21 of FIG. 3). Then, a metal film (conductive film) ME as a conductive film for gate electrode is formed on the semiconductor substrate SB, that is, on the insulating film HK so as to fill the trench TR (Step S22 of FIG. 3).

In the trench TR, the insulating film HK is formed on the bottom surface and side wall (side surface) of the trench TR in Step S21. The trench TR is not completely filled with the insulating film HK. By forming a metal film ME in Step S22, the trench TR is completely filled with the insulating film HK and the metal film ME.

The insulating film HK is an insulating film for the gate insulating film of a MISFET formed in the peripheral circuit region 1B and the metal film ME is a conductive film for the gate electrode of a MISFET formed in the peripheral circuit region 1B.

The insulating film HK is an insulating material film having a dielectric constant (specific dielectric constant) higher than that of silicon nitride. It is a so-called high-k film (high dielectric constant film). The term "high-k film", "high dielectric constant film", "high dielectric constant insulating film", or "high dielectric constant gate insulating film" means a film having a dielectric constant (specific dielectric constant) higher than that of silicon nitride.

As the insulating film HK, a metal oxide film such as hafnium oxide film, zirconium oxide film, aluminum oxide film, tantalum oxide film, or lanthanum oxide film can be used. These oxide films may contain one or both of nitrogen (N) and silicon (Si). The insulating film HK can be formed, for example, by ALD (atomic layer deposition) or CVD. Using a high dielectric constant film (here, the insulating film HK) for a gate insulating film is advantageous because a gate insulating film using such a high dielectric constant film can have a larger physical thickness than a gate insulating film using a silicon oxide film and therefore can reduce leakage current.

Examples of the metal film ME include titanium nitride (TiN) film, tantalum nitride (TaN) film, tungsten nitride (WN) film, titanium carbide (TiC) film, tantalum carbide (TaC) film, tungsten carbide (WC) film, tantalum carbonitride (TaCN) film, titanium (Ti) film, tantalum (Ta) film, titanium aluminum (TiAl) film, and aluminum (Al) film. The term "metal film" as used herein means a conductive film exhibiting metal conductivity. It is not only a single metal film (pure metal film) or alloy film but also a metal compound film (metal nitride film, metal carbide film or the like) exhibiting metal conductivity. The metal film ME is a conductive film exhibiting metal conductivity and it is not limited to a single metal film (pure metal film) or alloy film but may be a metal compound film (metal nitride film, metal carbide film, or the like) exhibiting metal conductivity. The metal film ME may be a stacked film (stacked film of a plurality of films) and in this case, the lowermost layer of the stacked film is limited to a metal film (conductive film exhibiting metal conductivity). The stacked film may be a stacked film of a plurality of metal films (conductive films exhibiting metal conductivity). The metal film ME can be formed, for example, by sputtering.

As a preferred example of the metal film ME, the metal film ME can be provided as a stacked film of a titanium nitride (TiN) film and an aluminum (Al) film on the titanium nitride film. In this case, in Step S22, formation of a titanium nitride film on the insulating film HK is followed by formation of an aluminum film on the titanium nitride film so as to fill the trench TR. The aluminum film is preferably thicker than the titanium nitride film. Since the aluminum film has low resistance, a gate electrode GE2 which will be formed later can have reduced resistance. In addition, by the work function of a material of a portion (here, the titanium nitride film) contiguous to the gate insulating film in a gate electrode GE2 formed later, the threshold voltage of each MISFET equipped with the gate electrode GE2 can be controlled.

Figure 24:
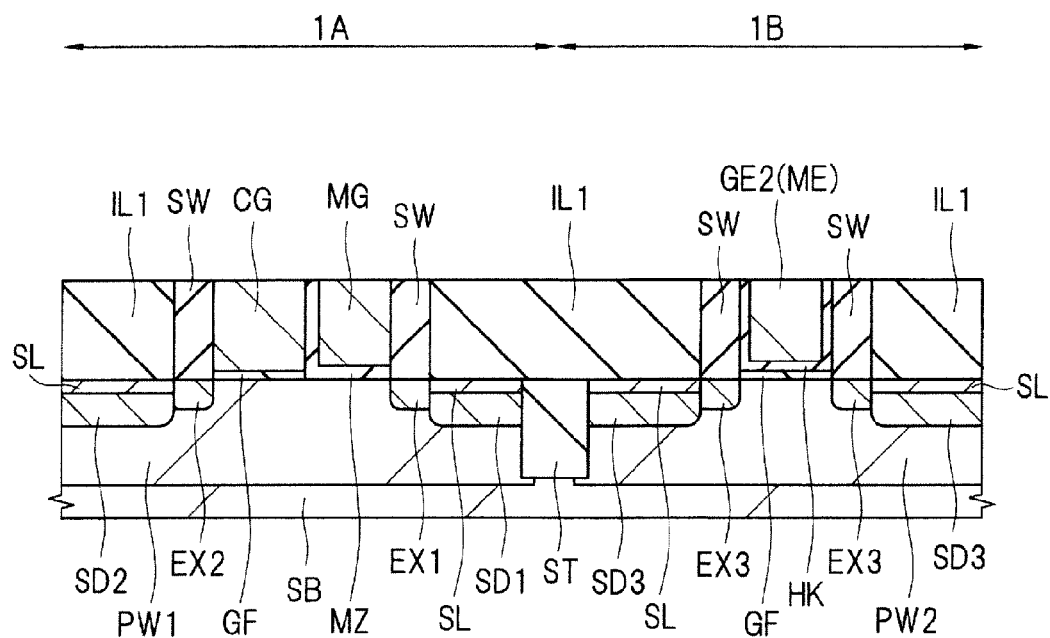
FIG. 24 is a fragmentary cross-sectional view of the semiconductor device during a manufacturing step following that of FIG. 23.

Next, as shown in FIG. 24, an unnecessary portion of the metal film ME and the insulating film HK outside the trench TR is removed by polishing treatment such as CMP to fill the trench TR with the insulating film HK and the metal film ME (Step S23 of FIG. 3).

In Step S23, the metal film ME and the insulating film HK outside the trench TR are removed to leave the insulating film HK and the metal film ME in the trench TR. As a result, the insulating film HK and the metal film ME are left in the trench TR to fill it. This means that the trench TR is filled with the metal film ME via the insulating film HK.

The metal film ME that has filled the trench TR becomes a gate electrode GE2 of a MISFET and the insulating film HK that has filled the trench TR functions as a gate insulating film of the MISFET. This means that by filling the trench TR with the metal film ME via the insulating film HK, the gate electrode GE2 is formed.

Thus, in the trench TR which is a region from which the gate electrode GE1, that is, a dummy gate electrode, has been removed in Step S20, the gate electrode GE2 is formed via the insulating film HK, that is, a high dielectric constant insulating film in Steps S21, S22, and S23. The gate electrode GE2 is a gate electrode for a MISFET of a peripheral circuit (that is, for a MISFET not for the memory cell). The gate electrode GE2 is a metal gate electrode.

In the present embodiment, the gate electrode GE1 is removed and replaced by the gate electrode GE2 and this gate electrode GE2 is used as a gate electrode of a MISFET of the peripheral circuit region 1B. The gate electrode GE1 is therefore a dummy gate electrode (pseudo gate electrode) and can be regarded as a replacement gate electrode or a gate electrode for substitution, while the gate electrode GE2 can be regarded as a gate electrode configuring a MISFET.

In the present embodiment, the gate electrode GE2 is made of the metal film ME so that the gate electrode GE2 can be regarded as a metal gate electrode. The gate electrode GE2 formed as a metal gate electrode is advantageous because it can suppress a depletion phenomenon of the gate electrode GE2 and thereby eliminate parasitic capacitance. It is also advantageous because it can downsize a transistor element (decrease the thickness of the gate insulating film).

In the peripheral circuit region 1B, the insulating film HK is formed on the bottom surface and side wall of the trench TR and the gate electrode GE2 is, at the bottom surface and side wall (side surface) thereof, contiguous to the insulating film HK. The gate electrode GE2 and the semiconductor substrate SB (p well PW2) have therebetween the insulating film GF and the insulating film HK, while the gate electrode GE2 and the sidewall spacer SW have therebetween the insulating film HK. The insulating films GF and HK immediately below the gate electrode GE2 function as a gate insulating film of a MISFET and the insulating film HK having a high dielectric constant functions as a high dielectric constant gate insulating film.

In Step S23, the insulating film IL2 can be polished and removed. When Step S23 is performed, therefore, the upper surface of each of the control gate electrode CG and the memory gate electrode MG is exposed.

In the above description on the present embodiment, the gate electrode GE1 is removed by etching in Step S20 and then the insulating film HK is formed in Step S21 without removing the insulating film GF from the bottom portion of the trench TR. In this case, in the peripheral circuit region 1B, the insulating film HK and the semiconductor substrate SB (p well PW2) have therebetween (at the interface therebetween) the insulating film GF as an interface layer.

As another mode, after removal of the gate electrode GE1 by etching in Step S20 and before formation of the insulating film HK in Step S21, the insulating film GF may be removed from the bottom portion of the trench TR. In this case, it is more preferred to remove the insulting film GF from the trench TR, form an interface layer made of a silicon oxide film or a silicon oxynitride film on the surface of the semiconductor substrate SB (p well PW2) exposed at the bottom portion of the trench TR, and then form the insulating film HK in Step S21. Then, the insulating film HK and the semiconductor substrate SB (p well PW2) have therebetween (at the interface therebetween) an interface layer made of a silicon oxide film or a silicon oxynitride film.

By providing an interface layer made of a thin silicon oxide film or silicon oxynitride film at the interface between the insulating film HK and the semiconductor substrate SB (the p well PW2) without forming the insulating film HK which is a high dielectric constant film directly on the surface (silicon surface) of the semiconductor substrate SB, the number of defects such as trap level can be reduced, which leads to improvement in drive capability or reliability.

In the present embodiment, the high dielectric constant gate insulating film (here, the insulating film HK) is formed after removal of the gate electrode GE1 by etching in Step S20.

As another mode, a high dielectric constant gate insulating film for a metal gate type MISFET to be formed in the peripheral circuit region 1B is formed prior to the formation of the gate electrode GE1. In this case, after removal of the gate electrode GE1 by etching in Step S20, the metal film ME formation step of Step S22 can be performed without performing the insulating film HK formation step in Step S21. For example, a high dielectric constant film (high dielectric constant insulating film) corresponding to the insulating film HK is formed on the insulating film GF in the peripheral circuit region 1B and then, the silicon film PS1 is formed. More specifically, after formation of the insulating film GF in Step S4, a high dielectric constant film corresponding to the insulating film HK is formed on the entire main surface of the semiconductor substrate SB. Then, the high dielectric constant film is removed selectively from the memory cell region 1A while leaving the high dielectric constant film in the peripheral circuit region 1B. The silicon film PS1 may then be formed. When the gate electrode GE1 is formed, the gate electrode GE1 has therebelow the high dielectric constant gate insulating film. In this case, since the high dielectric constant gate insulating film has already been formed, it is only necessary to perform, after removal of the gate electrode GE1 by etching in Step S20, the metal film ME formation step in Step S22 without performing the insulating film HK formation step in Step S21.

Figure 25:
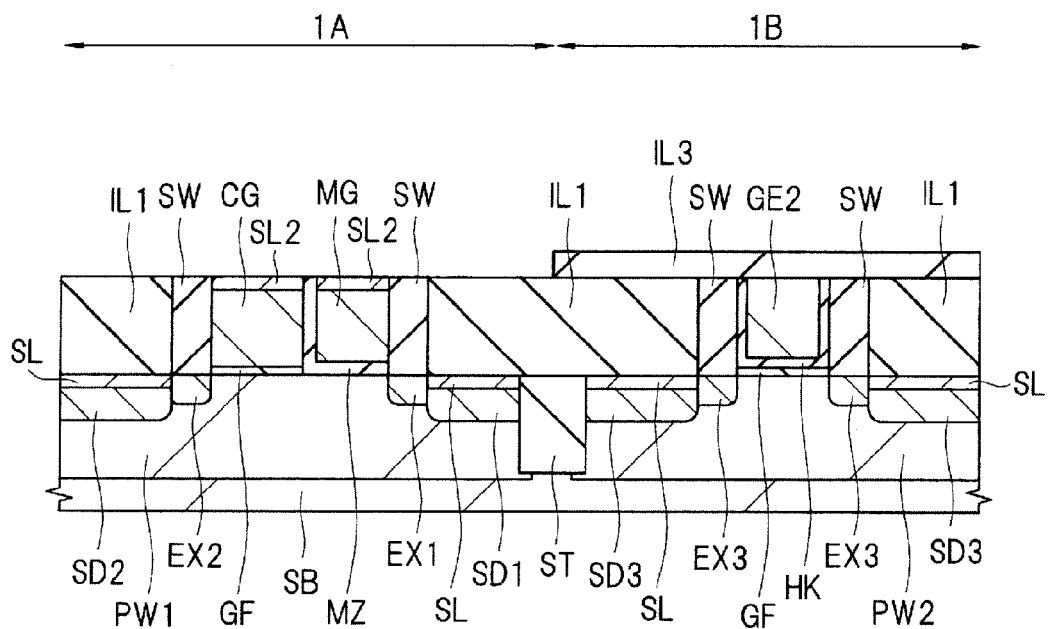
FIG. 25 is a fragmentary cross-sectional view of the semiconductor device during a manufacturing step following that of FIG. 24.

Next, as shown in FIG. 25, an insulating film (mask layer) IL3 that covers the entirety of the peripheral circuit region 1B and exposes the control gate electrode CG and the memory gate electrode MG in the memory cell region 1A is formed on the insulating film IL1. The insulating film IL3 can be formed, for example, by forming an insulating film (insulating film for the formation of the insulating film IL3) on the insulating film IL1 so as to cover the entirety of the memory cell region 1A and the entirety of the peripheral circuit region 1B and then patterning the resulting insulating film by photolithography and etching. When the insulating film IL3 is formed, the upper surface of each of the control gate electrode CG and the memory gate electrode MG is exposed without being covered with the insulating film IL3 and the gate electrode GE2 is covered with the insulating film IL3 and is therefore not exposed.

The insulating film IL3 is formed from preferably an insulating material different from that of the insulating film IL1. This facilitates formation of the insulating film IL3 having a desired planar shape. For example, when the insulating film IL1 is formed from a silicon oxide film, the insulating film IL3 can be formed from a silicon nitride film.

Next, a metal silicide layer SL2 is formed on the upper portion of each of the control gate electrode CG and the memory gate electrode MG (Step S24 of FIG. 3).

The metal silicide layer SL2 can be formed by a so-called salicide process. More specifically, the metal silicide layer SL2 can be formed in the following manner.

First, a metal film for the formation of the metal silicide layer SL2 is formed (deposited) on the insulating films IL1 and IL3 including the upper surface (surface) of the control gate electrode CG and the memory gate electrode MG. As the metal film for the formation of the metal silicide layer SL2, a single metal film (pure metal film) or an alloy film can be used. It may be made of, for example, a cobalt (Co) film, a nickel (Ni) film, or a nickel platinum alloy film and can be formed by sputtering or the like. Then, the semiconductor substrate SB is subjected to heat treatment (heat treatment for the formation of the metal silicide layer SL2) to react an upper layer portion (surface layer portion) of each of the control gate electrode CG and the memory gate electrode MG with the metal film for the formation of the metal silicide layer SL2. As a result, as shown in FIG. 25, the metal silicide layer SL2 is formed on the upper portion (upper surface, surface, or upper layer portion) of each of the control gate electrode CG and the memory gate electrode MG. Then, an unreacted portion of the metal film (metal film for the formation of the metal silicide layer SL2) is removed by wet etching or the like. FIG. 25 is a cross-sectional view after removal of the unreacted portion. After removal of the unreacted portion of the metal film (metal film for the formation of the metal silicide layer SL2), heat treatment may be performed again.

As the metal silicide layer SL2, for example, a cobalt silicide layer (when the metal film for the formation of the metal silicide layer SL2 is a cobalt film), a nickel silicide layer (when the metal film for the formation of the metal silicide layer SL2 is a nickel film), or a nickel platinum silicide layer (when the metal film for the formation of the metal silicide layer SL2 is a nickel platinum alloy film) may be used.

Thus, by a so-called salicide process, the metal silicide layer SL2 is formed on the upper portion of each of the control gate electrode CG and the memory gate electrode MG in self alignment. This makes it possible to reduce the resistance of the control gate electrode CG and the memory gate electrode MG.

The metal silicide layer SL2 is formed by a salicide process while covering the gate electrode GE2, which is a metal gate electrode, with the insulating film IL3. This makes it possible to appropriately prevent the gate electrode GE2, which is a metal gate electrode, from being affected by the salicide process.

In the above description on the present embodiment, the metal silicide layer SL2 is formed on the upper portion of each of the control gate electrode CG and the memory gate electrode MG. As another mode, the metal silicide layer SL2 is not formed on the upper portion of each of the control gate electrode CG and the memory gate electrode MG. When the metal silicide layer SL2 is not formed on each of the control gate electrode CG and the memory gate electrode MG, the insulating film IL3 formation step and the step of forming the metal silicide layer SL2 in Step S24 by a salicide process may be omitted.

Figure 26:
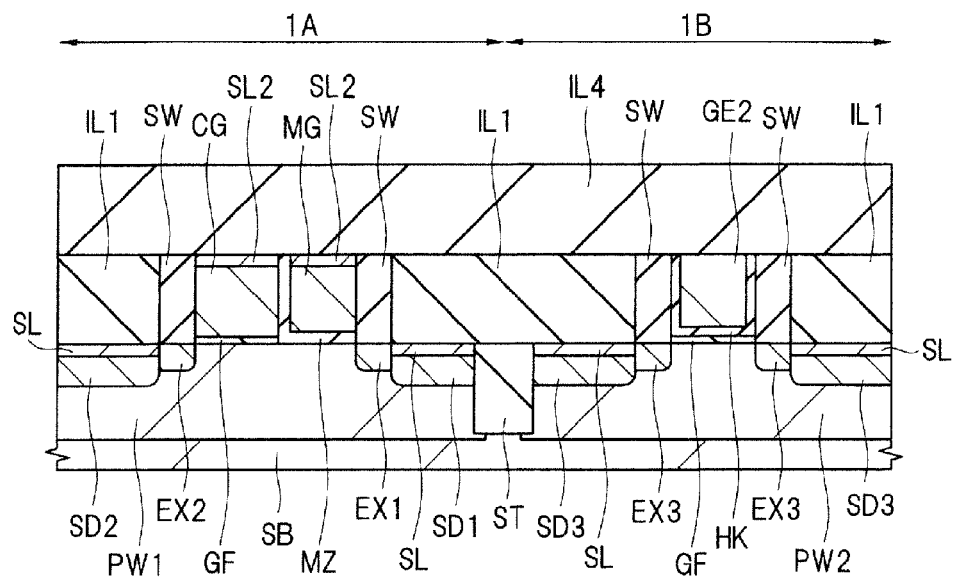
FIG. 26 is a fragmentary cross-sectional view of the semiconductor device during a manufacturing step following that of FIG. 25.

Next, as shown in FIG. 26, an insulating film (interlayer insulating film) IL4 is formed (deposited) as an interlayer insulating film on the entire main surface of the semiconductor substrate SB (Step S25 of FIG. 3).

In FIG. 26, after removal of the insulating film IL3 by etching or the like, the insulating film IL4 is formed. In this case, the insulating film IL4 is formed on the insulating film IL1 so as to cover the control gate electrode CG, the memory gate electrode MG, the gate electrode GE2, and the sidewall spacer SW. As another mode, the insulating film IL4 can be formed without removing the insulating film IL3. In this case, the insulating film IL4 is formed on the insulating film IL1 and the insulating film IL3 so as to cover the control gate electrode CG, the memory gate electrode MG, and the sidewall spacer SW.

As the insulating film IL4, for example, a silicon oxide-based insulating film composed mainly of silicon oxide can be used. After formation of the insulating film IL4, the upper surface of the insulating film IL4 may be polished by CMP or the like to enhance the flatness of the upper surface of the insulating film IL4.

Figure 27:
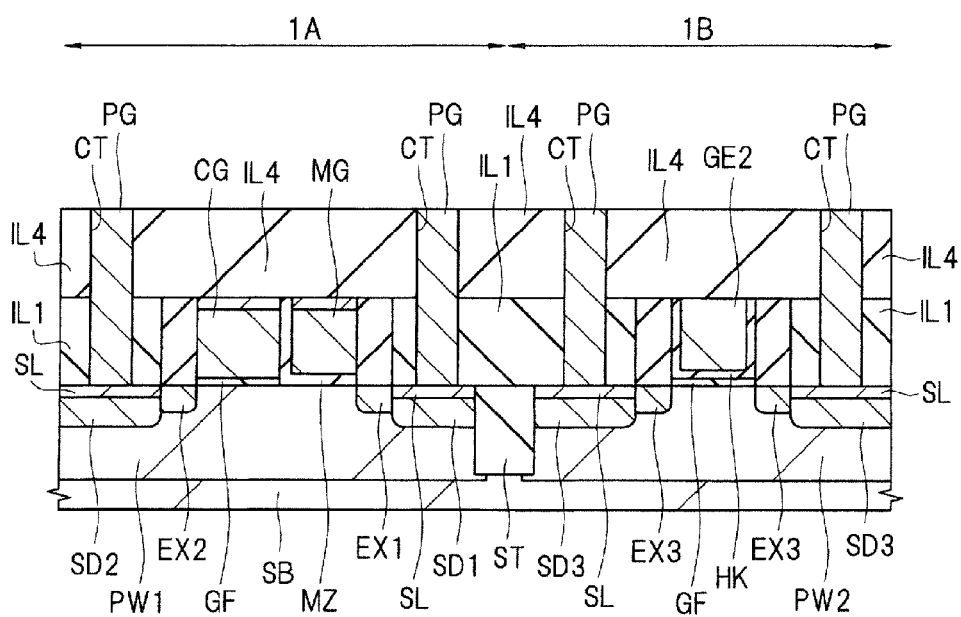
FIG. 27 is a fragmentary cross-sectional view of the semiconductor device during a manufacturing step following that of FIG. 26.

Next, the insulating films IL4 and IL1 are dry etched with a photoresist pattern (not illustrated), which has been formed on the insulating film IL4 by photolithography, as an etching mask to form a contact hole (opening portion or through-hole) CT in the insulating films IL4 and IL1 as shown in FIG. 27 (Step S26 of FIG. 3).

Next, a conductive plug PG made of tungsten (W) or the like is formed, as a coupling conductor portion, in the contact hole CT (Step S27 of FIG. 3).

The plug PG is formed, for example, by forming a barrier conductor film on the insulating film IL4 including the inside (on the bottom surface and the side wall) of the contact hole CT. The barrier conductor film is made of, for example, a titanium film, a titanium nitride film, or a stacked film of them. Then, a main conductor film made of a tungsten film or the like is formed on the barrier conductor film so as to fill the contact hole CT, followed by removal of an unnecessary portion of the main conductor film and the barrier conductor film outside the contact hole CT by CMP or etch back to form the plug PG. To simplify the drawing, FIG. 27 shows the barrier conductor film and the main conductor film (tungsten film) configuring the plug PG as one film.

The contact hole CT and the plug PG embedded therein are formed on the n$^+$ type semiconductor regions SD1, SD2, and SD3, the control gate electrode CG, the memory gate electrode MG, the gate electrode GE2, and the like. The cross-sectional view of FIG. 27 shows a cross-section of a portion (the metal silicide layer SL on the surface) of the n$^+$ type semiconductor regions SD1, SD2, and SD3 exposed from the bottom portion of the contact hole CT and electrically coupled to the plug PG embedded in the contact hole CT.

Next, a wiring (wiring layer) M1 which is a first-layer wiring is formed on the insulating film IL4 having therein the plug PG (Step S28 of FIG. 3). A description will next be made on the formation of this wiring M1 by using damascene technology (here, single damascene technology).

Figure 28:
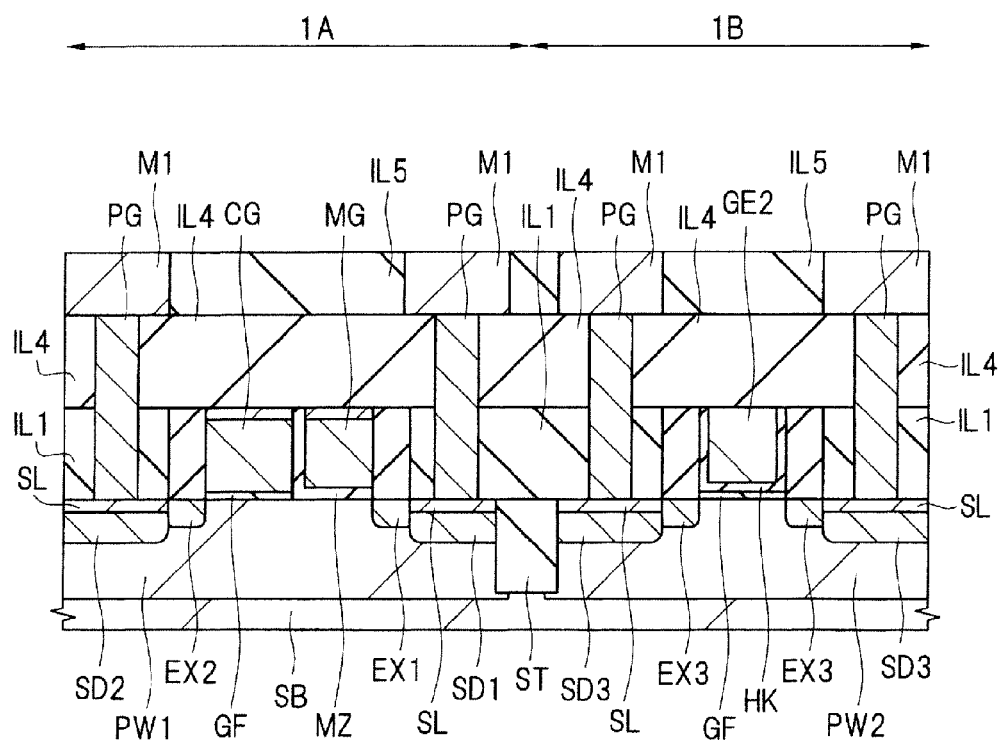
FIG. 28 is a fragmentary cross-sectional view of the semiconductor device during a manufacturing step following that of FIG. 27.

First, as shown in FIG. 28, an insulating film IL5 is formed on the insulating film IL4 having therein the plug PG. The insulating film IL5 may be a stacked film of a plurality of insulating films. By dry etching with a photoresist pattern (not illustrated) as an etching mask, a wiring trench (trench for wiring) is formed in a predetermined region of the insulating film IL5. Then, a barrier conductor film is formed on the insulating film IL5 including the bottom surface and the side wall of the wiring trench. This barrier conductor film is made of, for example, a titanium nitride film, a tantalum film, a tantalum nitride film, or the like. Then a copper seed layer is formed on the barrier conductor film by CVD, sputtering, or the like and then, a copper plating film is formed on the seed layer by electroplating or the like to fill the wiring trench with the copper plating film. Then, the main conductor film (copper plating film and seed layer) and the barrier conductor film in a region outside the wiring trench are removed by CMP to form a first-layer wiring M1 having copper buried in the wiring trench as a main conductive material. FIG. 28 shows, as one body, the barrier conductor film, the seed layer, and the copper plating film configuring the wiring M1 for simplify the drawing.

The wiring M1 is electrically coupled to the n$^+$ type semiconductor region SD1, the n$^+$ type semiconductor region SD2, the n$^+$ type semiconductor region SD3, the control gate electrode CG, the memory gate electrode MG, the gate electrode GE2, or the like via the plug PG. Then, second or upper-layer wirings are formed by a dual damascene technology or the like, but illustration and description on them are omitted here. The wiring M1 and upper wirings are not limited to a damascene wiring and they can be formed by patterning a wiring conductor film. For example, they may be a tungsten wiring or aluminum wiring.

The semiconductor device of the present embodiment is manufactured as described above.

<Structure of Semiconductor Device>

Next, the configuration of the memory cell of nonvolatile memory in the semiconductor device of the present embodiment will be described referring to FIGS. 29 and 30.

Figure 29:
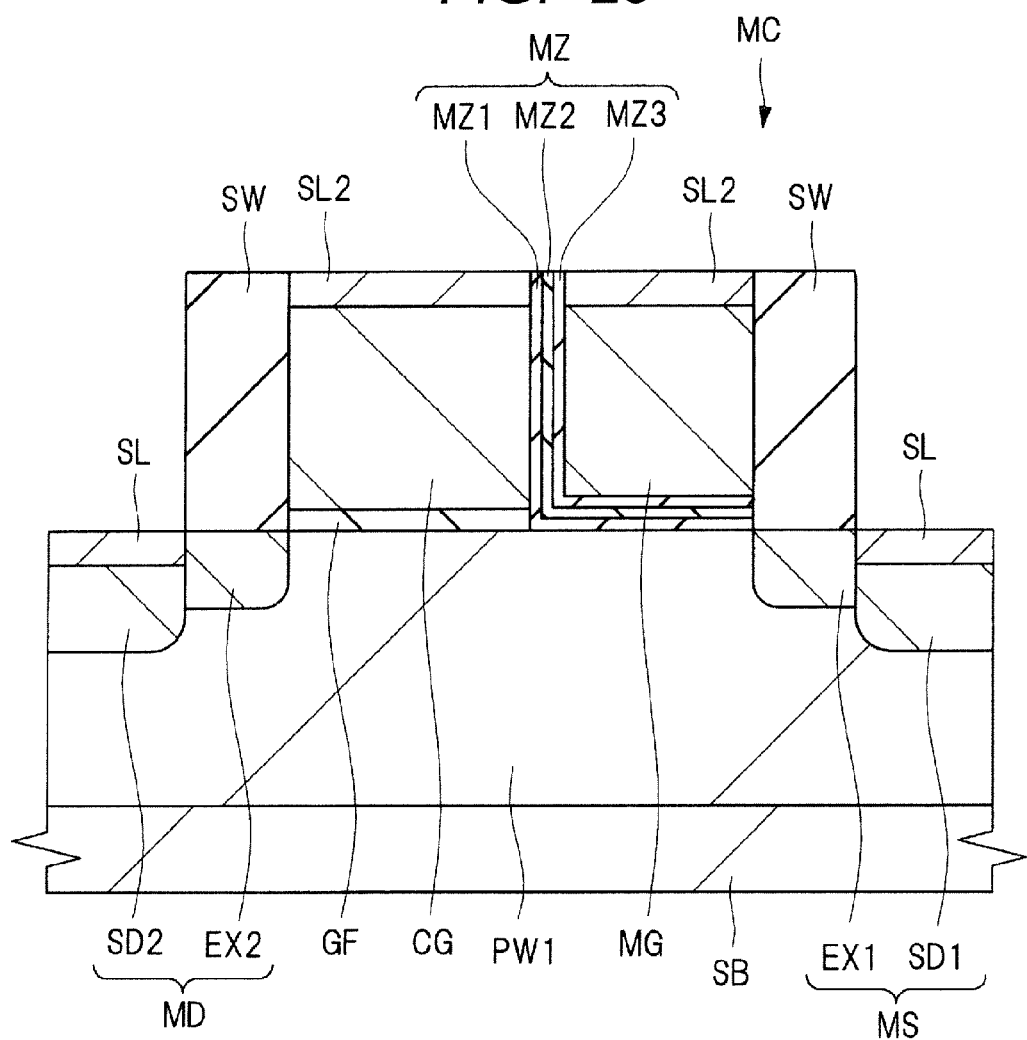
FIG. 29 is a fragmentary cross-sectional view of the semiconductor device of the one embodiment.

FIG. 29 is a fragmentary cross-sectional view of the semiconductor device of the present embodiment, in which a fragmentary cross-sectional view of a memory cell region of a nonvolatile memory is shown. FIG. 30 is an equivalent circuit diagram of the memory cell. To simplify the drawing, FIG. 29 omits the insulating films IL1, IL4, and IL5, the contact hole CT, the plug PG, and the wiring M1 from the structure shown in FIG. 28.

As shown in FIG. 29, the semiconductor substrate SB has thereon a memory cell MC of a nonvolatile memory comprised of a memory transistor and a control transistor. The actual semiconductor substrate has thereon a plurality of memory cells MC in array form. Each memory cell region is electrically isolated from another region by an element isolation region (which corresponds to the element isolation region ST but is not shown in FIG. 29).

Figure 30:
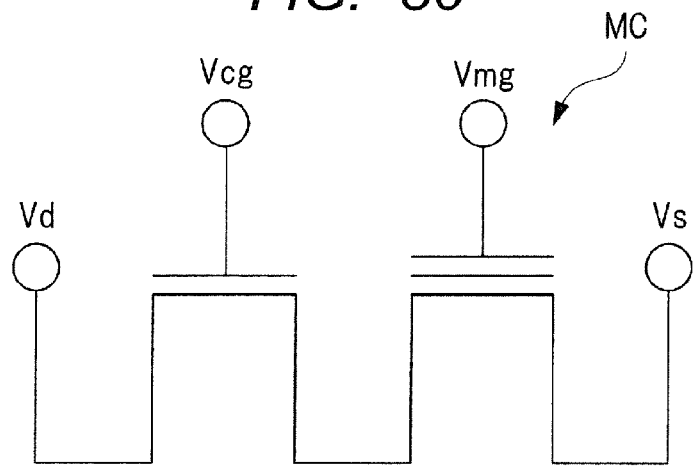
FIG. 30 is an equivalent circuit diagram of a memory cell.

As shown in FIGS. 29 and 30, the memory cell MC of a nonvolatile memory in the semiconductor device of the present embodiment is a split-gate type memory cell, in which two MISFETs, that is, a control transistor having the control gate electrode CG and a memory transistor having the memory gate electrode MG have been coupled to each other.

Here, an MISFET having a gate insulating film including a charge storage portion (charge storage layer) and the memory gate electrode MG is called "memory transistor", while an MISFET having a gate insulating film and the control gate electrode CG is called "control transistor". Therefore, the memory gate electrode MG is a gate electrode of the memory transistor and the control gate electrode CG is a gate electrode of the control transistor. The control gate electrode CG and the memory gate electrode MG are gate electrodes configuring the memory cell of a nonvolatile memory.

The control transistor is a memory cell select transistor so that it can be regarded as a select transistor. The control gate electrode CG can therefore be regarded as a select gate electrode. The memory transistor is a transistor for memory.

The configuration of the memory cell MC will next be described specifically.

As shown in FIG. 29, the memory cell MC of a nonvolatile memory has n type semiconductor regions MS and MD for source and drain formed in the p well PW1 of the semiconductor substrate SB, the control gate electrode CG formed on the semiconductor substrate SB (p well PW1), and the memory gate electrode MG formed on the semiconductor substrate SB (p well PW1) and adjacent to the control gate electrode CG. The memory cell MC of a nonvolatile memory further has the insulating film (gate insulating film) GF formed between the control gate electrode CG and the semiconductor substrate SB (the p well PW1) and the insulating film MZ formed between the memory gate electrode MG and the semiconductor substrate SB (p well PW1).

The control gate electrode CG and the memory gate electrode MG extend along the main surface of the semiconductor substrate SB and are arranged side by side, while having the insulating MZ between their side surfaces facing to each other. The control gate electrode CG and the memory gate electrode MG extend in a direction perpendicular to paper surface of FIG. 29 or FIGS. 10 to 28. The control gate electrode CG and the memory gate electrode MG are formed on the semiconductor substrate SB (p well PW1) between the semiconductor region MD and the semiconductor region MS via the insulating film GF or the insulating film MZ. The memory gate electrode MG is placed on the side of the semiconductor region MS and the control gate electrode CG is placed on the side of the semiconductor region MD. The control gate electrode CG and the memory gate electrode MG however lie on the semiconductor substrate SB via the insulating film GF and via the insulating film MZ, respectively.

The control gate electrode CG and the memory gate electrode MG are adjacent to each other with the insulating film MZ therebetween. The insulating film MZ extends in a region between the memory gate electrode MG and the semiconductor substrate SB (p well PW1) and in a region between the memory gate electrode MG and the control gate electrode CG.

The insulating film GF formed between the control gate electrode CG and the semiconductor substrate SB (p well PW1), that is, the insulating film GF under the control gate electrode CG functions as a gate insulating film of the control transistor. The insulating film MZ between the memory gate electrode MG and the semiconductor substrate SB (p well PW1), that is, the insulating film MZ under the memory gate electrode MG functions as a gate insulating film (gate insulating film having therein a charge storage portion) of the memory transistor. The insulating film MZ between the memory gate electrode MG and the semiconductor substrate SB (p well PW1) functions as a gate insulating film of the memory transistor but the insulating film MZ between the memory gate electrode MG and the control gate electrode CG functions as an insulating film for insulating (electrically isolating) between the memory gate electrode MG and the control gate electrode CG.

The silicon nitride film MZ2 of the insulating film MZ is an insulating film for storing charges and functions as a charge storage layer (charge storage portion). This means that the silicon nitride film MZ2 is a trap insulating film formed in the insulating film MZ. The insulating film MZ can therefore be regarded as an insulating film having therein a charge storage portion (here, the silicon nitride film MZ2).

The silicon oxide film MZ3 and the silicon oxide film MZ1 on and under the silicon nitride film MZ2, respectively, can function as a charge blocking layer or a charge confinement layer. In the insulating film MZ between the memory gate electrode MG and the semiconductor substrate SB, the silicon nitride film MZ2 is sandwiched between the silicon oxide film MZ3 and the silicon oxide film MZ1. Such a structure enables storage of charges in the silicon nitride film MZ2.

The semiconductor region MS and the semiconductor region MD are each a semiconductor region for source or drain. This means that the semiconductor region MS is a semiconductor region functioning as one of a source region or a drain region, while the semiconductor region MD is a semiconductor region functioning as the other one of a source region or a drain region. Here, the semiconductor region MS is a semiconductor region functioning as a source region and the semiconductor region MD is a semiconductor region functioning as a drain region. The semiconductor regions MS and MD are semiconductor regions doped with an n type impurity and they each have an LDD structure. This means that the semiconductor region MS for source has an $n^-$ type semiconductor region EX1 (extension region) and an $n^+$ type semiconductor region SD1 (source region) having an impurity concentration higher than that of the $n^-$ type semiconductor region EX1. The semiconductor region MD for drain has an $n^-$ type semiconductor region EX2 (extension region) and an $n^+$ type semiconductor region SD2 (drain region) having an impurity concentration higher than that of the $n^-$ type semiconductor region EX2.

The semiconductor region MS is a semiconductor region for source or drain and is formed in the semiconductor substrate SB at a position adjacent to the memory gate electrode MG in a gate length direction (gate length direction of the memory gate electrode MG). The semiconductor region MD is a semiconductor region for source or drain and is formed in the semiconductor substrate SB at a position adjacent to the control gate electrode CG in a gate length direction (gate length direction of the control gate electrode CG).

The memory gate electrode MG and the control gate electrode CG have, on the side walls thereof not adjacent to each other, the sidewall spacer SW made of an insulator (insulating film).

The $n^-$ type semiconductor region EX1 of the source portion is formed in self alignment with the memory gate electrode MG, while the $n^+$ type semiconductor region SD1 is formed in self alignment with the sidewall spacer SW on the side wall of the memory gate electrode MG. In the semiconductor device thus manufactured, the lightly doped $n^-$ type semiconductor region EX1 is formed below the sidewall spacer SW on the side wall of the memory gate electrode MG and the heavily doped $n^+$ type semiconductor region SD1 is formed outside the lightly doped $n^-$ type semiconductor region EX1. Therefore, the lightly doped $n^-$ type semiconductor region EX1 is adjacent to a channel region of the memory transistor and the heavily doped $n^+$ type semiconductor region SD1 is adjacent to the lightly doped $n^-$ type semiconductor region EX1 and isolated from the channel region of the memory transistor by a distance corresponding to the $n^-$ type semiconductor region EX1.

The $n^-$ type semiconductor region EX2 of the drain portion is formed in self alignment with the control gate electrode CG, while the $n^+$ type semiconductor region SD2 is formed in self alignment with the sidewall spacer SW on the side wall of the control gate electrode CG. In the semiconductor device thus manufactured, the lightly doped $n^-$ type semiconductor region EX2 is formed below the sidewall spacer SW on the side wall of the control gate electrode CG and the heavily doped $n^+$ type semiconductor region SD2 is formed outside the lightly doped $n^-$ type semiconductor region EX2. Therefore, the lightly doped n⁻ type semiconductor region EX2 is adjacent to a channel region of the control transistor and the heavily doped n⁺ type semiconductor region SD2 is adjacent to the lightly doped n⁻ type semiconductor region EX2 and isolated from the channel region of the control transistor by a distance corresponding to the n⁻ type semiconductor region EX2.

The channel region of the memory transistor is formed below the insulating film MZ below the memory gate electrode MG. The channel region of the control transistor is formed below the insulating film GF of the control gate electrode CG.

The n⁺ type semiconductor regions SD1 and SD2 have thereon the metal silicide layer SL formed by salicide technology or the like. The memory gate electrode MG and the control gate electrode CG have each thereon the metal silicide layer SL2 formed by a salicide technology or the like, but the formation of the metal silicide layer SL2 on the memory gate electrode MG and the control gate electrode CG may be omitted.

<Operation of Nonvolatile Memory>

Next, operation examples of a nonvolatile memory will be described referring to FIG. 31.

FIG. 31 is a table showing one example of voltage applying conditions to each site of a selected memory cell during "write", "erase", and "read" in the present embodiment. In the table in FIG. 31, listed are a voltage Vmg applied to the memory gate electrode MG, a voltage Vs applied to the source region (semiconductor region MS), a voltage Vcg applied to the control gate electrode CG, a voltage Vd applied to the drain region (semiconductor region MD), and a base voltage Vb applied to the p well PW1 in the memory cell as shown in FIGS. 29 and 30. Those shown in the table of FIG. 31 are a preferred example of voltage applying conditions. The conditions are not limited to them, but can be changed variously if necessary. Further, in the present embodiment, injection of electrons and injection of holes into the silicon nitride film MZ2, which is a charge storage portion in the insulation film MZ of the memory transistor, are defined as "write" and "erase", respectively.

In the table of FIG. 31, the column A corresponds to the case where a SSI method is used for writing and a BTBT method is used for erasing, the column B corresponds to the case where the SSI method is used for writing and a FN method is used for erasing, the column C corresponds to the case where the FN method is used for writing and the BTBT method is used for erasing, and the column D corresponds to the case where the FN method is used for writing and the FN method is used for erasing.

The SSI method can be regarded as an operation method of writing to a memory cell by injecting hot electrons into the silicon nitride film MZ2. The BTBT method can be regarded as an operation method of erasing the memory cell by injecting hot holes into the silicon nitride film MZ2. The FN method can be regarded as an operation method of performing writing or erasing to the memory cell by tunneling electrons or holes. The FN method will next be expressed in other words. The FN writing method can be regarded as an operation method of writing to the memory cell by injecting electrons into the silicon nitride film MZ2 by making use of a FN tunneling effect, and the FN erasing method can be regarded as an operation method of erasing the memory cell by injecting holes into the silicon nitride film MZ2 by making use of a FN tunneling effect. They will be described specifically.

The writing method includes a so-called SSI (source side injection) method, that is, a writing method (hot electron injection writing method) in which writing is performed by hot electron injection making use of source side injection and a so-called FN method, that is, a writing method (tunneling write method) in which writing is performed by FN (Fowler Nordheim) tunneling.

In the SSI writing, writing is performed, for example, by applying voltages (Vmg=10 V, Vs=5 V, Vcg=1 V, Vd=0.5 V, Vb=0 V) as shown in "write operation voltage" in column A or column B in the table of FIG. 31 to respective sites of the selected memory cell that performs writing operation and injecting electrons into the silicon nitride film MZ2 in the insulating film MZ of the selected memory cell. In this case, the hot electrons are generated in the channel region (between the source and the drain) below and between the two gate electrodes (memory gate electrode MG and control gate electrode CG) and hot electrons are injected into the silicon nitride film MZ2, which is a charge storage portion, in the insulation film MZ below the memory gate electrode MG. The injected hot electrons (electrons) are trapped in the trap level in the silicon nitride film MZ2 in the insulation film MZ. This leads to increase in the threshold voltage of the memory transistor. As a result, the memory transistor is brought to a write state.

In the FN writing, writing is performed, for example, by applying voltages (Vmg=−12 V, Vs=0 V, Vcg=0 V, Vd=0 V, Vb=0 V) as shown in "write operation voltage" in column C or column D in the table of FIG. 31 to the respective sites of the selected memory cell that performs writing and injecting electrons, which have been tunneled from the memory gate electrode MG, into the silicon nitride film MZ2 in the insulating film MZ in the selected memory cell. In this case, the electrons are injected into the insulation film MZ, tunneling from the memory gate electrode MG through the silicon oxide film MZ3 by FN tunneling (FN tunneling effect) and trapped in the trap level in the silicon nitride film MZ2 in the insulating film MZ. This leads to increase in the threshold voltage of the memory transistor. As a result, the memory transistor is brought to a write state.

In the FN writing, writing can also be performed by tunneling electrons from the semiconductor substrate SB and injecting them into the silicon nitride film MZ2 in the insulation film MZ. In this case, the write operation voltage is, for example, that obtained by reversing the polarity of "write operation voltage" in the column C or column D in the table of FIG. 31.

The erasing method includes a so-called BTBT method, that is, an erasing method in which erasing is performed by injecting hot holes by making use of BTBT (band-to-band tunneling: Inter-band tunneling phenomenon) and a so-called FN method, that is, an erasing method (tunneling erasing method) in which erasing is performed by making use of FN (Fowler Nordheim) tunneling.

In the BTBT erasing, erasing is performed by injecting holes generated by BTBT into a charge storage portion (the silicon nitride film MZ2 in the insulation film MZ). For example, voltages (Vmg=−6 V, Vs=6 V, Vcg=0 V, Vd=open, Vb=0 V) as shown by "erase operation voltage" in the column A or column C in the table of FIG. 31 are applied to the respective sites of the selected memory cell that performs erasing. Thus, the holes are generated by the BTBT phenomenon, and by acceleration under an electric field, they are injected into the silicon nitride film MZ2 in the insulation film MZ of the selected memory cell. This leads to reduction in the threshold voltage of the memory transistor. As a result, the memory transistor is in brought to an erase state.

In the FN erasing, erasing is performed by applying voltages (Vmg=12 V, Vs=0 V, Vcg=0 V, Vd=0 V, Vb=0 V) as shown by "erase operation voltage" in column B or column D in the table of FIG. 31 to the respective sites of the selected memory cell that performs erasing and injecting, in the silicon nitride film MZ2 in the insulation film MZ, holes which have been tunneled from the memory gate electrode MG in the selected memory cell. In this case, the holes tunneled through the silicon oxide film MZ3 by FN tunneling (FN tunneling effect) from the memory gate electrode MG are injected into the insulation film MZ and trapped in the trap level in the silicon nitride film MZ2 in the insulation film MZ. This results in reduction in the threshold voltage of the memory transistor. As a result, the memory transistor is brought to an erase state.

In the FN erasing, erasing can also be performed by tunneling the holes from the semiconductor substrate SB and injecting them into the silicon nitride film MZ2 in the insulation film MZ. In this case, the erase operation voltage is, for example, that obtained by reversing the polarity of the "erase operation voltage" in column B or column D in the Table of FIG. 31.

Further, when writing or erasing is performed by the FN method (in the case of the operation method B, C, or D) and when charges are tunneled from the memory gate electrode MG into the silicon nitride film MZ2, the thickness of the silicon oxide film MZ3 is preferably made less than that of the silicon oxide film MZ1. On the other hand, when writing or erasing is performed by the FN method (in the case of the operation method B, C, or D) and the charges tunneled from the semiconductor substrate SB are injected into the silicon nitride film MZ2, the thickness of the silicon oxide film MZ1 is preferably made less than that of the silicon oxide film MZ3. Further, when writing is performed by the SSI method and erasing is performed by the BTBT method (in the case of the operation method A), the thickness of the silicon oxide film MZ3 is preferably made equal to or more than that of the silicon oxide film MZ1.

Upon reading, for example, voltages as shown by "read operation voltage" in the column A, column B, column C, or column D in the table of FIG. 31 are applied to the respective sites of the selected memory cell that performs reading. The write state and the erase state can be discriminated by defining the voltage Vmg applied to the memory gate electrode MG upon reading to a value between the threshold voltage of the memory transistor in the write state and the threshold voltage in the erase state.

<Study by the Present Inventors>

A split-gate type memory cell has a control gate electrode (corresponding to the control gate electrode CG) and a memory gate electrode (corresponding to the memory gate electrode MG). The control gate electrode and the memory gate electrode are insulated from each other by an insulating film (corresponding to the insulating film MZ) located therebetween. When the insulating film located between the control gate electrode and the memory gate electrode has a low breakdown-voltage region, leakage may occur between the control gate electrode and the memory gate electrode through the low breakdown-voltage region serving as a leak path (leak route). When the insulating film located between the control gate electrode and the memory gate electrode has a low breakdown-voltage region, dielectric breakdown occurs due to an increased potential difference between the control gate electrode and the memory gate electrode, which may lead to a short-circuit between the control gate electrode and the memory gate electrode. Therefore, if in a semiconductor device, an insulating film located between a control gate electrode and a memory gate electrode has a low breakdown-voltage region, such a semiconductor device has deteriorated reliability.

The study by the present inventors has revealed that in an ion implantation step for forming a source/drain region of a split-gate type memory cell, an impurity is undesirably injected into an insulating film located between a control gate electrode and a memory gate electrode and in this impurity injected region, the insulating film has reduced breakdown voltage. This is likely to cause leakage or short-circuit between the control gate electrode and the memory gate electrode and as a result, the semiconductor device thus obtained has deteriorated reliability. This disadvantage will be described specifically referring to FIG. 32.

Figure 32:
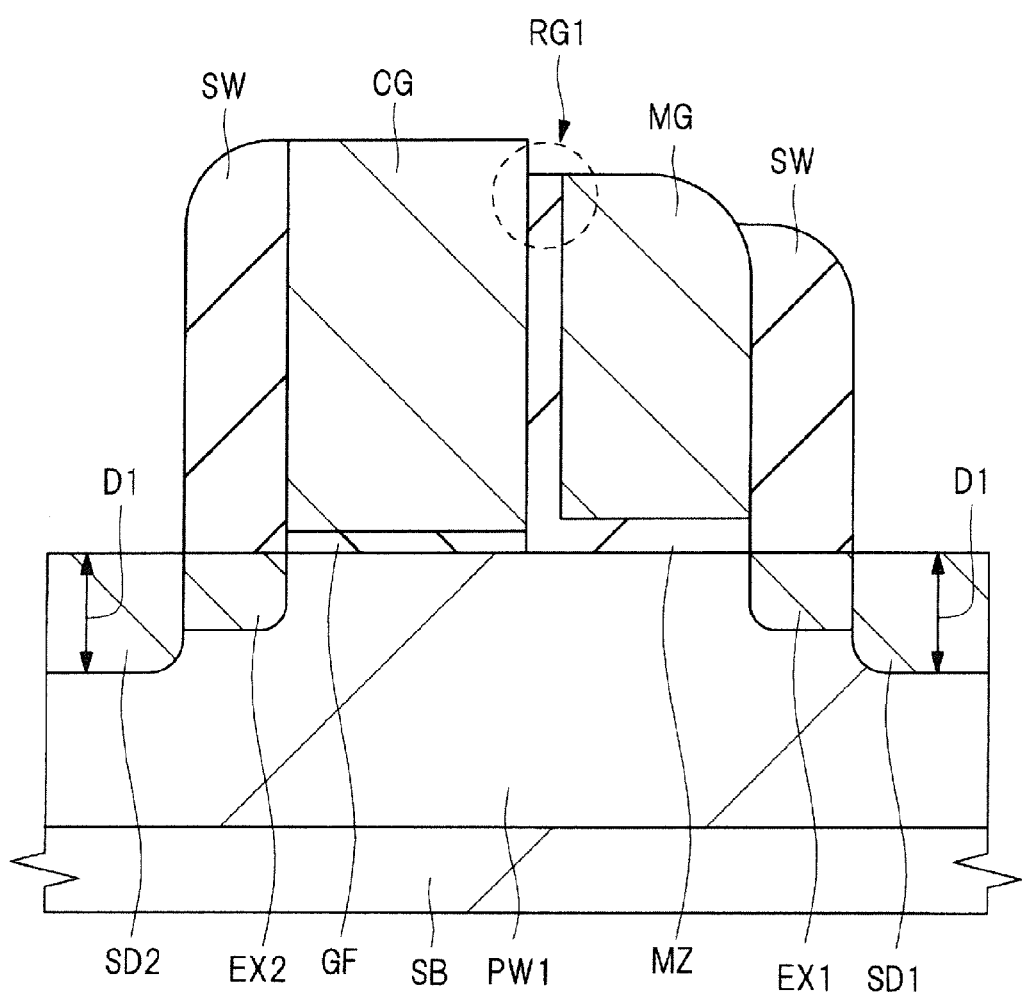
FIG. 32 is a fragmentary cross-sectional view of the semiconductor device of the one embodiment during a manufacturing step.

FIG. 32 is a fragmentary cross-sectional view of a semiconductor device during a manufacturing step thereof and it is an enlarged cross-sectional view of a portion of the memory cell region 1A. It shows the stage just after ion implantation is performed for forming the $n^+$ type semiconductor regions SD1 and SD2 in Step S15.

The source/drain region configuring the memory cell is comprised of the $n^-$ type semiconductor regions EX1 and EX2, and $n^+$ type semiconductor regions SD1 and SD2. These $n^-$ type semiconductor regions EX1 and EX2 and the $n^+$ type semiconductor regions SD1 and SD2 are formed using ion implantation. In the ion implantation step (corresponding to Step S13 and S15) for forming the $n^-$ type semiconductor regions EX1 and EX2 and the $n^+$ type semiconductor regions SD1 and SD2, not only an n type impurity is injected into the semiconductor substrate SB (p well PW1) in the memory cell region 1A but also an n type impurity is injected into the upper portion of the insulating film MZ formed between the control gate electrode CG and the memory gate electrode MG.

When an impurity is injected into the insulating film MZ located between the control gate electrode CG and the memory gate electrode MG during the ion implantation step, the insulating film MZ is damaged in a region of the insulating film MZ into which the impurity has been injected. In addition, the insulating film MZ has inevitably reduced breakdown voltage due to a large amount of the impurity in the insulating film MZ.

Ion implantation for the formation of the $n^+$ type semiconductor regions SD1 and SD2 requires a larger dose and larger ion energy than ion implantation for the formation of the $n^-$ type semiconductor regions EX1 and EX2. The phenomenon of inevitable impurity injection into the insulating film MZ formed between the control gate electrode CG and the memory gate electrode MG and reduction in breakdown voltage of the insulating film MZ caused thereby are likely to occur by the ion implantation for the formation of the $n^+$ type semiconductor regions SD1 and SD2 rather than the ion implantation for the formation of the $n^-$ type semiconductor regions EX1 and EX2. In FIG. 32, in a region RG1 of the insulating film MZ present between the control gate electrode CG and the memory gate electrode MG which region is surrounded by a dotted line (an upper portion of the insulating film MZ), an impurity is inevitably injected into the insulating film MZ by the ion implantation for the formation of the $n^+$ type semiconductor regions SD1 and SD2 and as a result, the insulating film MZ has reduced breakdown voltage.

The control gate electrode CG and the memory gate electrode MG are insulated from each other by the insulating film MZ present between them. When the semiconductor device thus manufactured has a region, into which an impurity has been injected by ion implantation, in the insulating film MZ present between the control gate electrode CG and the memory gate electrode MG, leakage may occur between the control gate electrode CG and the memory gate electrode MG due to a decrease in the breakdown voltage of the insulating film MZ in the region. In addition, an increase in the potential difference between the control gate electrode CG and the memory gate electrode MG, if any, causes dielectric breakdown, which may lead to a short-circuit between the control gate electrode CG and the memory gate electrode MG. Therefore, when the semiconductor device thus manufactured has a region, into which an impurity has been injected by ion implantation, in the insulating film MZ between the control gate electrode CG and the memory gate electrode MG, the semiconductor device may have deteriorated reliability.

<Main Characteristics and Advantages>

One of the main characteristics of the present embodiment is that an upper portion of the insulating film MZ formed between the control gate electrode CG and the memory gate electrode MG is removed in the polishing step of Step S19 and the removal length (polishing length) L1 of the insulating film MZ is made larger than the depth D1 of the $n^+$ type semiconductor regions SD1 and SD2 formed in Step S15 (L1>D1).

As described above, the upper portion (almost corresponding to the insulating film MZ in the region RG1 of FIG. 32) of the insulating film MZ present between the control gate electrode CG and the memory gate electrode MG has a low breakdown voltage because an impurity is injected by the ion implantation (corresponding to Step S15) for the formation of the $n^+$ type semiconductor regions SD1 and SD2.

In the present embodiment, however, the region of the insulating film MZ which is present between the control gate electrode CG and the memory gate electrode MG and into which an impurity has been injected by the ion implantation (corresponding to Step S15) for the formation of the $n^+$ type semiconductor regions SD1 and SD2 is removed by the polishing step of Step S19.

Since, the injection depth of an impurity into the semiconductor substrate SB by the ion implantation for the formation of the $n^+$ type semiconductor regions SD1 and SD2 is depth D1 so that an injection depth of an impurity into the insulating film MZ present between the control gate electrode CG and the memory gate electrode MG is roughly the same as the depth D1. If the removal length (polishing length) L1 of the insulating film MZ in the polishing step of Step S19 is made larger than the depth D1 (this means, L1>D1), almost the entirety of the region of the insulating film MZ into which an impurity has been injected by the ion implantation for the formation of the $n^+$ type semiconductor regions SD1 and SD2 can be removed by the polishing step of Step S19.

After the polishing step of Step S19, therefore, the insulating film MZ present between the control gate electrode CG and the memory gate electrode MG does not almost have the region into which an impurity has been injected by the ion implantation for the formation of the $n^+$ type semiconductor regions SD1 and SD2. This means that in the semiconductor device thus manufactured, the insulating film MZ present between the control gate electrode CG and the memory gate electrode MG does not almost have the region having a reduced breakdown voltage due to injection of an impurity by the ion implantation for the formation of the $n^+$ type semiconductor regions SD1 and SD2. In the semiconductor device thus manufactured, the insulating film MZ present between the control gate electrode CG and the memory gate electrode MG can have improved breakdown voltage. The semiconductor device thus manufactured therefore can have improved reliability. For example, in the semiconductor device thus manufactured, leakage current between the control gate electrode CG and the memory gate electrode MG can be suppressed or prevented. Further, dielectric breakdown and a short-circuit caused thereby between the control gate electrode CG and the memory gate electrode MG which may occur due to an increase in a potential difference between the control gate electrode CG and the memory gate electrode MG can be suppressed or prevented.

The injection depth by the ion implantation for the formation of the $n^-$ type semiconductor regions EX1 and EX2 is smaller than the injection depth by the ion implantation for the formation of the $n^+$ type semiconductor regions SD1 and SD2. In the ion implantation for the formation of the $n^-$ type semiconductor regions EX1 and EX2, the injection depth of an impurity into the semiconductor substrate SB is smaller than the depth D1 so that the injection depth of an impurity into the insulating film MZ located between the control gate electrode CG and the memory gate electrode MG also becomes smaller than the depth D1. By making the removal length (polishing length) L1 of the insulating film MZ in the polishing step of Step S19 larger than the depth D1 (meaning, L1>D1), almost the entirety of a region (portion) of the insulating film MZ into which an impurity has been injected by ion implantation for the formation of the $n^-$ type semiconductor regions EX1 and EX2 can be removed by the polishing step of Step S19.

After the polishing step of Step S19, therefore, even by ion implantation for the formation of the $n^-$ type semiconductor regions EX1 and EX2 or by ion implantation for the formation of the $n^+$ type semiconductor regions SD1 and SD2, almost no impurity has been injected into the insulating film MZ located between the control gate electrode CG and the memory gate electrode MG. In the semiconductor device thus manufactured, the insulating film MZ located between the control gate electrode CG and the memory gate electrode MG is therefore almost free from reduction in breakdown voltage due to the ion implantation for the formation of the $n^-$ type semiconductor regions EX1 and EX2 or reduction in breakdown voltage due to ion implantation for the formation of the $n^+$ type semiconductor regions SD1 and SD2. As a result, the semiconductor device can have improved reliability.

When the $n^+$ type semiconductor region SD1 and the $n^+$ type semiconductor region SD2 are formed by the same (common) ion implantation operation, the depth D1 of the $n^+$ type semiconductor region SD1 almost coincides with the depth D1 of the $n^+$ type semiconductor region SD2. Even when the $n^+$ type semiconductor region SD1 and the $n^+$ type semiconductor region SD2 are formed by respectively different (separate) ion implantation operations, the depth D1 of the $n^+$ type semiconductor region SD1 almost coincides with the depth D1 of the $n^+$ type semiconductor region SD2 when the energy of ion implantation for the formation of the $n^+$ type semiconductor region SD1 is almost the same as the energy of ion implantation for the formation of the $n^+$ type semiconductor region SD2. When the depth D1 of the $n^+$ type semiconductor region SD1 and the depth D1 of the $n^+$ type semiconductor region SD2 almost coincide with each other, it is only necessary to make the removal length (polishing length) L1 of the insulating film MZ in the polishing step of Step S19 larger than the depth D1.

On the other hand, when the $n^+$ type semiconductor region SD1 and the $n^+$ type semiconductor region SD2 are formed by respectively different (separate) ion implantation operations and at the same time, energy of ion implantation for the formation of the $n^+$ type semiconductor region SD1 differs from the energy of ion implantation for the formation of the $n^+$ type semiconductor region SD2, the depth D1 of the $n^+$ type semiconductor region SD1 may differ from the depth D1 of the $n^+$ type semiconductor region SD2. When the depth D1 of the $n^+$ type semiconductor region SD1 differs from the depth D1 of the $n^+$ type semiconductor region SD2, the removal length (polishing length) L1 of the insulating film MZ in the polishing step of Step S19 is made larger than smaller one of the depth D1 of the n⁺ type semiconductor region SD1 and the depth D1 of the n⁺ type semiconductor region SD2. In other words, the removal length (polishing length) L1 of the insulating film MZ in the polishing step of Step S19 is made larger than at least one of the depth D1 of the n⁺ type semiconductor region SD1 and the depth D1 of the n⁺ type semiconductor region SD2. It is more preferred to make the removal length (polishing length) L1 of the insulating film MZ in the polishing step of Step S19 larger than both of the depth D1 of the n⁺ type semiconductor region SD1 and the depth D1 of the n⁺ type semiconductor region SD2.

(Second Embodiment)

FIGS. 33 to 38 are fragmentary cross-sectional views of a semiconductor device of Second Embodiment during manufacturing steps and they show a region corresponding to FIGS. 4 to 20 and FIGS. 21 to 28 of First Embodiment.

Manufacturing steps of Second Embodiment are similar to those of First Embodiment until the structure of FIG. 6 is obtained by carrying out Step S5 (silicon film PS1 formation step) so that an overlapping description is omitted here.

Figure 33:
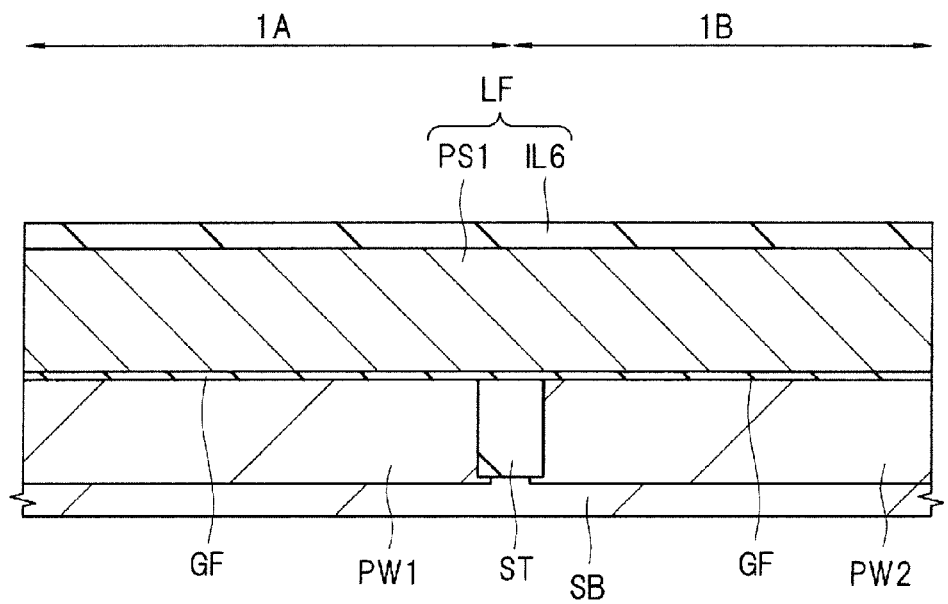
FIG. 33 is a fragmentary cross-sectional view of a semiconductor device of another embodiment during a manufacturing step.

In Second Embodiment, after the structure of FIG. 6 is obtained by carrying out Step S5 (silicon film PS1 formation step), an insulating film IL6 is formed on the silicon film PS1 as shown in FIG. 33. The insulating film IL6 can be formed by a single insulating film or a stacked insulating film obtained by stacking a plurality of insulating films. For example, the insulating film IL6 is made of a silicon nitride film and can be formed, for example, by CVD.

By carrying out the insulating film IL6 formation step after Step S5, a stacked film LF of the silicon film PS1 and the insulating film IL6 on the silicon film PS1 is formed. This stacked film LF is made of the silicon film PS1 and the insulating film IL6 on the silicon film PS1.

Figure 34:
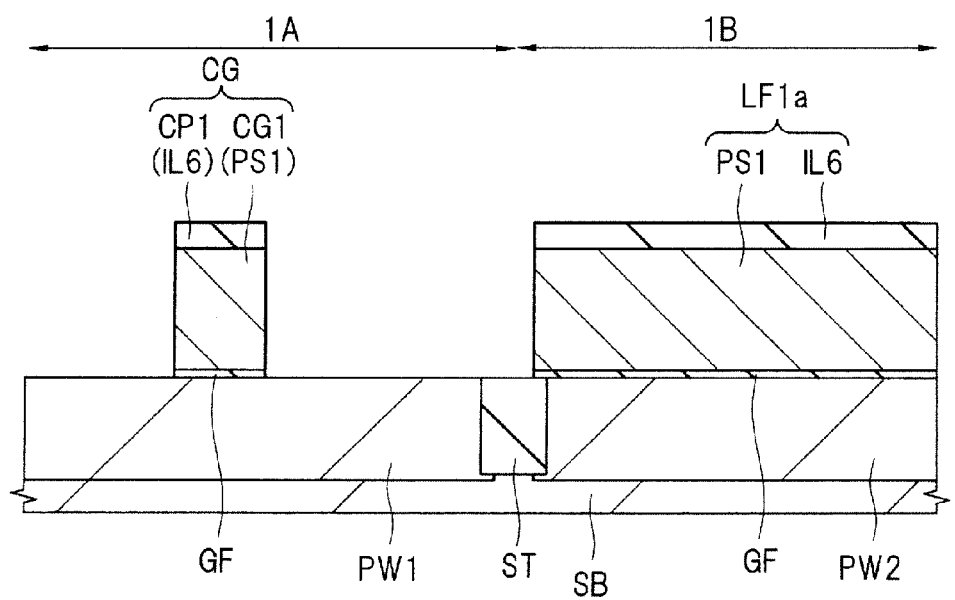
FIG. 34 is a fragmentary cross-sectional view of the semiconductor device during a manufacturing step following that of FIG. 33.

Next, a patterning step of Step S6 is performed. Different from First Embodiment in which the silicon film PS1 is patterned, the stacked film LF is patterned in Second Embodiment as shown in FIG. 34. A patterning method of Second Embodiment is substantially similar to that of First Embodiment.

In Second Embodiment, the stacked film LF is patterned in Step S6 and as shown in FIG. 34, a control gate electrode CG comprised of the patterned stacked film LF is formed in the memory cell region 1A. In the peripheral circuit region 1B, since no photoresist pattern (not illustrated) is formed, patterning of the stacked film LF is not performed and the stacked film LF remains as is. The stacked film remaining in the peripheral circuit region 1B will hereinafter be followed by a reference sign LF1a and called "stacked film LF1a".

In the memory cell region 1A, the insulating film GF remaining below the control gate electrode CG will be a gate insulating film of a control transistor. The control gate electrode CG comprised of the patterned stacked film LF lies on the semiconductor substrate SB (p well PW1) via the insulating film GF as a gate insulating film. In the memory cell region 1A, a portion of the insulating film GF not covered with the control gate electrode CG (meaning a portion of the insulating film GF other than a portion which will be a gate insulating film) can be removed by dry etching in the patterning step of Step S6 or wet etching thereafter.

In First Embodiment, after the formation of the control gate electrode CG in Step S6, the control gate electrode CG is comprised of the patterned silicon film PS1 and the silicon film PS1 configuring the control gate electrode CG has no insulating film thereon.

In Second Embodiment, on the other hand, immediately after formation of the control gate electrode CG in Step S6, the control gate electrode CG is comprised of the stacked film of the silicon film PS1 and the insulating film IL6 on the silicon film PS1. The planar shape of the silicon film PS1 (silicon gate portion CG1) configuring the control gate electrode CG substantially coincides with the planar shape of the insulating film IL6 (cap insulating film CP1) of the control gate electrode CG. The silicon film PS1 configuring the control gate electrode CG will hereinafter be followed by a reference sign CG1 and called "silicon gate portion CG1" and the insulating film IL6 configuring the control gate electrode CG will hereinafter be followed by a reference sign CP1 and called "cap insulating film CP1". Accordingly, the control gate electrode CG has a stacked structure of the silicon gate portion CG1 and the cap insulating film CP1 on the silicon gate portion CG1.

Steps of Second Embodiment after Step S6 and until Step S16 are basically similar to those of First Embodiment so that an overlapping description is omitted. In Second Embodiment, the structure of FIG. 35 corresponding to that of FIG. 16 can be obtained by carrying out Steps S7 to S16 as in First Embodiment.

Figure 35:
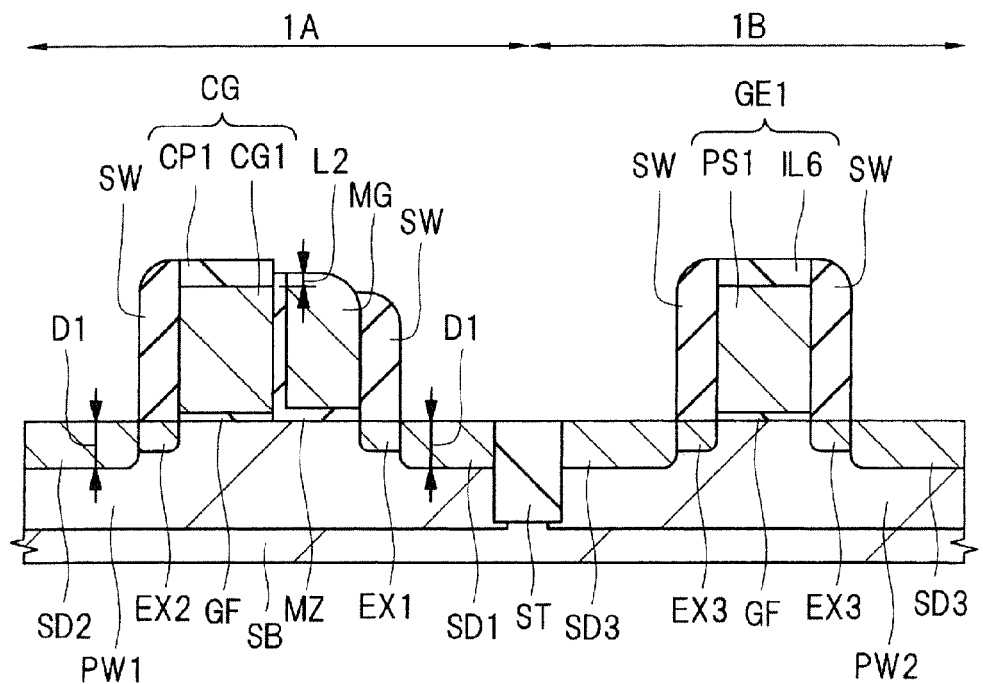
FIG. 35 is a fragmentary cross-sectional view of the semiconductor device during a manufacturing step following that of FIG. 34.

In Second Embodiment, however, the control gate electrode CG has a stacked structure of the silicon gate portion CG1 and the cap insulating film CP1 on the silicon gate portion CG1 as shown in FIG. 34. In Second Embodiment, since the stacked film LF1a is patterned into a gate electrode GE1 in Step S12, the gate electrode GE1 is comprised of a stacked film of the silicon film PS1 and the insulating film IL6 on the silicon film PS1, as shown in FIG. 35.

Figure 36:
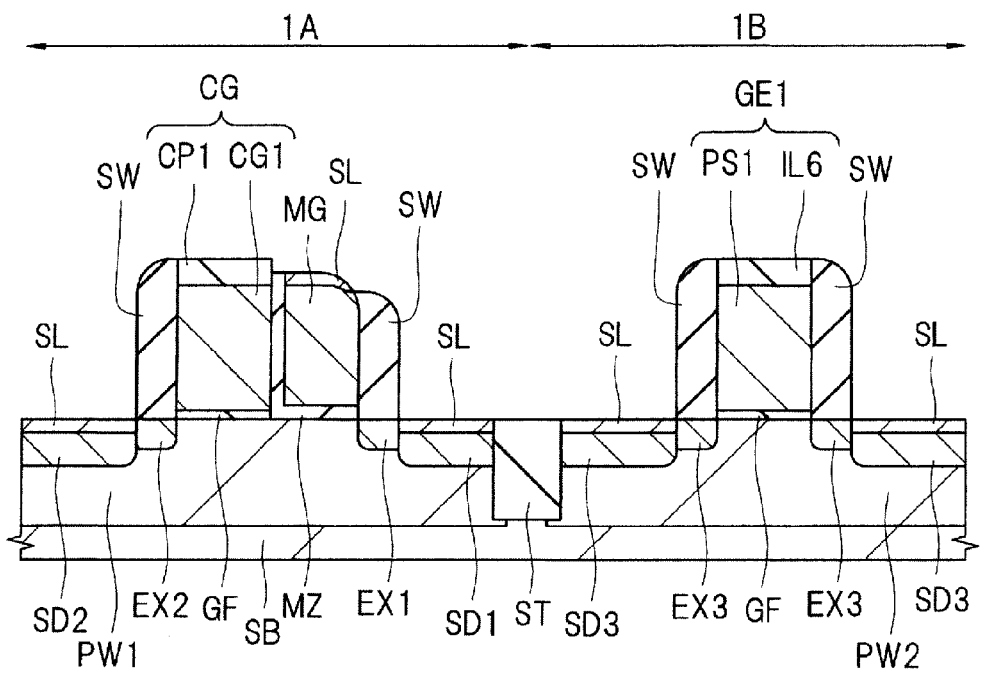
FIG. 36 is a fragmentary cross-sectional view of the semiconductor device during a manufacturing step following that of FIG. 35.

Next, the metal silicide layer SL formation step of Step S17 is performed. The method of forming the metal silicide layer SL in Second Embodiment is similar to that in First Embodiment. In First Embodiment, however, the metal silicide layer SL is formed on the control gate electrode CG and also on the gate electrode GE1, while in Second Embodiment, as shown in FIG. 36, the control gate electrode CG and the gate electrode GE1 each have thereon no metal silicide layer SL.

In Second Embodiment, the metal silicide layer SL is formed on the upper portion of each of the n⁺ type semiconductor regions SD1, SD2, and SD3 and on the upper portion of the memory gate electrode MG, but it is not formed on each of the control gate electrode CG and the gate electrode GE1. The metal silicide layer SL is not formed on the control gate electrode CG, because the uppermost layer of the control gate electrode CG is comprised of the cap insulating film CP1 (the insulating film IL6). The metal silicide layer SL is not formed on the gate electrode GE1, because the uppermost layer of the gate electrode GE1 is comprised of the insulating film IL6. The metal film MM (refer to FIG. 17) for the formation of the metal silicide layer SL does not come into contact with the silicon gate portion CG1 configuring the control gate electrode CG and at the same time, does not come into contact with the silicon film PS1 configuring the gate electrode GE1 so that the metal silicide layer SL is not formed on each of the control gate electrode CG and the gate electrode GE1.

Figure 37:
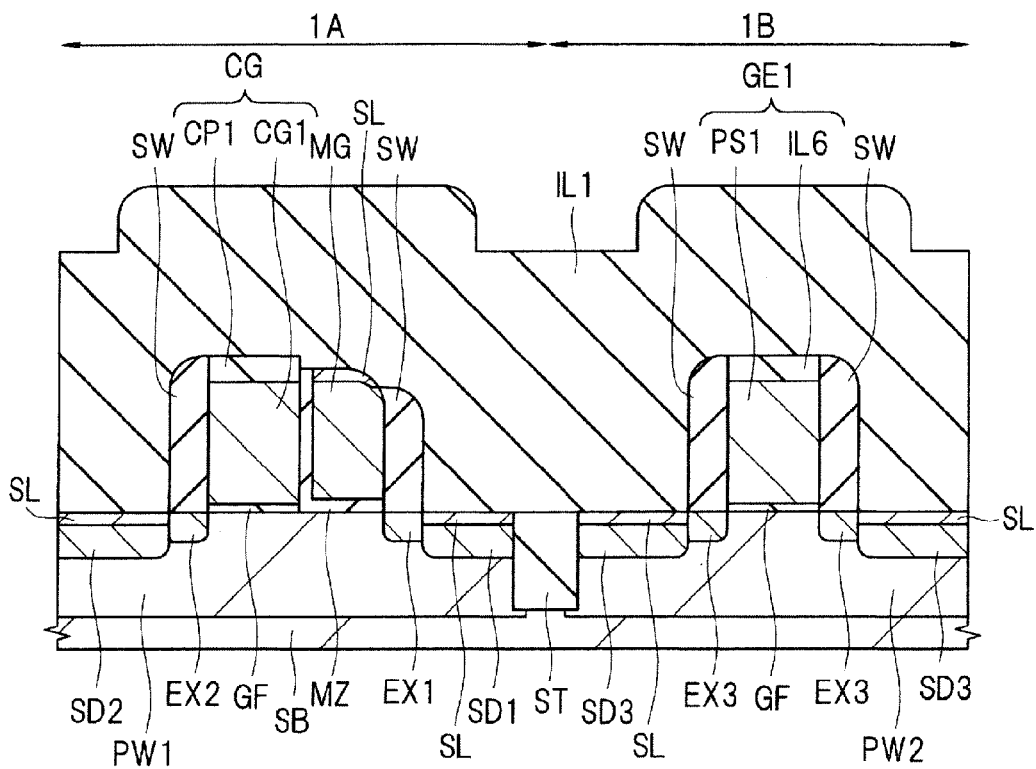
FIG. 37 is a fragmentary cross-sectional view of the semiconductor device during a manufacturing step following that of FIG. 36.

Next, the insulating film IL1 formation step of Step S18 is performed to obtain the structure of FIG. 37 corresponding to that of FIG. 19. The insulating film IL1 formation step of Step S18 in Second Embodiment is similar to that in First Embodiment.

Figure 38:
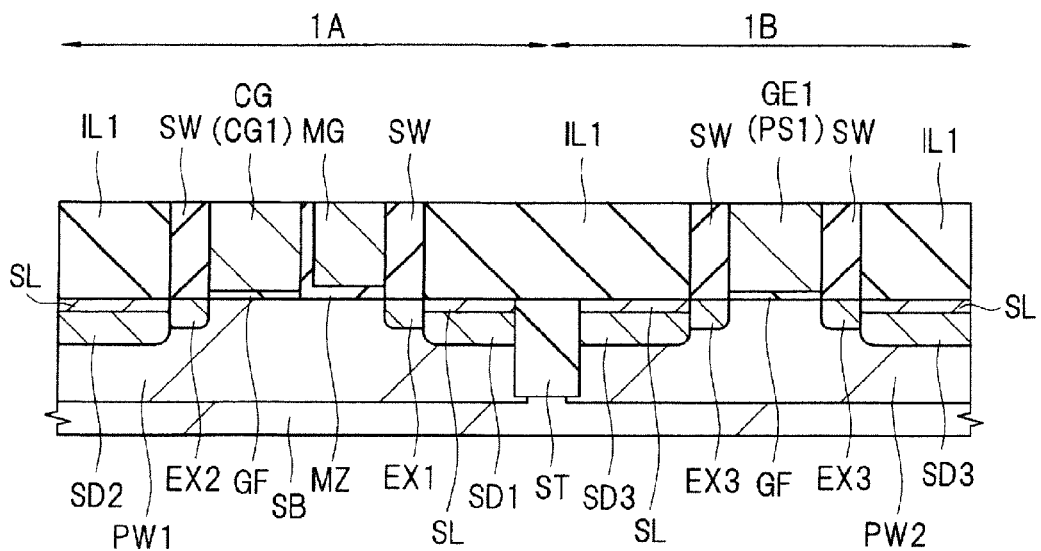
FIG. 38 is a fragmentary cross-sectional view of the semiconductor device during a manufacturing step following that of FIG. 37.
Figure 39:
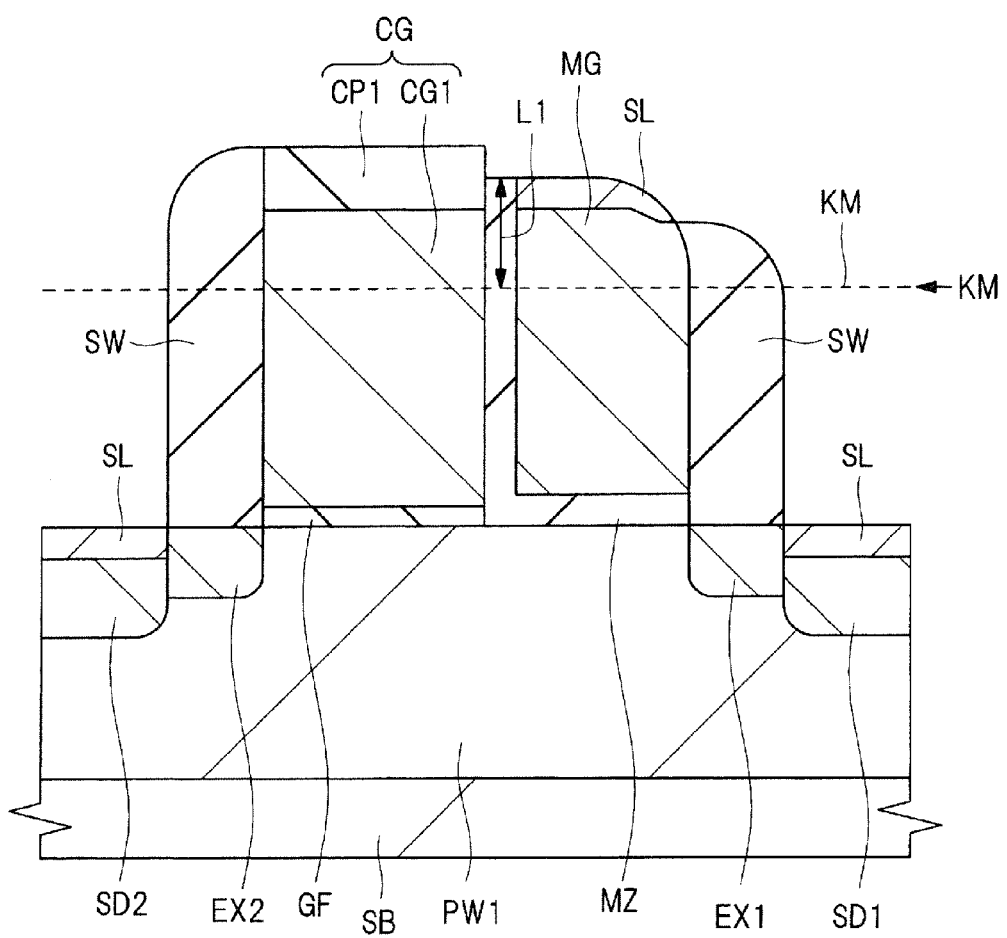
FIG. 39 is an explanatory view of a polishing step of Step S19.

Next, the polishing step of Step S19 is performed to obtain the structure of FIG. 38 corresponding to that of FIG. 20. FIG. 39 is an explanatory view of the polishing step of Step S19 in Second Embodiment and it corresponds to FIG. 21 of First Embodiment. Similar to FIG. 21, FIG. 39 also omits the illustration of the insulating film IL1 in order to facilitate understanding of the drawing.

The polishing step of Step S19 in Second Embodiment is basically similar to that in First Embodiment. Second Embodiment is similar to First Embodiment in that an upper portion of the insulating film MZ formed between the control gate electrode CG and the memory gate electrode MG is removed in the polishing step of Step S19, and the removal length (polishing length) L1 of the upper portion of the insulating film MZ is equal to or more than the depth D1 of the n⁺ type semiconductor regions SD1 and SD2 formed in Step S15 (L1≥D1).

Described specifically, in the polishing step of Step S19, polishing to a position of the polished face (polished surface, polished position) KM shown by a dotted line in FIG. 39 is performed to remove a predetermined length of the upper portion of the insulating film MZ present between the control gate electrode CG and the memory gate electrode MG. At this time, an upper portion of each of the control gate electrode CG and the memory gate electrode MG sandwiching therebetween the insulating film MZ is polished and removed, together with the insulating film MZ. This means that a portion of the control gate electrode CG, the memory gate electrode MG, the insulating film MZ, the sidewall spacer SW, and the insulating film IL1 located above the polished face KM in FIG. 39 is polished and removed in Step S19 (FIG. 39 however does not include the insulating film IL1). The polishing length in the polishing step in Step S19 is set so that the removal length (polishing length) L1 of the insulating film MZ becomes larger than the depth D1 of the n⁺ type semiconductor regions SD1 and SD2 formed in Step S15 (L1>D1).

Second Embodiment is however different from First Embodiment in the following point in the polishing step of Step S19. In Second Embodiment, in the polishing step of Step S19, the cap insulating film CP1 configuring the control gate electrode CG and the insulating film IL6 configuring the gate electrode GE1 are polished and removed.

After completion of the polishing step of Step S19, the silicon gate portion CG1 (silicon film PS1) configuring the control gate electrode CG and the silicon film PS1 configuring the gate electrode GE1 are exposed also in Second Embodiment. Therefore, the structure (structure of FIG. 38) after completion of the polishing step of Step S19 in Second Embodiment is similar to the structure (structure of FIG. 20) after completion of the polishing step of Step S19 in First Embodiment.

In Second Embodiment, the control gate electrode CG and the gate electrode GE1 each have a stacked structure of the silicon film PS1 and the insulating film IL6 on the silicon film PS1 before the polishing step of Step S19, but after the polishing step of Step S19, the control gate electrode CG and the gate electrode GE1 are each comprised of only the silicon film PS1 due to the removal of the insulating film IL6.

Steps after Step S19 in Second Embodiment are similar to those in First Embodiment so that overlapping illustration and description are omitted here.

Also in Second Embodiment similar to First Embodiment, an upper portion of the insulating film MZ formed between the control gate electrode CG and the memory gate electrode MG is removed by the polishing step of Step S19 and the removal length (polishing length) L1 of the insulating film MZ is larger (L1>D1) than the depth D1 of the n⁺ type semiconductor regions SD1 and SD2 formed in Step S15. In Second Embodiment similar to First Embodiment, a region of the insulating film MZ which is present between the control gate electrode CG and the memory gate electrode MG and into which an impurity has been injected by ion implantation for the formation of the n⁺ type semiconductor regions SD1 and SD2 can be removed in the polishing step of Step S19. Therefore, a region of the insulating film MZ into which an impurity has been injected by ion implantation for the formation of the n⁻ type semiconductor regions EX1 and EX2 or ion implantation for the formation of the n⁺ type semiconductor regions SD1 and SD2 can be removed in the polishing step of Step S19. This means that in Second Embodiment as in First Embodiment, after completion of the polishing step of Step S19, almost no impurity has been injected into the insulating film MZ present between the control gate electrode CG and the memory gate electrode MG either by ion implantation for the formation of the n⁻ type semiconductor regions EX1 and EX2 or ion implantation for the formation of the n⁺ type semiconductor regions SD1 and SD2. Therefore, also in the semiconductor device manufactured in Second Embodiment, the insulating film MZ present between the control gate electrode CG and the memory gate electrode MG is almost free from reduction in breakdown voltage due to ion implantation for the formation of the n⁻ type semiconductor regions EX1 and EX2 or reduction in breakdown voltage due to ion implantation for the formation of the n⁺ type semiconductor regions SD1 and SD2. As a result, the semiconductor device can have improved reliability.

When the height position of the upper surface (position contiguous to the insulating film MZ) of the memory gate electrode MG is lower than that of the upper surface of the silicon gate portion CG1 configuring the control gate electrode CG after completion of the ion implantation for the formation of the n⁺ type semiconductor regions SD1 and SD2, Second Embodiment can be applied preferably to such a case. The reason is that when ion implantation for the formation of the n⁺ type semiconductor regions SD1 and SD2 are performed while the height position of the upper surface (position adjacent to the insulating film MZ) of the memory gate electrode MG is lower than that of the upper surface of the silicon gate portion CG1 configuring the control gate electrode CG, an impurity is inevitably injected into the insulating film MZ present between the silicon gate portion CG1 and the memory gate electrode MG.

Even when after completion of the ion implantation for the formation of the n⁺ type semiconductor regions SD1 and SD2, the height position of the upper surface (position adjacent to the insulating film MZ) of the memory gate electrode MG is higher than that of the upper surface of the silicon gate portion CG1 configuring the control gate electrode CG, if a height difference L2 is smaller than the depth D1 (L2<D1), Second Embodiment can be preferably applied to such a case. The term "height difference L2" as used herein corresponds to a difference (dimension in a direction substantially perpendicular to the main surface of the semiconductor substrate) between the height position of the upper surface (position adjacent to the insulating film MZ) of the memory gate electrode MG and the height position of the upper surface of the silicon gate portion CG1 configuring the control gate electrode CG. It is shown in FIG. 35. Even when the height position of the upper surface (position adjacent to the insulating film MZ) of the memory gate electrode MG is higher than that of the upper surface of the silicon gate portion CG1, if a difference L2 between them is smaller than the depth D1, an impurity is inevitably injected into the insulating film MZ located between the silicon gate portion CG1 and the memory gate electrode MG by the ion implantation for the formation of the n⁺ type semiconductor regions SD1 and SD2.

(Third Embodiment 3)

FIGS. 40, 41, and 43 to 47 are fragmentary cross-sectional views of a semiconductor device of Third Embodiment during manufacturing steps thereof and show a cross-sectional view of the memory cell region 1A. FIG. 42 is an explanatory view of an insulating film MZ removal step of FIG. 41.

The manufacturing steps of Third Embodiment are similar to those of First Embodiment until the structure of FIG. 16 is obtained by carrying out Step S16 (activation annealing step) so that an overlapping description is omitted.

Figure 40:
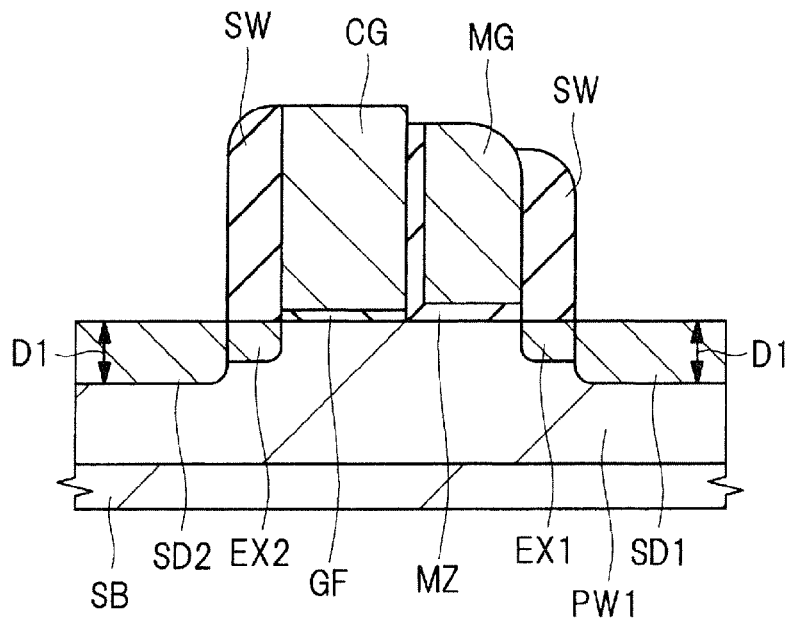
FIG. 40 is a fragmentary cross-sectional view of a semiconductor device of a further embodiment during a manufacturing step.

In Third Embodiment, steps until Step S16 (activation annealing step) are performed in a manner similar to those of First Embodiment to obtain a structure of FIG. 40 corresponding to FIG. 16. The structure of FIG. 40 is similar to that of the memory cell region 1A shown in FIG. 16.

Figure 41:
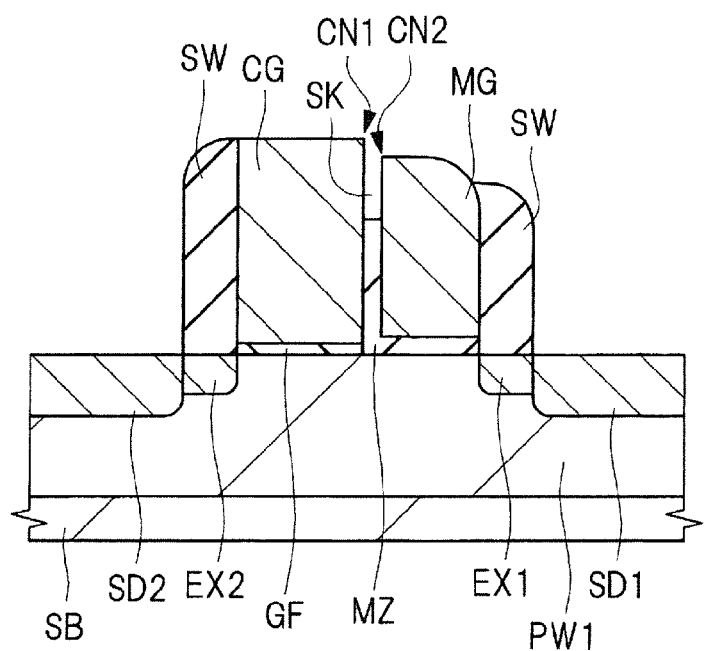
FIG. 41 is a fragmentary cross-sectional view of the semiconductor device during a manufacturing step following that of FIG. 40.
Figure 42:
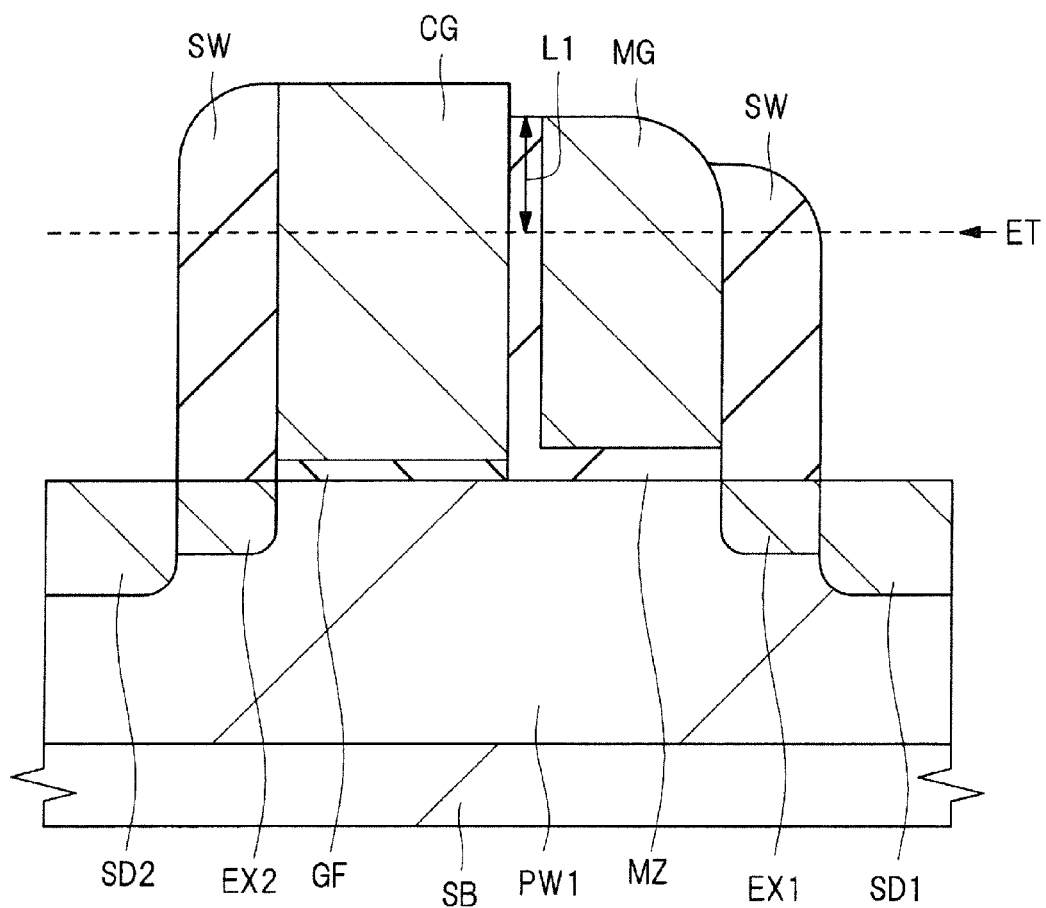
FIG. 42 is an explanatory view of the insulating film removal step of FIG. 41.

Then, in Third Embodiment, as shown in FIG. 41, an upper portion of the insulating film MZ present between the control gate electrode CG and the memory gate electrode MG is removed by etching. This step will hereinafter be called "insulating film MZ removal step of FIG. 41".

FIG. 42 is an explanatory view of the insulating film MZ removal step of FIG. 41 and it shows a stage immediately before the insulating film MZ removal step of FIG. 41.

In the insulating film MZ removal step of FIG. 41, the insulating film MZ located between the control gate electrode CG and the memory gate electrode MG is selectively etched to an etching position ET shown by a dotted line in FIG. 42. Thus, the insulating film MZ is removed by etching. This means that the end portion (upper end) of the insulating film MZ located between the control gate electrode CG and the memory gate electrode MG is allowed to retreat from the upper surface of the control gate electrode CG and the upper surface of the memory gate electrode MG. In FIG. 41, the position of the end portion (upper end) of the insulating film MZ located between the control gate electrode CG and the memory gate electrode MG corresponds to an etching position ET shown by a dotted line in FIG. 42. This means that a portion of the insulating film MZ located above the etching position ET in FIG. 42 is removed by etching in the insulating film MZ removal step of FIG. 41. By the insulating film MZ removal step of FIG. 41, the height position of the end portion (upper end) of the insulating film MZ located between the control gate electrode CG and the memory gate electrode MG becomes lower than the upper surface of the control gate electrode CG and also the upper surface of the memory gate electrode MG.

What is important in the insulating film MZ removal step of FIG. 41, the removal length L1 of the insulating film MZ is made larger than the depth D1 of the $n^+$ type semiconductor regions SD1 and SD2 formed in Step S15 (L1>D1). In Third Embodiment, the removal length (etching length) L1 of the insulating film MZ is shown in FIG. 42 and it corresponds to the dimension (the dimension in a substantially perpendicular direction to the main surface of the semiconductor substrate SB) of a portion of the insulating film MZ removed (etched) by the insulating film MZ removal step of FIG. 41.

In short, the removal length L1 of the insulating film MZ in First and Second Embodiments is equal to the removal length (polishing length) of the insulting film MZ in the polishing step of Step S19, while the removal length L1 of the insulating film MZ in Third Embodiment is a removal length (etching length) of the insulating film MZ in the insulating film MZ removal step of FIG. 41. In Third Embodiment similar to First and Second Embodiments, the removal length L1 of the insulating film MZ is made equal to or larger than the depth D1 (L1≥D1) of the $n^+$ type semiconductor regions SD1 and SD2 formed in Step S15.

When there is no difference in the depth D1 of the $n^+$ type semiconductor regions SD1 and SD2 between FIG. 42 and FIG. 21, the etching position ET shown in FIG. 42 is set at a position equal to the polished surface KM of First Embodiment shown in FIG. 21. Therefore, the removal length (polishing length) L1 of the insulating film MZ in the polishing step of Step S19 in First Embodiment and the removal length (etching length) L1 of the insulating film MZ in the insulating film MZ removal step of FIG. 41 of Third Embodiment are each set at larger than the depth D1 of the $n^+$ type semiconductor regions SD1 and SD2 formed in Step S15 (L1>D1).

In the insulating film MZ removal step of FIG. 41, the insulating film MZ is removed by etching to the etching position ET of FIG. 42 under etching conditions under which the control gate electrode CG, the memory gate electrode MG, and the semiconductor substrate SB are more resistant to etching than the insulating film MZ. In the insulating film MZ removal step of FIG. 41, therefore, the insulating film MZ can be removed selectively while suppressing or preventing etching of the control gate electrode CG, the memory gate electrode MG, and the semiconductor substrate SB. By the insulating film MZ removal step of FIG. 41, a gap (space or trench) SK appears between the control gate electrode CG and the memory gate electrode MG in a region from which the insulating film MZ has been removed. The gap SK corresponds to a region from which the insulating film MZ has been removed in the insulating film MZ removal step of FIG. 41. In the insulating film MZ removal step of FIG. 41, wet etching is suited for use.

As described above, the insulating film MZ is comprised of a stacked film of the silicon oxide film MZ1, the silicon nitride film MZ2 on the silicon oxide film MZ1, and the silicon oxide film MZ3 on the silicon nitride film MZ2. The insulating film MZ removal step of FIG. 41 can also be performed by an etching step (preferably, wet etching step) for selectively etching the silicon oxide films MZ1 and MZ3 and an etching step (preferably, wet etching step) for selectively etching the silicon nitride film MZ2.

Figure 43:
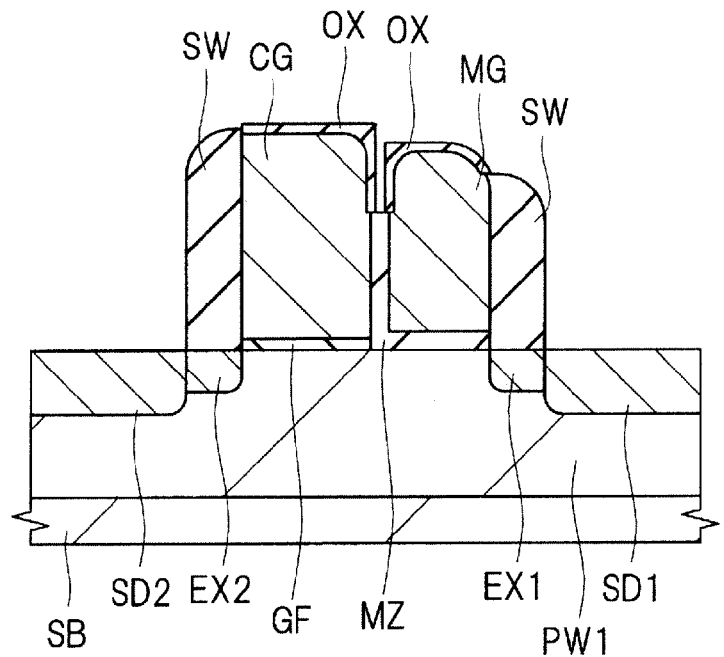
FIG. 43 is a fragmentary cross-sectional view of the semiconductor device during a manufacturing step following that of FIG. 41.

Next, oxidation treatment (for example, thermal oxidation treatment) is performed to form an oxide film (sacrificial oxide film) OX on the exposed surface of the control gate electrode CG and the memory gate electrode MG as shown in FIG. 43. The oxide film OX is formed on the upper surface of the control gate electrode CG, the upper surface of the memory gate electrode MG, and the side surfaces of the control gate electrode CG and the memory gate electrode MG opposite to each other via the gap SK.

With regard to the control gate electrode CG, the oxide film OX is formed on the upper surface thereof and a region of the side surface of the control gate electrode on the side facing to the memory gate electrode MG and not adjacent to the insulating film MZ (region adjacent to the gap SK). With regard to the memory gate electrode MG, the oxide film OX is formed on the upper surface thereof and a region of the side surface of the memory gate electrode on the side facing to the control gate electrode CG and not adjacent to the insulating film MZ (region adjacent to the gap SK).

Although not shown in FIG. 43, the oxide film OX may be formed on the exposed surface of the semiconductor substrate SB.

Figure 44:
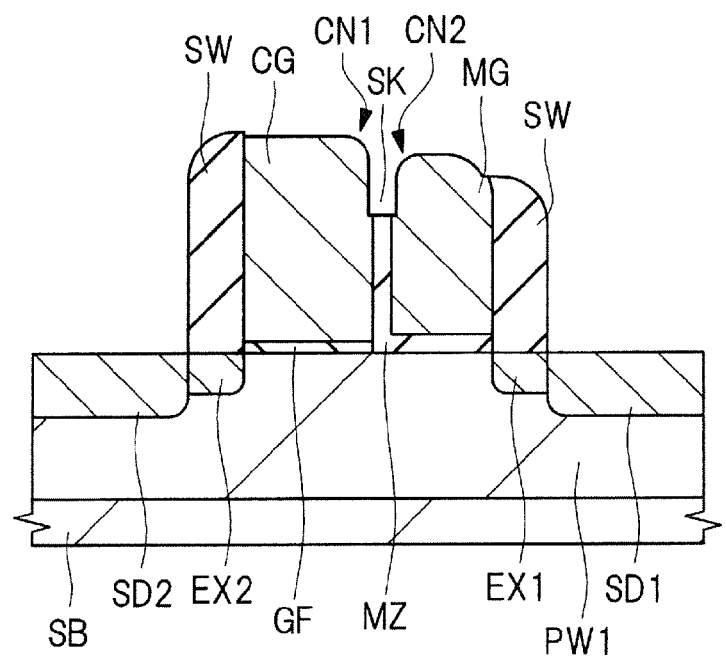
FIG. 44 is a fragmentary cross-sectional view of the semiconductor device during a manufacturing step following that of FIG. 43.

Next, as shown in FIG. 44, the oxide film is removed by etching. Since formation of the oxide film OX by oxidation treatment is followed by the removal step of the oxide film OX, the oxide film can be regarded as a sacrificial oxide film and oxidation treatment for the formation of the oxide film OX can be regarded as sacrificial oxidation.

In this oxide film OX removal step, the oxide film OX is removed by etching under etching conditions under which the control gate electrode CG, the memory gate electrode MG, and the semiconductor substrate SB are more resistant to etching than the oxide film OX. In this oxide film OX removal step, the oxide film OX can be removed selectively while suppressing or preventing etching of the control gate electrode CG, the memory gate electrode MG, and the semiconductor substrate SB. Wet etching is suited for use in the oxide film OX removal step.

Figure 45:
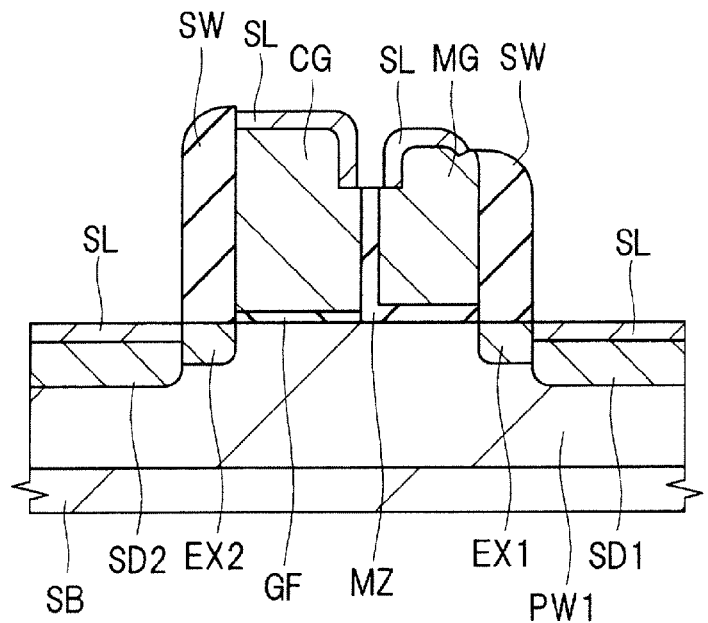
FIG. 45 is a fragmentary cross-sectional view of the semiconductor device during a manufacturing step following that of FIG. 44.

Next, as shown in FIG. 45, a metal silicide layer SL is formed. A metal silicide layer SL formation step in Third Embodiment is basically similar to Step S17 of First Embodiment. As shown in FIG. 45, the metal silicide layer SL is formed on the upper portion (upper surface, surface, or upper layer portion) of each of the $n^+$ type semiconductor regions SD1 and SD2, the control gate electrode CG, and the memory gate electrode MG.

Figure 46:
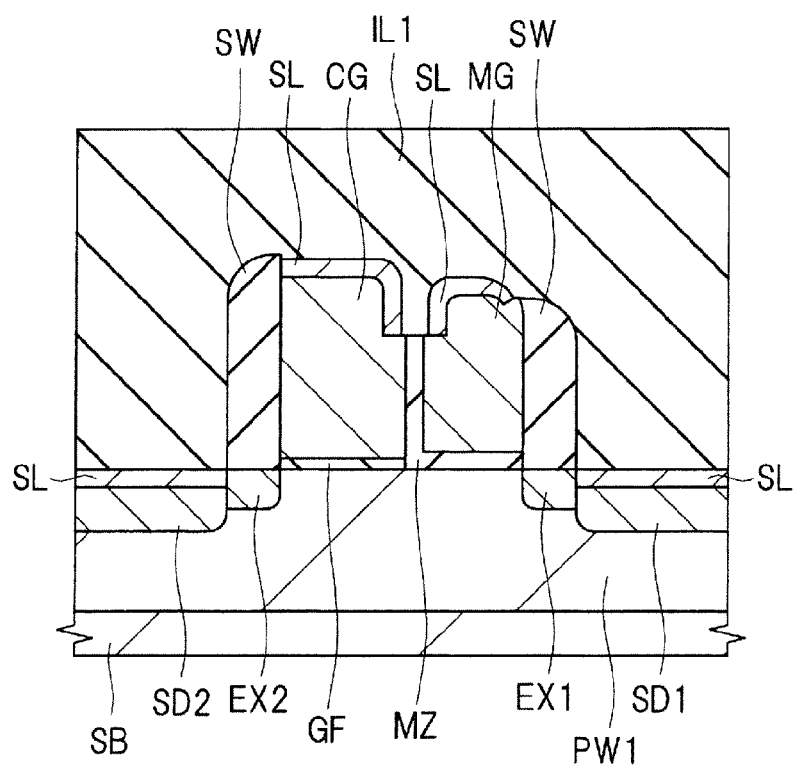
FIG. 46 is a fragmentary cross-sectional view of the semiconductor device during a manufacturing step following that of FIG. 45.

Next, as shown in FIG. 46, an insulating film (interlayer insulating film) IL1 is formed (deposited) as an interlayer insulating film on the entire main surface of the semiconductor substrate SB so as to cover the control gate electrode CG, the memory gate electrode MG, and the sidewall spacer SW.

The insulating film IL1 may be a single silicon oxide film or a stacked film of a silicon nitride film and a silicon oxide film formed on the silicon nitride film with a thickness greater than that of the silicon nitride film. It can be formed, for example, by CVD. After formation of the insulating film IL1, the upper surface of the insulating film IL1 is planarized by CMP or the like if necessary. In Third Embodiment different from First Embodiment, the control gate electrode CG or the memory gate electrode MG is not exposed even if the upper surface of the insulating film IL1 is polished by CMP or the like.

The gap SK formed between the control gate electrode CG and the memory gate electrode MG by carrying out the insulating film MZ removal step of FIG. 41 to remove the insulating film MZ between the control gate electrode CG and the memory gate electrode MG is desirably filled with the insulating film IL1.

Figure 47:
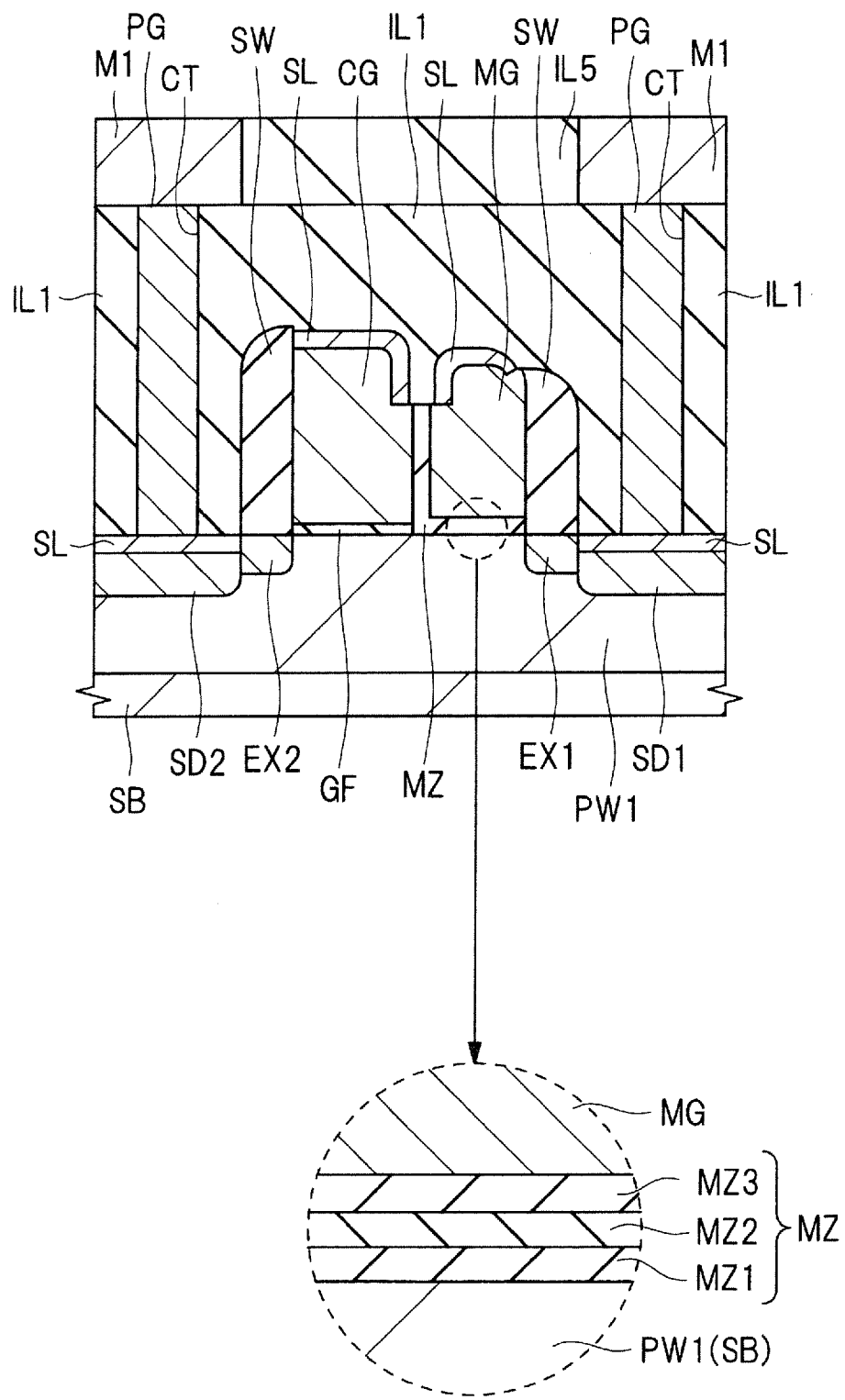
FIG. 47 is a fragmentary cross-sectional view of the semiconductor device during a manufacturing step following that of FIG. 46.

With a photoresist pattern (not illustrated) formed on the insulating film IL1 by photolithography as an etching mask, the insulating film IL1 is dry etched to form a contact hole (opening portion or through-hole) CT in the insulating film IL1 as shown in FIG. 47. In First Embodiment, the contact hole CT is formed in the stacked film of the insulating film IL1 and the insulating film IL4 in Step S26, while in Third Embodiment, the contact hole CT is formed in the insulating film IL1 because the insulating film IL4 is not formed.

A conductive plug PG made of tungsten (W) or the like is formed in the contact hole CT as a coupling conductor portion. A plug PG formation step in Third Embodiment is basically similar to Step S27 of First Embodiment.

The contact hole CT and the plug PG embedded therein are formed on the $n^+$ type semiconductor regions SD1 and SD2, the control gate electrode CG, the memory gate electrode MG, and the like. The cross-sectional view of FIG. 47 shows a cross-section in which a portion of (the metal silicide layer on the surface of) the $n^+$ type semiconductor regions SD1 and SD2 is exposed at the bottom of the contact hole CT and is electrically coupled to the plug PG embedded in the contact hole CT.

Next, a wiring (wiring layer) M1 which is a first-layer wiring is formed on the insulating film IL1 embedded with the plug PG. A wiring M1 formation step in Third Embodiment is basically similar to Step S28 of First Embodiment. After that, a second or upper wiring is formed, but illustration and description on it is omitted here.

In the insulating film MZ removal step of FIG. 41 in Third Embodiment as in the polishing step of Step S19 in First Embodiment, an upper portion of the insulating film MZ formed between the control gate electrode CG and the memory gate electrode MG is removed and the removal length (etching length) L1 of the insulating film MZ is larger than the depth D1 of the $n^+$ type semiconductor regions SD1 and SD2 formed in Step S15 (L1>D1). Also in Third Embodiment, as in First Embodiment, a region of the insulating film MZ which is present between the control gate electrode CG and the memory gate electrode MG and into which an impurity has been injected by ion implantation for the formation of $n^+$ type semiconductor regions SD1 and SD2 can be removed by the insulating film MZ removal step of FIG. 41. Therefore, a region of the insulating film MZ into which an impurity has been injected by ion implantation for the formation of $n^-$ type semiconductor regions EX1 and EX2 or ion implantation for the formation of $n^+$ type semiconductor regions SD1 and SD2 can be removed by the insulating film MZ removal step of FIG. 41. Also in Third Embodiment, therefore, after completion of the insulating film MZ removal step of FIG. 41, almost no impurity has been injected into the insulating film MZ located between the control gate electrode CG and the memory gate electrode MG by ion implantation for the formation of the $n^-$ type semiconductor regions EX1 and EX2 or ion implantation for the formation of $n^+$ type semiconductor regions SD1 and SD2. Also in the semiconductor device thus manufactured in Third Embodiment, therefore, the insulating film MZ present between the control gate electrode CG and the memory gate electrode MG is almost free from reduction in breakdown voltage due to ion implantation for the formation of the $n^-$ type semiconductor regions EX1 and EX2 or reduction in breakdown voltage due to ion implantation for the formation of the $n^+$ type semiconductor regions SD1 and SD2. As a result, the semiconductor device can have improved reliability. For example, in the semiconductor device thus manufactured, leakage current between the control gate electrode CG and the memory gate electrode MG can be suppressed or prevented. Further, dielectric breakdown and a short-circuit caused thereby between the control gate electrode CG and the memory gate electrode MG which may occur due to an increase in a potential difference between the control gate electrode CG and the memory gate electrode MG can be suppressed or prevented.

In Third Embodiment, since the upper portion of the insulating film MZ present between the control gate electrode CG and the memory gate electrode MG is removed by the insulating film MZ removal step of FIG. 41, the corner portion (upper-surface corner portion) CN1 of the control gate electrode CG and the corner portion (upper-surface corner portion) CN2 of the memory gate electrode MG are exposed. The corner portion CN1 of the control gate electrode CG is a corner portion formed by the upper surface of the control gate electrode CG and the side surface of the control gate electrode CG on the side opposite to the memory gate electrode MG and is shown in FIG. 41. The corner portion CN2 of the memory gate electrode MG is a corner portion formed by the upper surface of the memory gate electrode MG and the side surface of the memory gate electrode MG on the side opposite to the control gate electrode CG and is shown in FIG. 41.

In Third Embodiment, after the insulating film MZ removal step of FIG. 41, the oxide film OX formation step and the oxide film OX removal step are performed, but the oxide film OX formation step and the oxide film OX removal step may be omitted. The following advantage can however be achieved by carrying out the oxide film OX formation step and the oxide film OX removal step after the insulating film MZ removal step of FIG. 41.

Described specifically, in Third Embodiment, after the insulating film MZ removal step of FIG. 41, oxidation treatment is performed to form the oxide film OX on the exposed surface of the control gate electrode CG and the memory gate electrode MG as shown in FIG. 43. By this step, the corner portion CN1 of the control gate electrode CG and the corner portion CN2 of the memory gate electrode MG are rounded. This means that before formation of the oxide film OX, the control gate electrode CG and the memory gate electrode MG have an angular corner portion CN1 and an angular corner portion CN2, respectively, but the oxidation treatment for forming the oxide film OX changes the corner portion CN1 of the control gate electrode CG and the corner portion CN2 of the memory gate electrode MG into a round shape. Even after the removal of the oxide film OX, the corner portion CN1 of the control gate electrode CG and the corner portion CN2 of the memory gate electrode MG still remain round (still have a round shape).

In the semiconductor device thus manufactured, this makes it possible to suppress electric field concentration at the corner portion CN1 of the control gate electrode CG and the corner portion CN2 of the memory gate electrode MG. In the semiconductor device thus manufactured, therefore, leakage current between the control gate electrode CG and the memory gate electrode MG can be suppressed and prevented further. In the semiconductor device thus manufactured, a short-circuit between the control gate electrode CG and the memory gate electrode MG which may occur due to an increase in potential difference between the control gate electrode CG and the memory gate electrode MG can be suppressed or prevented further. Thus, the semiconductor device can have further improved reliability.

After the insulating film MZ removal step of FIG. 41, the oxide film OX formation step and the oxide film OX removal step are performed, followed by the metal silicide layer SL formation step. After the insulating film MZ removal step of FIG. 41 and before the metal silicide layer SL formation step, the respective exposed surfaces of the control gate electrode CG and the memory gate electrode MG are oxidized to form the oxide film OX and then the resulting oxide film OX is removed. This enables widening of the gap SK between the control gate electrode CG and the memory gate electrode MG. This means that the gap SK between the control gate electrode CG and the memory gate electrode MG at the stage of FIG. 44 can be made larger than the gap SK between the control gate electrode CG and the memory gate electrode MG at the stage of FIG. 41. When the metal silicide layer SL is formed, therefore, a distance between the metal silicide layer SL formed on the upper portion of the control gate electrode CG and the metal silicide layer SL formed on the upper portion of the memory gate electrode MG can be enlarged. The semiconductor device thus manufactured can therefore have further improved reliability. For example, leakage current between the control gate electrode CG and the memory gate electrode MG can be suppressed or prevented further. In addition, a short-circuit between the control gate electrode CG and the memory gate electrode MG which may occur due to an increase in potential difference between the control gate electrode CG and the memory gate electrode MG can be suppressed or prevented further.

(Fourth Embodiment)

FIGS. 48 to 54 are fragmentary cross-sectional views of a semiconductor device of Fourth Embodiment during manufacturing steps thereof. They are cross-sectional views of the memory cell region 1A.

Manufacturing steps of Fourth Embodiment are similar to those of First Embodiment until the structure of FIG. 13 is obtained by carrying out Step S13 (step of forming n⁻ type semiconductor regions EX1, EX2, and EX3) so that overlapping description is omitted here.

Figure 48:
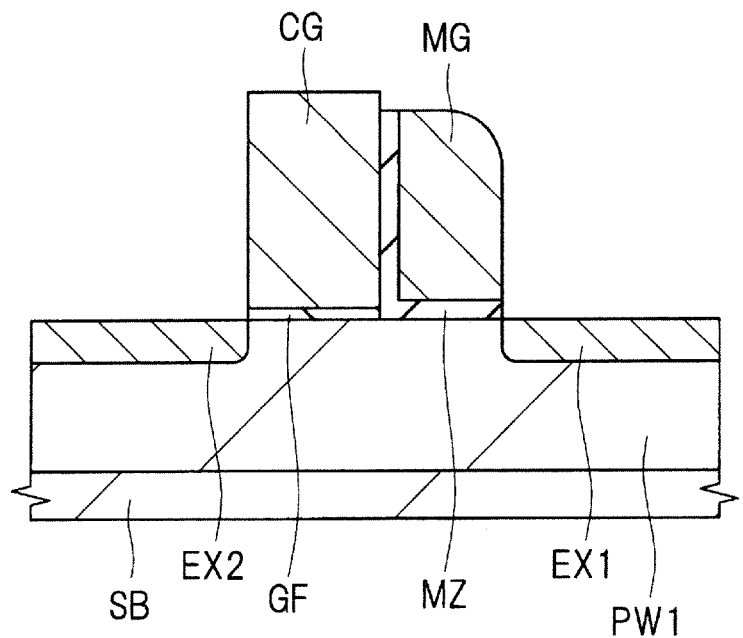
FIG. 48 is a fragmentary cross-sectional view of a semiconductor device of a still further embodiment during a manufacturing step.

In Fourth Embodiment, steps until Step S13 (step of forming n⁻ type semiconductor regions EX1, EX2, and EX3) are performed as in First Embodiment to obtain a structure of FIG. 48 corresponding to that of FIG. 13. The structure shown in FIG. 48 is similar to the structure of the memory cell region 1A in FIG. 13.

Figure 49:
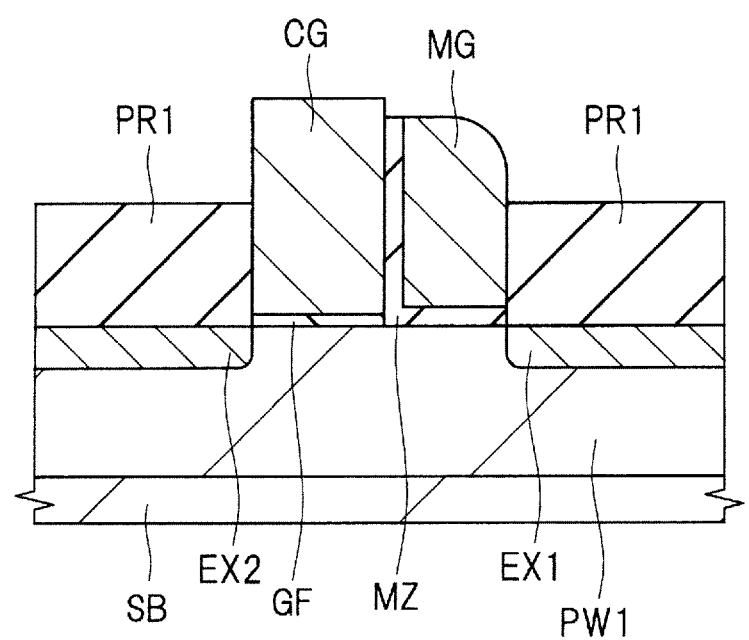
FIG. 49 is a fragmentary cross-sectional view of the semiconductor device during a manufacturing step following that of FIG. 48.

In Fourth Embodiment, as shown in FIG. 49, a resist layer (photoresist layer) PR1 is formed on the main surface of the semiconductor substrate SB. The resist layer PR1 as shown in FIG. 49 can be formed, for example, by forming (applying) a resist layer on the main surface of the semiconductor substrate SB and then etching back the resist layer. During etching back, the resist layer is preferably etched back selectively under etching conditions under which the control gate electrode CG and the memory gate electrode MG are more resistant to etching than the resist layer.

The upper surface of the resist layer PR1 is lower than the upper surface of each of the control gate electrode CG and the memory gate electrode MG so that each of the upper portion of the control gate electrode CG and the memory gate electrode MG is exposed from the resist layer PR1. On the other hand, the semiconductor substrate SB in respective regions having therein n⁻ type semiconductor regions EX1 and EX2 is covered with the resist layer PR1.

Figure 50:
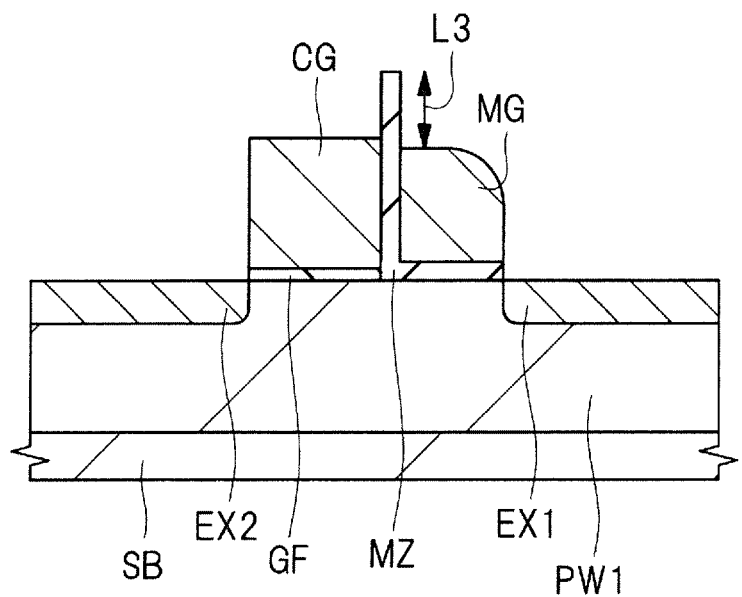
FIG. 50 is a fragmentary cross-sectional view of the semiconductor device during a manufacturing step following that of FIG. 49.

Next, as shown in FIG. 50, the height of the control gate electrode CG and the memory gate electrode MG is made lower by etching back (etching, dry etching, or anisotropic etching) of the control gate electrode CG and the memory gate electrode MG. At this time, the control gate electrode CG and the memory gate electrode MG are etched back under etching conditions under which the insulating film MZ is more resistant to etching than the control gate electrode CG and the memory gate electrode MG. This enables selective etching of the control gate electrode CG and the memory gate electrode MG while suppressing or preventing etching of the insulating film MZ. By etching back the control gate electrode CG and the memory gate electrode MG, a portion (upper portion) of the insulating film MZ protrudes from between the control gate electrode CG and the memory gate electrode MG. When the control gate electrode CG and the memory gate electrode MG are etched back, etching of the semiconductor substrate SB is prevented because the semiconductor substrate SB is covered with the resist layer PR1.

Next, the resist layer PR1 is removed. FIG. 50 shows this stage.

Figure 51:
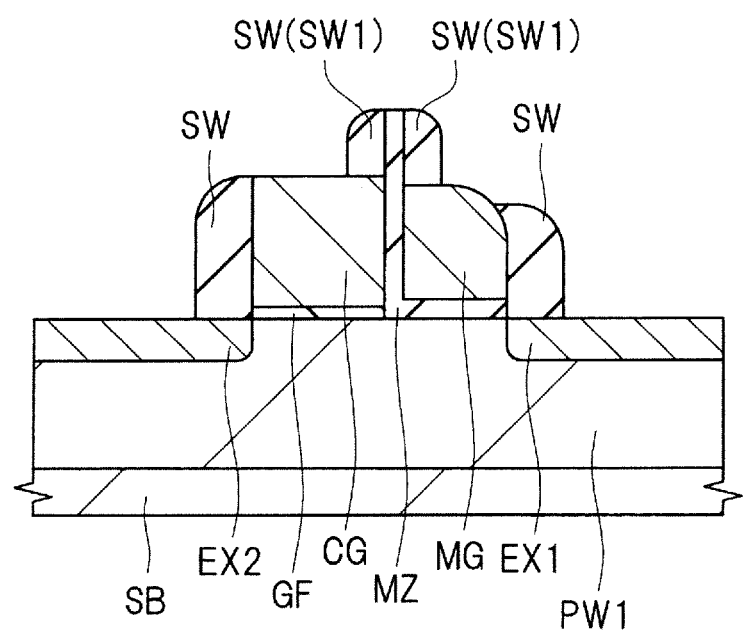
FIG. 51 is a fragmentary cross-sectional view of the semiconductor device during a manufacturing step following that of FIG. 50.

Next, as shown in FIG. 51, a sidewall spacer (sidewall or sidewall insulating film) SW made of an insulating film is formed on the respective side walls of the control gate electrode CG and the memory gate electrode MG (side walls opposite to the side walls which are adjacent to each other via the insulating film MZ). The sidewall spacer SW can be regarded as a sidewall insulating film. The formation method of the sidewall spacer SW in Fourth Embodiment is similar to that of First Embodiment (Step S14). In Fourth Embodiment, however, when the step corresponding to Step S14 is performed to form the sidewall spacer SW, the sidewall spacer SW is formed also on the sidewall of the portion of the insulating film MZ protruding from between the control gate electrode CG and the memory gate electrode MG. In Fourth Embodiment, therefore, the sidewall spacer SW is formed on the respective side walls of the control gate electrode CG and the memory gate electrode MG (side walls opposite to the side walls which are adjacent to each other via the insulating film MZ) and on the side wall of the portion of the insulating film MZ protruding from between the control gate electrode CG and the memory gate electrode MG. Of the sidewall spacers SW, the sidewall spacer SW formed on the side wall of the portion of the insulating film MZ protruding from between the control gate electrode CG and the memory gate electrode MG will hereinafter be followed by a reference sign SW1 and called "sidewall spacer SW1".

Figure 52:
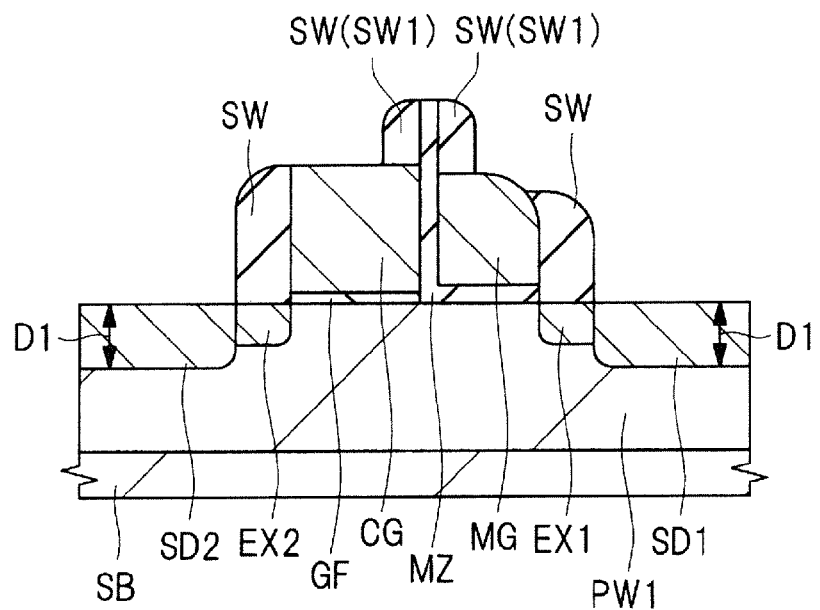
FIG. 52 is a fragmentary cross-sectional view of the semiconductor device during a manufacturing step following that of FIG. 51.

Next, as shown in FIG. 52, n⁺ type semiconductor regions (n type impurity diffusion layers or source/drain regions) SD1 and SD2 are formed by ion implantation. The formation method of the n⁺ type semiconductor regions SD1 and SD2 in Fourth Embodiment are similar to that of First Embodiment (Step S15).

In Fourth Embodiment, as in First Embodiment (Step S16), activation annealing is performed as heat treatment for activating an impurity doped into the source/drain semiconductor regions (n⁻ type semiconductor regions EX1 and EX2 and n⁺ type semiconductor regions SD1 and SD2).

Figure 53:
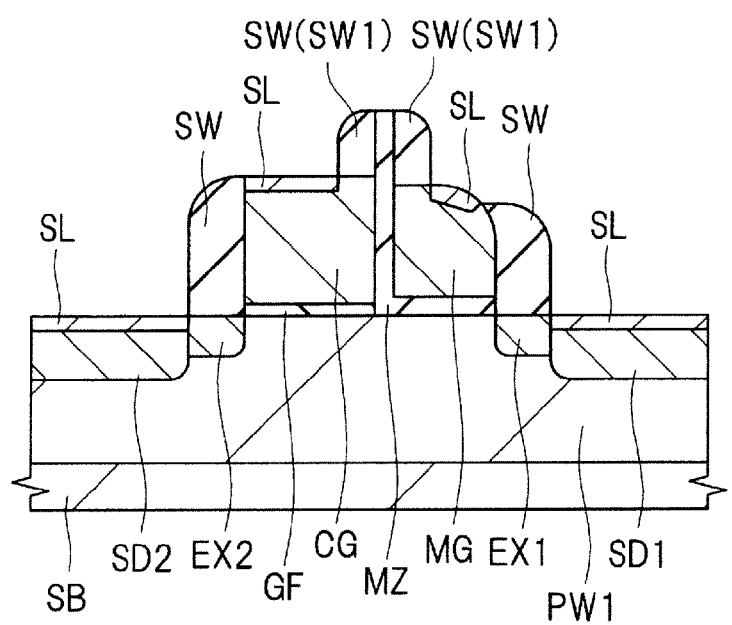
FIG. 53 is a fragmentary cross-sectional view of the semiconductor device during a manufacturing step following that of FIG. 52.

Next, as shown in FIG. 53, a metal silicide layer SL is formed. The metal silicide layer SL formation step in Fourth Embodiment is basically similar to Step S17. As shown in FIG. 53, the metal silicide layer SL is formed on the upper portion (upper surface, surface, or upper layer portion) of each of the n⁺ type semiconductor regions SD1 and SD2, the control gate electrode CG, and the memory gate electrode MG. In Fourth Embodiment, however, the metal silicide layer SL is formed in a region of the upper surface of the control gate electrode CG and the memory gate electrode MG not covered with the sidewall spacer SW1 and the metal silicide layer SL is not formed in a region covered with the sidewall spacer SW1.

Figure 54:
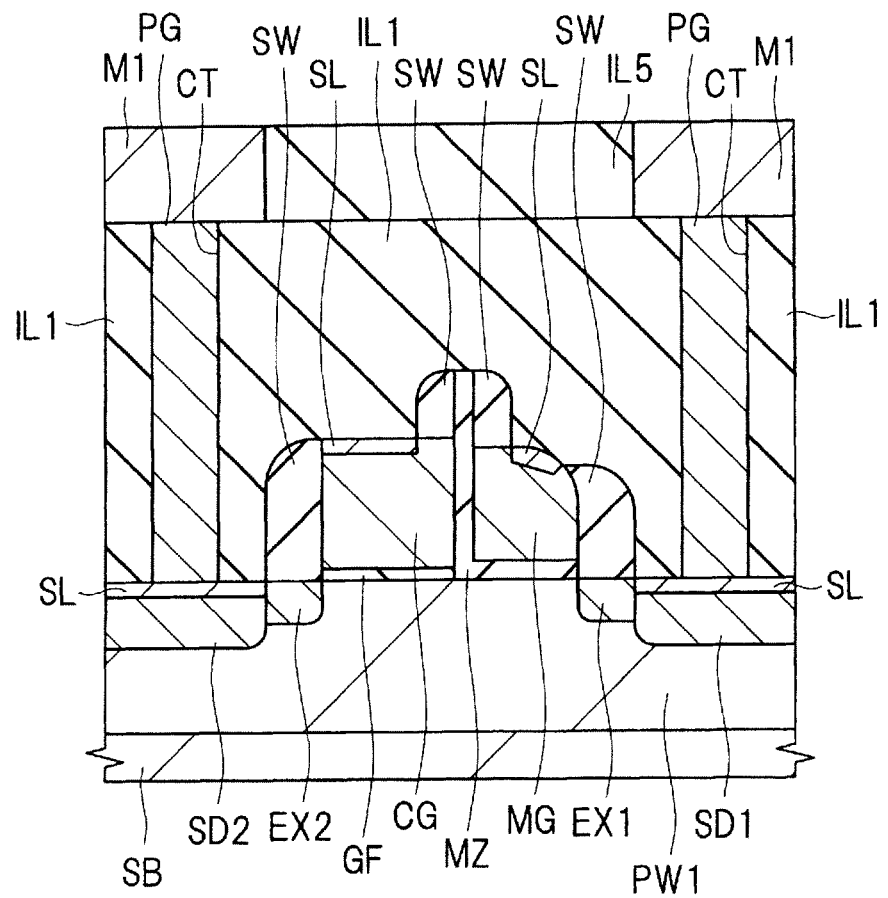
FIG. 54 is a fragmentary cross-sectional view of the semiconductor device during a manufacturing step following that of FIG. 53.

Steps after that are similar to those of Third Embodiment. In Fourth Embodiment as in Third Embodiment, an insulating film (interlayer insulating film) IL1 is formed on the entire main surface of the semiconductor substrate SB so as to cover the control gate electrode CG, the memory gate electrode MG, and the sidewall spacer SW as shown in FIG. 54. After formation of the insulating film IL1, the upper surface of the resulting insulating film IL1 is planarized by CMP or the like if necessary. Then, in Fourth Embodiment as in Third Embodiment, a contact hole CT is formed in the insulating film IL1 and then a conductive plug PG is formed in the contact hole CT. Then, in Fourth Embodiment as in Third Embodiment, a wiring (wiring layer) M1 is formed as a first-layer wiring on the insulating film IL1 having therein the plug PG. Then second and upper wirings are formed but illustration and description of them is omitted here.

In Fourth Embodiment, after formation of n⁻ type semiconductor regions EX1 and EX2 by ion implantation, the control gate electrode CG and the memory gate electrode MG are etched back by the step shown in FIG. 50 to reduce the height of each of the control gate electrode CG and the memory gate electrode MG and protrude a portion of the insulating film MZ from between the control gate electrode CG and the memory gate electrode MG. Then, during formation of the sidewall spacer SW by the step shown in FIG. 51, the sidewall spacer SW is formed not only on the respective side walls of the control gate electrode CG and the memory gate electrode MG (side walls opposite to the side walls which are adjacent to each other via the insulating film MZ) but also on the sidewall of the portion of the insulating film MZ protruding from between the control gate electrode CG and the memory gate electrode MG. This makes it possible, during formation of the n⁺ type semiconductor regions SD1 and SD2 by ion implantation by the step shown in FIG. 52, to suppress or prevent an impurity from being injected into the portion of the insulating film MZ present between the control gate electrode CG and the memory gate electrode MG. This is because during formation of the n⁺ type semiconductor regions SD1 and SD2 by the step shown in FIG. 52, the portion of the insulating film MZ protruding from between the control gate electrode CG and the memory gate electrode MG and the sidewall spacer SW1 formed on both sides (both side walls) of the insulating film MZ can function as a mask for blocking ion implantation.

In Fourth Embodiment, before formation of the n⁺ type semiconductor regions SD1 and SD2 by ion implantation, the control gate electrode CG and the memory gate electrode MG are etched back to protrude a portion of the insulating film MZ from between the control gate electrode CG and the memory gate electrode MG and the sidewall spacer SW1 is formed on both sides (both side walls) of the protrusion of the insulating film MZ. Since the protrusion of the insulating film MZ and the sidewall spacer SW1 on both sides (on both side walls) thereof function as a mask for blocking ion implantation during formation of the n⁺ type semiconductor regions SD1 and SD2 by ion implantation, they can suppress or prevent an impurity from being injected into the portion of the insulating film MZ present between the control gate electrode CG and the memory gate electrode MG.

As described above in First Embodiment, injection of an impurity into the portion of the insulating film MZ present between the control gate electrode CG and the memory gate electrode MG by the ion implantation step performed for the formation of the n⁺ type semiconductor regions SD1 and SD2 may reduce the breakdown voltage of a region of the insulating film MZ into which the impurity has been injected.

On the other hand, in Fourth Embodiment, as described above, injection of an impurity into the portion of the insulating film MZ present between the control gate electrode CG and the memory gate electrode MG can be suppressed or prevented. Reduction in breakdown voltage of the portion of the insulating film MZ present between the control gate electrode CG and the memory gate electrode MG, which may be caused by the ion implantation for the formation of n⁺ type semiconductor regions SD1 and SD2, can therefore be suppressed or prevented. As a result, the semiconductor device thus manufactured can have improved reliability.

Further, in Fourth Embodiment, a length (protruding length) L3 of the portion of the insulating film MZ protruding from between the control gate electrode CG and the memory gate electrode MG is preferably made larger (L3>D1) than the depth D1 of the n⁺ type semiconductor regions SD1 and SD2 formed by the step (corresponding to Step S15) shown in FIG. 52.

The length (protruding length) L3 of the portion of the insulating film MZ protruding from between the control gate electrode CG and the memory gate electrode MG is shown in FIG. 50 and it corresponds to the dimension (dimension in a direction substantially perpendicular to the main surface of the semiconductor substrate SB) of the portion of the insulating film MZ protruding from between the control gate electrode CG and the memory gate electrode MG.

At the stage of FIG. 50, when the height position of the upper surface of the control gate electrode CG is equal to that of the upper surface of the memory gate electrode MG, the length (protruding length) L3 corresponds to a distance (distance in a direction substantially perpendicular to the main surface of the semiconductor substrate SB) from the upper end portion of the portion of the insulating film MZ protruding from between the control gate electrode CG and the memory gate electrode MG to the upper surface of the control gate electrode CG or the upper surface of the memory gate electrode MG. Further at the stage of FIG. 50, when the height position of the upper surface of the control gate electrode CG is different from that of the upper surface of the memory gate electrode MG, the length (protruding length) L3 corresponds to a distance (distance in a direction substantially perpendicular to the main surface of the semiconductor substrate SB) from the upper end portion of the portion of the insulating film MZ protruding from between the control gate electrode CG and the memory gate electrode MG to a lower one of the upper surface of the control gate electrode CG and the upper surface of the memory gate electrode MG.

By making the length (protruding length) L3 of the portion of the insulating film MZ protruding from between the control gate electrode CG and the memory gate electrode MG larger than the depth D1 of the n$^+$ type semiconductor regions SD1 and SD2 (L3>L1), almost no impurity is injected into the portion of the insulating film MZ present between the control gate electrode CG and the memory gate electrode MG during formation of the n$^+$ type semiconductor regions SD1 and SD2 by ion implantation. This means that during formation of the n$^+$ type semiconductor regions SD1 and SD2 by ion implantation, an impurity can be injected into the portion of the insulating film MZ protruding from between the control gate electrode CG and the memory gate electrode MG and the sidewall spacer SW1 on both sides (both side walls) thereof, but almost no impurity is injected into a portion of the insulating film MZ sandwiched between the control gate electrode CG and the memory gate electrode MG. In the semiconductor device thus manufactured, therefore, the portion of the insulating film MZ present between the control gate electrode CG and the memory gate electrode MG does not almost have a region having a reduced breakdown voltage due to injection of an impurity by ion implantation for the formation of the n$^+$ type semiconductor regions SD1 and SD2. As a result, in the semiconductor device thus manufactured, the insulating film MZ present between the control gate electrode CG and the memory gate electrode MG can have appropriately improved breakdown voltage and therefore, the semiconductor device thus manufactured can have appropriately improved reliability. For example, in the semiconductor device thus manufactured, leakage current between the control gate electrode CG and the memory gate electrode MG can be suppressed or prevented. Further, a short-circuit between the control gate electrode CG and the memory gate electrode MG can be suppressed or prevented which may otherwise occur due to dielectric breakdown caused by an increase in a potential difference between the control gate electrode CG and the memory gate electrode MG.

If L3>D1 is satisfied, the region of the insulating film MZ into which an impurity has been injected by ion implantation for the formation of the n$^-$ type semiconductor regions EX1 and EX2 is contained in the portion of the insulating film MZ protruding from between the control gate electrode CG and the memory gate electrode MG. In the semiconductor device thus manufactured, therefore, the portion of the insulating film MZ present between the control gate electrode CG and the memory gate electrode MG is almost free from reduction in breakdown voltage due to ion implantation for the formation of n$^-$ type semiconductor regions EX1 and EX2 or reduction in breakdown voltage due to ion implantation for the formation of n$^+$ type semiconductor regions SD1 and SD2. The semiconductor device thus manufactured can therefore have improved reliability.

In Fourth Embodiment, during formation of the metal silicide layer SL, the metal silicide layer SL is not formed in a region of the upper surface of the control gate electrode CG and the memory gate electrode MG cored with the sidewall spacer SW1. The metal silicide layer SL on the control gate electrode CG is isolated from the metal silicide layer SL on the memory gate electrode MG, by the protrusion of the insulating film MZ and the sidewall spacer SW1 on both sides (both side walls) thereof. This can prevents the metal silicide layer SL on the control gate electrode CG from getting close to the metal silicide layer SL on the memory gate electrode MG and widening a distance (space) between the metal silicide layer SL on the control gate electrode CG and the metal silicide layer SL on the memory gate electrode MG. Therefore, a short-circuit between the metal silicide layer SL on the control gate electrode CG and the metal silicide layer SL on the memory gate electrode MG or formation of a leakage path therebetween can be prevented. Therefore, the semiconductor device can have further improved reliability.

The invention made by the present inventors has been described specifically based on some embodiments. It is needless to say that the invention is not limited to or by these embodiments but can be changed variously without departing from the gist of the invention.

What is claimed is:

1. A method of manufacturing a semiconductor device equipped with a memory cell of a nonvolatile memory, comprising the steps of:
   (a) providing a semiconductor substrate;
   (b) forming a first gate electrode for the memory cell over the semiconductor substrate via a first insulating film;
   (c) forming a second gate electrode for the memory cell over the semiconductor substrate via a second insulating film having therein a charge storage portion so as to be adjacent to the first gate electrode;
   (c1) after the step (c), forming a dummy gate electrode over the semiconductor substrate;
   (d) after the step (c1), forming a first semiconductor region for source or drain of the memory cell in the semiconductor substrate by ion implantation;
   (e) after the step (d), forming sidewall insulating films on respective side walls of the first gate electrode and the second gate electrode which are on the sides opposite to the side walls adjacent to each other;
   (f) after the step (e), forming a second semiconductor region for source or drain of the memory cell in the semiconductor substrate by ion implantation;
   (g) after the step (f), forming a first interlayer insulating film so as to cover the first gate electrode, the second gate electrode, and the dummy gate electrode; and
   (h) polishing the first interlayer insulating film to expose the first gate electrode, the second gate electrode, and the dummy gate electrode,
   wherein the second gate electrode formed in the step (c) is adjacent to the first gate electrode via the second insulating film,
   wherein the second semiconductor region formed in the step (f) has the same conductivity type as that of the first semiconductor region and has an impurity concentration higher than that of the first semiconductor region,
   wherein in the step (h), an upper portion of the second insulating film present between the first gate electrode and the second gate electrode is removed,
   wherein a removal length of the second insulating film in the step (h) is larger than a depth of the second semiconductor region formed in the step (f), and
   wherein the method further comprises the steps of:
   (i) after the step (h), removing the dummy gate electrode; and
   (j) forming a third gate electrode in a trench which is a region from which the dummy gate electrode has been removed by the step (i).

2. The method of manufacturing a semiconductor device according to claim 1, wherein a region of the second insulating film which is present between the first gate electrode and the second gate electrode and into which an impurity has been injected by ion implantation by the step (f) is removed by the step (h).

3. The method of manufacturing a semiconductor device according to claim 1,
wherein the third gate electrode is a metal gate electrode.

4. The method of manufacturing a semiconductor device according to claim 1,
wherein the first gate electrode formed by the step (b) and the dummy gate electrode formed by the step (c1) each comprise a stacked film of a silicon film and a third insulating film over the silicon film, and
wherein in the step (h), the silicon film of the first gate electrode and the silicon film of the dummy gate electrode are exposed.

* * * * *